(12) United States Patent
Lu

(10) Patent No.: US 10,510,705 B2
(45) Date of Patent: Dec. 17, 2019

(54) SEMICONDUCTOR PACKAGE STRUCTURE HAVING A SECOND ENCAPSULANT EXTENDING IN A CAVITY DEFINED BY A FIRST ENCAPSULANT

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/858,714

(22) Filed: Dec. 29, 2017

(65) Prior Publication Data
US 2019/0206824 A1 Jul. 4, 2019

(51) Int. Cl.
*H01L 23/00* (2006.01)
*H01L 23/31* (2006.01)
(Continued)

(52) U.S. Cl.
CPC ........ *H01L 24/24* (2013.01); *H01L 21/31058* (2013.01); *H01L 21/565* (2013.01); *H01L 21/568* (2013.01); *H01L 21/6835* (2013.01); *H01L 23/295* (2013.01); *H01L 23/315* (2013.01); *H01L 23/3135* (2013.01);
(Continued)

(58) Field of Classification Search
CPC . H01L 25/0657; H01L 25/043; H01L 25/074; H01L 25/0756; H01L 25/105; H01L 25/117; H01L 25/50; H01L 23/28–3192; H01L 23/5226; H01L 23/5389; H01L 23/49827; H01L 21/56–568; H01L 21/76898; H01L 2225/1011; H01L 2225/1041; H01L 2225/06548; H01L 2225/06551; H01L 2225/06558; H01L 2225/06568; H01L 2924/18161; H01L 2924/18162; H01L 2224/32145; H01L 2224/24146; H01L 2224/24147; H01L 24/24; H01L 24/25; H01L 24/82; H01L 25/0652; H01L 25/071; H01L 25/112; H01L 2924/18301; H01L 2225/06541
See application file for complete search history.

(56) References Cited

U.S. PATENT DOCUMENTS 8,754,514 B2   6/2014  Yu et al.
9,825,007 B1 * 11/2017  Chen .................. H01L 25/0657
(Continued)

*Primary Examiner* — Younes Boulghassoul
(74) *Attorney, Agent, or Firm* — Foley & Lardner LLP; Cliff Z. Liu

(57) ABSTRACT

A semiconductor package structure includes a first semiconductor die, a second semiconductor die, a plurality of conductive elements, a first encapsulant and a second encapsulant. The second semiconductor die is disposed on the first semiconductor die. The conductive elements each comprises a first portion and a second portion and are disposed around the first semiconductor die and the second semiconductor die. The first encapsulant surrounds the first semiconductor die and the respective first portions of the conductive elements. The second encapsulant covers a portion of a top portion of the first semiconductor die and surrounds the respective second portions of the conductive elements.

15 Claims, 29 Drawing Sheets

(51) Int. Cl.
    H01L 23/48       (2006.01)
    H01L 23/29       (2006.01)
    H01L 25/00       (2006.01)
    H01L 25/065      (2006.01)
    H01L 25/10       (2006.01)
    H01L 21/56       (2006.01)
    H01L 21/3105     (2006.01)
    H01L 21/683      (2006.01)

(52) U.S. Cl.
    CPC .......... H01L 23/481 (2013.01); H01L 24/19 (2013.01); H01L 24/25 (2013.01); H01L 25/0657 (2013.01); H01L 25/50 (2013.01); H01L 24/32 (2013.01); H01L 24/73 (2013.01); H01L 25/0652 (2013.01); H01L 25/105 (2013.01); H01L 2221/68359 (2013.01); H01L 2224/18 (2013.01); H01L 2224/24146 (2013.01); H01L 2224/24147 (2013.01); H01L 2224/2512 (2013.01); H01L 2224/32145 (2013.01); H01L 2224/73267 (2013.01); H01L 2225/06524 (2013.01); H01L 2225/06548 (2013.01); H01L 2225/06568 (2013.01); H01L 2225/06586 (2013.01); H01L 2225/1058 (2013.01)

(56)  References Cited

U.S. PATENT DOCUMENTS

| | | | |
|---|---|---|---|
| 2008/0246126 A1* | 10/2008 | Bowles | H01L 23/3114 257/659 |
| 2010/0052187 A1* | 3/2010 | Lee | H01L 21/561 257/777 |
| 2010/0320585 A1* | 12/2010 | Jiang | H01L 21/561 257/686 |
| 2013/0037950 A1* | 2/2013 | Yu | H01L 23/49816 257/738 |
| 2013/0040423 A1* | 2/2013 | Tung | H01L 23/3114 438/107 |
| 2013/0069239 A1* | 3/2013 | Kim | H01L 23/49827 257/774 |
| 2015/0084165 A1* | 3/2015 | Mahnkopf | H01L 25/0657 257/621 |
| 2016/0049385 A1* | 2/2016 | Yu | H01L 23/481 257/774 |
| 2017/0194292 A1* | 7/2017 | Yu | H01L 25/50 |
| 2017/0317053 A1* | 11/2017 | Hung | H01L 25/0652 |
| 2018/0122780 A1* | 5/2018 | Chen | H01L 25/0657 |
| 2018/0247916 A1* | 8/2018 | Lee | H01L 25/0657 |

* cited by examiner

SEMICONDUCTOR PACKAGE STRUCTURE HAVING A SECOND ENCAPSULANT EXTENDING IN A CAVITY DEFINED BY A FIRST ENCAPSULANT

BACKGROUND

1. Field of the Disclosure

The present disclosure relates to a semiconductor package structure and a manufacturing method, and to a semiconductor package structure including a redistribution layer (RDL), and a method for manufacturing the semiconductor package structure.

2. Description of the Related Art

In a comparative fan-out process, a semiconductor die is disposed in a "face up" manner on a carrier. The semiconductor die includes a plurality of chip pillars on an active surface of the chip facing away from the carrier. In addition, a plurality of package pillars are formed or disposed around the semiconductor die. Then, a molding compound is applied to cover the semiconductor die, the chip pillars, the package pillars, and the carrier. After such a molding operation, the molding compound is thinned to expose upper surfaces of the chip pillars and the package pillars (by, e.g., a grinding process). Then, an RDL is formed on the molding compound to contact the chip pillars and the package pillars. However, since the chip pillars may not have a consistent height, and the package pillars may not have a consistent height, it is challenging to thin the molding compound to ensure that the upper surfaces of the chip pillars and the package pillars are exposed.

SUMMARY

In some embodiments, according to an aspect, a semiconductor package structure includes a first semiconductor die, a second semiconductor die, a plurality of conductive elements, a first encapsulant and a second encapsulant. The second semiconductor die is disposed on the first semiconductor die. The conductive elements each includes a first portion and a second portion, and are disposed around the first semiconductor die and the second semiconductor die. The first encapsulant surrounds the first semiconductor die and the respective first portions of the conductive elements. The second encapsulant covers a portion of a top portion of the first semiconductor die and surrounds the respective second portions of the conductive elements.

In some embodiments, according to another aspect, a method for manufacturing a semiconductor package structure includes: (a) providing a carrier; (b) forming a plurality of conductive elements on the carrier each comprising a first portion and a second portion; (c) disposing a first semiconductor die and a first encapsulant on the carrier, wherein the conductive elements surround the first semiconductor die, and the first encapsulant surrounds the first semiconductor die and the respective first portions of the conductive elements; and (d) disposing a second semiconductor die and a second encapsulant on the first semiconductor die, wherein the second encapsulant covers a top portion of the first semiconductor die and surrounds the respective second portions of the conductive elements.

BRIEF DESCRIPTION OF THE DRAWINGS

Characteristics of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
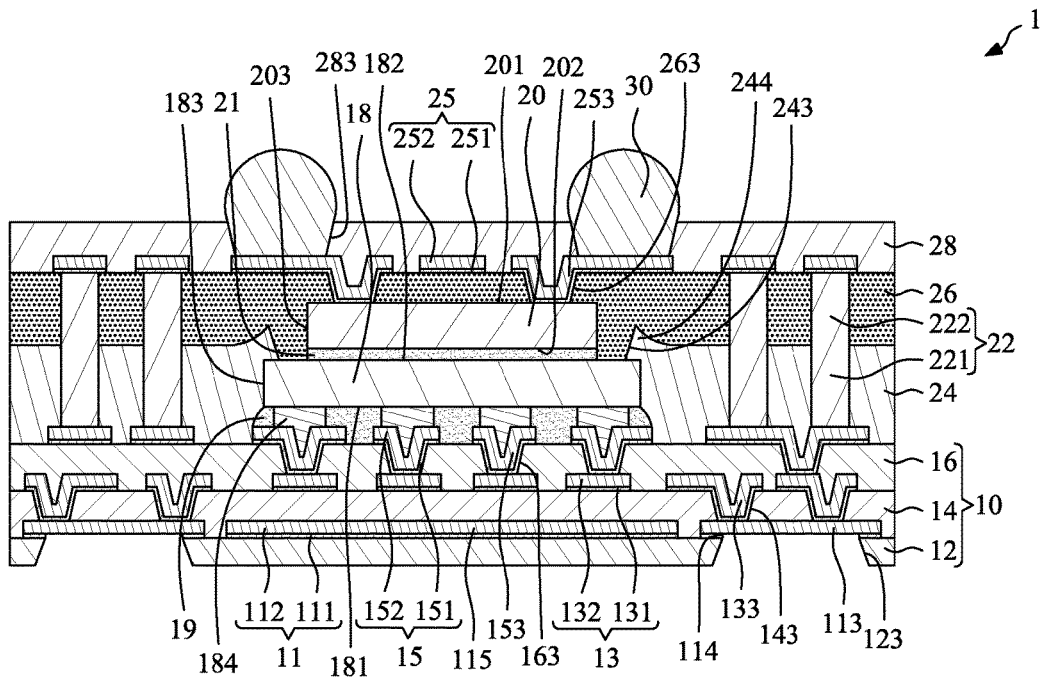
FIG. 1 illustrates a cross sectional view of some embodiments of a semiconductor package structure according to an aspect of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

At least some embodiments of the present disclosure disclose a semiconductor package structure includes a first semiconductor die, a second semiconductor die, a plurality of conductive elements each including a first portion and a second portion, and disposed around the first semiconductor die and the second semiconductor die, a first encapsulant surrounding the first semiconductor die and the respective first portions of the conductive elements, and a second encapsulant covering a top portion of the first semiconductor die and surrounding the respective second portions of the conductive elements. At least some embodiments of the present disclosure further disclose techniques for manufacturing the semiconductor package structure.

In a comparative fan-out process, a semiconductor die is disposed in a "face up" manner on a carrier. That is, the semiconductor die has an active surface and a back side surface opposite to the active surface, and the back side surface of the semiconductor die is attached (e.g., adhered) to the carrier. The semiconductor die includes a plurality of chip pillars on the active surface. In addition, a plurality of package pillars are formed on the carrier, and the package pillars are disposed around the semiconductor die. Then, a molding compound is applied to cover the semiconductor die, the chip pillars, the package pillars and the carrier. In other words, an upper surface of the molding compound is higher than upper surfaces of the chip pillars and upper surfaces of the package pillars, since the molding compound covers the chip pillars and the package pillars.

After the molding operation, a grinding operation is conducted to remove an upper part of the molding compound that is disposed on the upper surfaces of the chip pillars and the upper surfaces of the package pillars, to thin the molding compound and expose the upper surfaces of the chip pillars and the upper surfaces of the package pillars. After grinding, the upper surface of the molding compound may be substantially coplanar with the upper surfaces of the chip pillars and the upper surfaces of the package pillars if the chip pillars have a consistent height and the package pillars have a consistent height. However, the chip pillars may not have a consistent height, such as when the aforementioned process is used for packaging a plurality of semiconductor dice having different sizes at the same time. Further, the package pillars may not have a consistent height due to a tolerance of the formation of the package pillars. As a result, the upper surfaces of the chip pillars of the semiconductor die and the upper surfaces of the package pillars may not be coplanar with each other. Thus, after the grinding operation, a portion of the chip pillars and/or the package pillars may still be embedded in the molding compound, and the upper surfaces of these chip pillars and/or these package pillars may not be exposed from the molding compound. An RDL is formed on the molding compound and may not contact and electrically connect the unexposed chip pillars and/or package pillars, which can result in an open circuit.

Further, the cost of the grinding operation can be high. In addition, during the grinding process, a portion of the molding compound and portions of these chip pillars and these package pillars are removed, such that upper surfaces of these chip pillars and these package pillars are exposed from the molding compound for connection with the RDL. However, removing the portion of the molding compound can result in powder adhered on the upper surfaces of these chip pillars and these package pillars, and as a surface roughness of the ground surface of the molding compound is large, delamination may easily occur between the RDL and any of the molding compound, the chip pillars and the package pillars. Furthermore, poor uniformity (e.g., variance between portions of the ground surface of greater than about 10%) of the ground surface of the molding compound may limit a line width and a line space (L/S) of the RDL. For example, the L/S of the RDL may be greater than about 5 micrometers (μm)/about 5 μm, or about 2 μm/about 2 μm. In addition, the removed portion of the molding compound is waste, which may also increase the cost of the manufacturing process.

Further, the height of the package pillar can be low (e.g., less than about 150 μm), which may not be suitable for a thick package structure with a thick semiconductor die having a thickness of, for example, more than about 150 μm. Furthermore, a large warpage may occur due to a mismatch of coefficients of thermal expansion (CTEs) between a metal RDL and the molding compound (e.g. the CTE of the metal RDL is about 17 parts-per-million per degree Celsius (ppm/° C.), and the CTE of the molding compound is in a range of about 4 to about 12 ppm/° C.).

In a subsequent process, a passivation layer may be further formed or disposed on the ground surface of the molding compound and on the RDL. The CTE of the passivation layer is about 80 ppm/° C., for example. Thus, CTE mismatch between the passivation layer and the molding compound can result in a high risk of delamination between the passivation layer and the molding compound. In addition, in the aforementioned process, it can be difficult to stack an additional semiconductor die on the semiconductor dice to achieve a higher I/O (input/output) count.

The present disclosure addresses at least the above concerns and provides for an improved semiconductor package structure, and improved techniques for manufacturing the semiconductor package structure. In the manufacturing process of the semiconductor package structure, the grinding operation can be omitted, while each one of a plurality of upper surfaces of conductive elements can be exposed.

FIG. 1 illustrates a cross sectional view of some embodiments of a semiconductor package structure 1 according to an aspect of the present disclosure. The semiconductor package structure 1 includes a base material 10 (including, for example, a first passivation layer 12, a first RDL 11, a second passivation layer 14, a second RDL 13, a third passivation layer 16 and a third RDL 15 (also referred to as "a second wiring layer" or "a bottom wiring layer")), a first semiconductor die 18, a second semiconductor die 20, a plurality of conductive elements 22, a first encapsulant 24, a second encapsulant 26, a first wiring layer 25, a third encapsulant 28 and a plurality of external connectors 30 (e.g., solder bumps).

In one or more embodiments, the base material 10 may include the first passivation layer 12, the first RDL 11, the second passivation layer 14, the second RDL 13, the third passivation layer 16 and the third RDL 15 (e.g., the second wiring layer or the bottom wiring layer). The first passivation layer 12 may include, or be formed from, a photoresist layer, a cured photosensitive material, a cured photoimageable dielectric (PID) material such as a polyamide (PA), a polyimide (PI), epoxy or polybenzoxazole (PBO), or a combination of two or more thereof. In one or more embodiments, the first passivation layer 12 may include, or be formed from a dry film type material that includes a resin and a plurality of fillers; and a CTE of the first passivation layer 12 may be in a range of about 60 ppm/° C. to about 70 ppm/° C. In one or more embodiments in which the dry film type material is a photosensitive material, such dry film type material may further include any of a sensitizer, a photoinitiator and a cross-linker. In one or more embodiments in which the dry film type material is a non-photosensitive material, such dry film type material omit the sensitizer, the photoinitiator and the cross-linker. In another embodiment, the first passivation layer 12 may include, or be formed from a liquid type material that includes a homogeneous resin without fillers; and a CTE of the first passivation layer 12 may be in a range of about 54 ppm/° C. to about 65 ppm/° C. In one or more embodiments in which the liquid type material is a photosensitive material, such liquid type material may further include diazonaphthoquinone (DNQ). In one or more embodiments in which the liquid type material is a non-photosensitive material, such liquid type material may omit diazonaphthoquinone (DNQ). In some embodiments, the first passivation layer 12 may be a dry film material. In some embodiments, the material of the first passivation layer 12 may include inorganic material (e.g., $SiO_x$, $SiN_x$, $TaO_x$), a glass, silicon, or a ceramic. As shown in FIG. 1, the first passivation layer 12 may define at least one through hole 123 extending through the first passivation layer 12.

The first RDL 11 is disposed on the first passivation layer 12 and is embedded in the second passivation layer 14. For example, the first RDL 11 may include a seed layer 111 and a conductive metal layer 112 disposed in that order on the first passivation layer 12. The seed layer 111 may include, for example, titanium and/or copper, another metal, or an alloy, and may be formed or disposed by sputtering. The conductive metal layer 112 may include, for example, copper, or another metal or combination of metals, and may be formed or disposed by electroplating. In some embodiments, as shown in FIG. 1, the first RDL 11 may include at least one soldering pad 113 and a support portion 115. A portion of the seed layer 111 corresponding to the through hole 123 of the first passivation layer 12 is removed so as to form a through hole 114 and expose a portion of a lower surface of the soldering pad 113 for external connection. That is, the size and position of the through hole 114 of the seed layer 111 correspond to the size and position of the through hole 123 of the first passivation layer 12. In addition, the exposed portion of the soldering pad 113 includes a portion of the conductive metal layer 112, and is exposed from the through hole 114 of the seed layer 111 and the through hole 123 of the first passivation layer 12. The support portion 115 may have a large area so as to increase the rigidity of the semiconductor package structure 1 (e.g. an area larger than a footprint of the die 18 by a factor of about 1.1 or more, about 1.2 or more, or about 1.3 or more). In some embodiments, the support portion 115 may not be electrically connected to a die (e.g. may have no electrical function) or may be used for grounding.

The second passivation layer 14 is disposed on the first passivation layer 12, and covers the first RDL 11. The second passivation layer 14 may include, or be formed from, a photoresist layer, a cured photosensitive material, a cured PID material such as an epoxy or a PI, or a combination of two or more thereof. In some embodiment, the second passivation layer 14 may include, or be formed from a photosensitive dry film type material, a non-photosensitive dry film type material, a photosensitive liquid type material, or a non-photosensitive liquid type material. The material of the second passivation layer 14 may be the same as or different from the material of the first passivation layer 12. The second passivation layer 14 may define at least one through hole 143 extending through the second passivation layer 14 so as to expose a portion of an upper surface of the first RDL 11.

The second RDL 13 is disposed on the second passivation layer 14 and in the through hole 143. For example, the second RDL 13 may include a seed layer 131 and a conductive metal layer 132 disposed in that order on the second passivation layer 14. The seed layer 131 may include, for example, titanium and/or copper, another metal, or an alloy, and may be formed or disposed by sputtering. The conductive metal layer 132 may include, for example, copper, or another metal or combination of metals, and may be formed or disposed by electroplating. In some embodiments, as shown in FIG. 1, the second RDL 13 may include at least one conductive via 133 disposed in the through hole 143 of the second passivation layer 14. The conductive via 133 contacts a portion of the upper surface of the first RDL 11 so that the second RDL 13 is electrically connected to the first RDL 11. The second RDL 13 and the conductive via 133 may be formed concurrently or integrally (e.g. as a monolithic structure). As shown in FIG. 1, a line width/line space (L/S) of the second RDL 13 may be less than about 7 µm/about 7 µm, less than about 5 µm/about 5 µm, or less than about 2 µm/about 2 µm.

The third passivation layer 16 is disposed on the second passivation layer 14, and covers the second RDL 13. The third passivation layer 16 may include, or be formed from, a photoresist layer, a cured photosensitive material, a cured PID material such as an epoxy or a PI, or a combination of two or more thereof. In some embodiment, the third passivation layer 16 may include, or be formed from a photosensitive dry film type material, a non-photosensitive dry film type material, a photosensitive liquid type material, or a non-photosensitive liquid type material. The material of the third passivation layer 16 may be the same as or different from the material of the second passivation layer 14. The third passivation layer 16 may define at least one through hole 163 extending through the third passivation layer 16 so as to expose a portion of an upper surface of the second RDL 13.

The third RDL 15 is disposed on the third passivation layer 16 and in the through hole 163. For example, the third RDL 15 may include a seed layer 151 and a conductive metal layer 152 disposed in that order on the third passivation layer 16. The seed layer 151 may include, for example, titanium and/or copper, another metal, or an alloy, and may be formed or disposed by sputtering. The conductive metal layer 152 may include, for example, copper, or another metal or combination of metals, and may be formed or disposed by electroplating. In some embodiments, as shown in FIG. 1, the third RDL 15 may include at least one conductive via 153 disposed in the through hole 163 of the third passivation layer 16. The conductive via 153 contacts a portion of the upper surface of the second RDL 13 so that the third RDL 15 is electrically connected to the second RDL 13. The third RDL 15 and the conductive via 153 may be formed concurrently or integrally (e.g. as a monolithic structure). As shown in FIG. 1, a line width/line space (L/S) of the third RDL 15 may be less than about 7 μm/about 7 less than about 5 μm/about 5 or less than about 2 μm/about 2 μm. In the embodiment illustrated in FIG. 1, the third RDL 15 may be a second wiring layer or a bottom wiring layer that is disposed under the first semiconductor die 18. In addition, at least a portion of the third RDL 15 (e.g., the second wiring layer or the bottom wiring layer) is embedded in the first encapsulant 24.

The first semiconductor die 18 is electrically connected to the third RDL 15 of the base material 10. The first semiconductor die 18 has a first surface 181 (e.g., an active surface), a second surface 182 (e.g., a back side surface) and a lateral surface 183. The second surface 182 is opposite to the first surface 181, and the lateral surface 183 extends between the first surface 181 and the second surface 182. The first semiconductor die 18 may include a plurality of conductive bumps 184 disposed adjacent to the first surface 181. The conductive bumps 184 contact portions of the third RDL 15 so that the first semiconductor die 18 is electrically connected to the third RDL 15 through the conductive bumps 184. That is, the first semiconductor die 18 is attached to the third RDL 15 by flip chip bonding. An underfill 19 is further included in a space between the first surface 181 of the first semiconductor die 18 and the third RDL 15 to cover and protect the conductive bumps 184.

The second semiconductor die 20 is disposed on the first semiconductor die 18. The second semiconductor die 20 has a first surface 201 (e.g., an active surface), a second surface (e.g., a back side surface) 202 and a lateral surface 203. The second surface 202 is opposite to the first surface 201, and the lateral surface 203 extends between the first surface 201 and the second surface 202. The second surface 202 of the second semiconductor die 20 is adhered to the second surface 182 of the first semiconductor die 18 through an adhesion layer 21. In some embodiments, the function and the size of the second semiconductor die 20 may be the same as or different from the function and the size of the first semiconductor die 18.

The conductive elements 22 (e.g., conductive pillars) are disposed on the third RDL 15 of the base material 10 and around the first semiconductor die 18 and the second semiconductor die 20 so that the conductive elements 22 are electrically connected to the third RDL 15, the second RDL 13, the first RDL 11, and/or the first semiconductor die 18. The conductive element 22 may be a cylindrical solid pillar, and the material thereof may include, for example, a metal (e.g., copper or another conductive metal, or an alloy thereof). As shown in FIG. 1, each of the conductive elements 22 includes a first portion 221 and a second portion 222. The first portion 221 is disposed in the first encapsulant 24, and the second portion 222 is disposed in the second encapsulant 26.

The first encapsulant 24 covers the third RDL 15, the third passivation layer 16 and the underfill 19, and surrounds the first semiconductor die 18 and the first portion 221 of the conductive element 22. The first encapsulant 24 may be formed from a first material. In some embodiments, the first material may be a non-photosensitive dry film type material and includes a first resin and a plurality of fillers dispersed in the first resin. As shown in FIG. 1, the first encapsulant 24 may cover a periphery of the top portion (e.g., the second surface 182) of the first semiconductor die 18, and may define a cavity 243 to expose at least a portion of the top portion (e.g., the second surface 182) of the first semiconductor die 18. That is, the first encapsulant 24 may cover and contact the lateral surface 183 of the first semiconductor die 18 and a portion of the second surface 182 of the first semiconductor die 18. Alternatively, the first encapsulant 24 may cover and contact a portion of the lateral surface 183 of the first semiconductor die 18, and may not cover the second surface 182 of the first semiconductor die 18. Thus, the cavity 243 may expose the second surface 182 of the first semiconductor die 18. As shown in FIG. 1, the first encapsulant 24 further includes an inner protrusion 244 that protrudes from an upper surface of the first encapsulant 24 and is higher than the average level of the upper surface of the first encapsulant 24 (e.g. is higher by a factor of about 1.1 or more, of about 1.2 or more, or of about 1.3 or more), and is disposed adjacent to the cavity 243. That is, a portion of the cavity 243 is defined by the inner protrusion 244. As shown in FIG. 1, the second semiconductor die 20 is disposed in the cavity 243. That is, the second semiconductor die 20 is disposed on the portion of the second surface 182 of the first semiconductor die 18 that is exposed from the cavity 243. In addition, the first encapsulant 24 may cover and contact the first portion 221 of the conductive element 22.

The second encapsulant 26 covers a portion of a top portion (e.g., the second surface 182) of the first semiconductor die 18, and surrounds the second portion 222 of the conductive element 22. The second encapsulant 26 may be formed from a second material that is different from the first material of the first encapsulant 24. In some embodiments, the second material may be a photosensitive liquid type material that includes a homogeneous second resin without fillers, and may be formed by coating. As shown in FIG. 1, the second encapsulant 26 may cover and contact the first encapsulant 24 and extend into the cavity 243 so that the second encapsulant 26 may surround the second semiconductor die 20. In some embodiments, the second encapsulant 26 may cover and contact the first surface 201 and the lateral surface 203 of the second semiconductor die 20, and may define at least one through hole 263 extending through the second encapsulant 26 so as to expose a portion of the first surface 201 of the second semiconductor die 20. In addition, the second encapsulant 26 may cover and contact the second portion 222 of the conductive element 22, and the upper surface of the second encapsulant 26 may be substantially coplanar with the upper surfaces of the conductive elements 22. That is, the upper surfaces of the conductive elements 22 may be exposed from the upper surface of the second encapsulant 26, and a height of the conductive element 22 is substantially equal to a sum of a thickness of the first encapsulant 24 and a thickness of the second encapsulant 26, or is substantially equal to a sum of a thickness of the first encapsulant 24 and a thickness of the second encapsulant 26 minus a thickness of a portion of the conductive metal layer 152 on which the conductive element 22 is disposed. It is noted that a value of a surface roughness of the upper surface of the second encapsulant 26 is less than a value of a surface roughness of the upper surface of the first encapsulant 24 (e.g. is about 0.9 times a value of the surface roughness of the upper surface of the first encapsulant 24 or less, is about 0.8 times a value of the surface roughness of the upper surface of the first encapsulant 24 or less, or is about 0.7 times a value of the surface roughness of the upper surface of the first encapsulant 24 or less).

The first wiring layer 25 electrically connects the second semiconductor die 20 and the conductive elements 22. In some embodiments, the first wiring layer 25 is an RDL, and is disposed above the second semiconductor die 20. The first wiring layer 25 is disposed on the second encapsulant 26 and in the through hole 263. For example, the first wiring layer 25 may include a seed layer 251 and a conductive metal layer 252 disposed in that order on the second encapsulant 26. The seed layer 251 may include, for example, titanium and/or copper, another metal, or an alloy, and may be formed or disposed by sputtering. The conductive metal layer 252 may include, for example, copper, or another metal or combination of metals, and may be formed or disposed by electroplating. In some embodiments, as shown in FIG. 1, the first wiring layer 25 may include at least one conductive via 253 disposed in the through hole 263 of the second encapsulant 26. The conductive via 253 contacts a portion of the first surface 201 of the second semiconductor die 20 so that the first wiring layer 25 is electrically connected to and contacts the second semiconductor die 20. The first wiring layer 25 and the conductive via 253 may be formed concurrently or integrally (e.g. as a monolithic structure). As shown in FIG. 1, a line width/line space (L/S) of the first wiring layer 25 may be less than about 7 μm/about 7 μm, less than about 5 μm/about 5 μm, or less than about 2 μm/about 2 μm. In addition, a portion of the first wiring layer 25 may cover and contact the upper surfaces of the conductive elements 22 so that the first wiring layer 25 is electrically connected to the conductive elements 22.

The third encapsulant 28 may be a protection layer that is disposed on the second encapsulant 26, and covers the first wiring layer 25. The third encapsulant 28 may include, or be formed from, a photoresist layer, a cured photosensitive material, a cured PID material such as an epoxy or a PI, or a combination of two or more thereof. In some embodiment, the third encapsulant 28 may include, or be formed from a photosensitive dry film type material, a non-photosensitive dry film type material, a photosensitive liquid type material, or a non-photosensitive liquid type material. The material of the third encapsulant 28 may be the same as the material of the first encapsulant 24. In some embodiments, the third encapsulant 28 may be a dry film type material. In some embodiments, the material of the third encapsulant 28 may include inorganic material (e.g., $SiO_x$, $SiN_x$, $TaO_x$), a glass, silicon, or a ceramic. The third encapsulant 28 may define at least one opening 283 extending through the third encapsulant 28 so as to expose a portion of an upper surface of the first wiring layer 25.

The external connectors 30 are respectively formed or disposed in a respective one of the opening 283 and on the exposed portion of the first wiring layer 25 for external connection.

As shown in FIG. 1, the height of the conductive element 22 may be greater than a sum of a thickness of the first semiconductor die 18 and a thickness of the second semiconductor die 20 (e.g. by a factor of about 1.1 or more, 1.2 or more, or 1.3 or more). For example, the height of the conductive element 22 may be greater than about 150 μm. In addition, in comparison with a comparative embodiment in which the encapsulant is a hard molding compound, the materials of the first encapsulant 24 and the second encapsulant 26 of the semiconductor package structure 1 are relative tough and can avoid cracking and delamination. Further, the inner protrusion 244 can increase an adhesion force between the first encapsulant 24 and the second encapsulant 26 so as to avoid delamination. Furthermore, the stacked semiconductor dice (including the first semiconductor die 18 and the second semiconductor die 20) and the tall conductive elements 22 can achieve a higher I/O count. In addition, the support portion 115 can help to adjust and balance stress (e.g., thermal stress) of the semiconductor package structure 1, and can also provide good heat-dissipating capability. In addition, the first wiring layer 25 may have a fine line pitch (for example, the L/S of the first wiring layer 25 may be less than about 5 μm/about 5 μm, or about 2 μm/about 2 μm) due to the good uniformity (e.g., variance between portions of the second encapsulate 26 of less than about 5%) of the upper surface of second encapsulant 26. In addition, the CTEs of the first passivation layer 12, the second passivation layer 14, the third passivation layer 16, the first encapsulant 24, the second encapsulant 26 and the third encapsulant 28 are very close to each other, thus, CTE mismatch therebetween may be very small, thus, the warpage of the semiconductor package structure 1 may be small.

Figure 2:
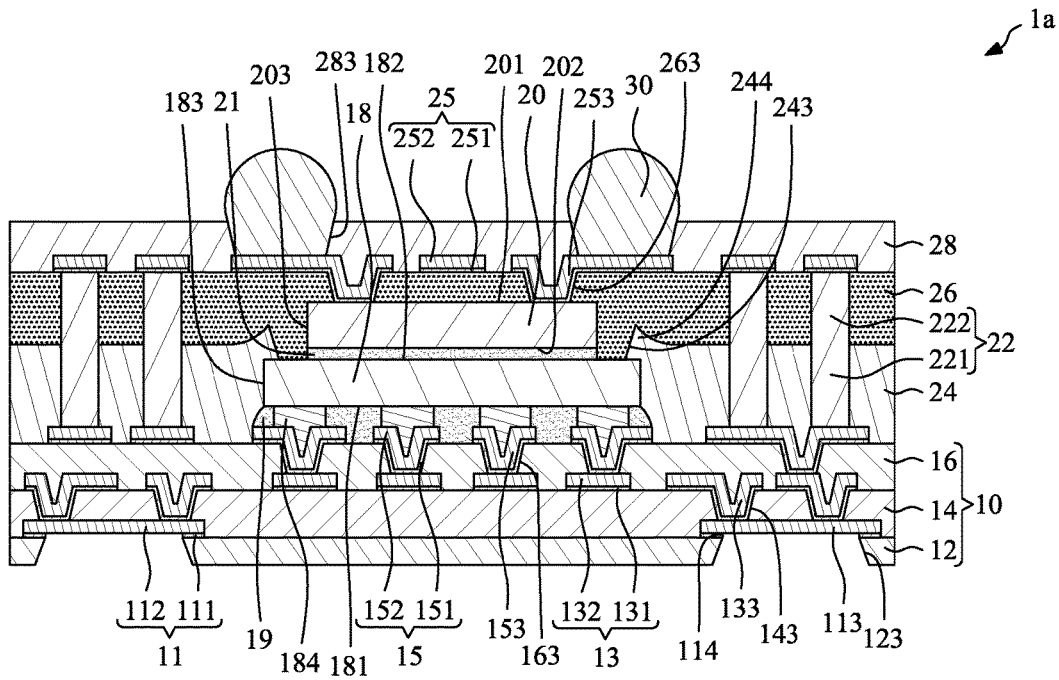
FIG. 2 illustrates a cross-sectional view of some embodiments of a semiconductor package structure according to an aspect of the present disclosure.

FIG. 2 illustrates a cross-sectional view of some embodiments of a semiconductor package structure 1a according to an aspect of the present disclosure. The semiconductor package structure 1a of FIG. 2 is similar to the semiconductor package structure 1 as shown in FIG. 1, except that the support portion 115 of the first RDL 11 is omitted.

Figure 3:
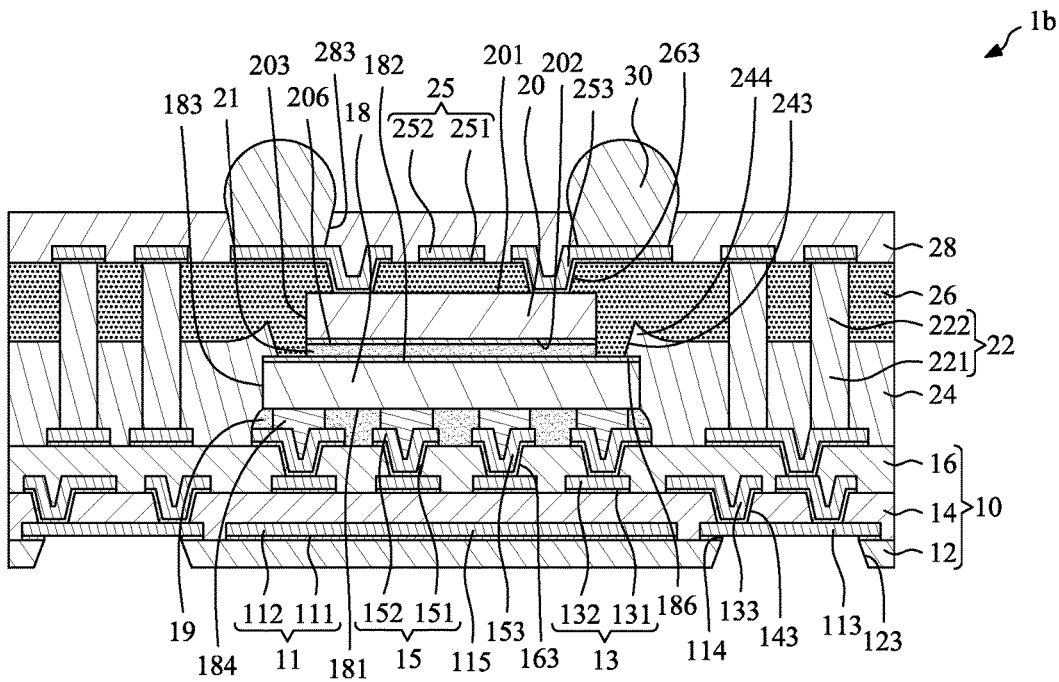
FIG. 3 illustrates a cross-sectional view of some embodiments of a semiconductor package structure according to an aspect of the present disclosure.

FIG. 3 illustrates a cross-sectional view of some embodiments of a semiconductor package structure 1b according to an aspect of the present disclosure. The semiconductor package structure 1b of FIG. 3 is similar to the semiconductor package structure 1 as shown in FIG. 1, except that a first backside layer 186 is disposed on the second surface 182 of the first semiconductor die 18, and a second backside layer 206 is disposed on the second surface 202 of the second semiconductor die 20. The materials of the first backside layer 186 and the second backside layer 206 may be metal (e.g., a titanium alloy such as titanium-tungsten (TiW) or titanium-copper (TiCu), copper, stainless steel, iron, silver (Ag), gold (Au), or alloys thereof) and/or non-metal (e.g., a PA, a PI, an epoxy, PBO, $SiO_x$, $SiN_x$, $TaO_x$). The first backside layer 186 can enhance the stress balancing of the first semiconductor die 18, and the second backside layer 206 can enhance the stress balancing of the second semiconductor die 20.

Figure 4:
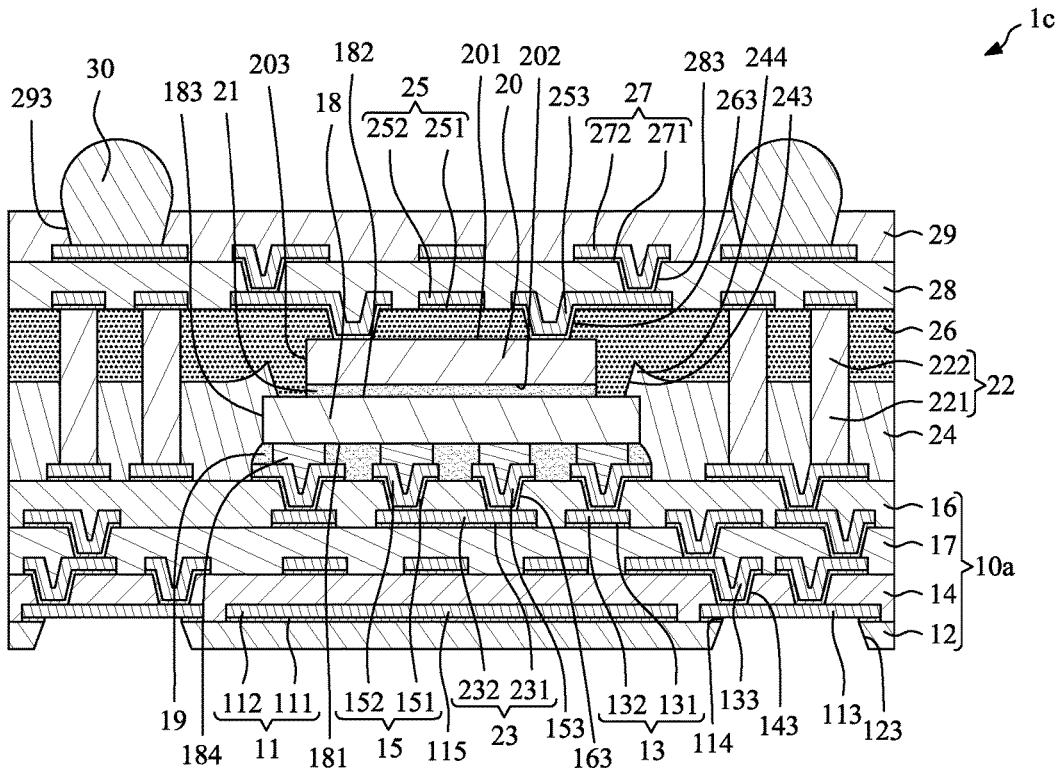
FIG. 4 illustrates a cross-sectional view of some embodiments of a semiconductor package structure according to an aspect of the present disclosure.

FIG. 4 illustrates a cross-sectional view of some embodiments of a semiconductor package structure 1c according to an aspect of the present disclosure. The semiconductor package structure 1c of FIG. 4 is similar to the semiconductor package structure 1 as shown in FIG. 1, except that the base material 10a may further include a fourth passivation layer 17 and a fourth RDL 23 disposed between the second passivation layer 14 and the third passivation layer 16. The fourth RDL 23 may include a seed layer 231 and a conductive metal layer 232 disposed in that order on the fourth passivation layer 17. In addition, the semiconductor package structure 1c further includes an upper wiring layer 27 and an upper encapsulant 29. The upper wiring layer 27 is electrically connected to the first wiring layer 25. In some embodiments, the upper wiring layer 27 is an RDL, and is disposed on the third encapsulant 28 and in its opening 283. For example, the upper wiring layer 27 may include a seed layer 271 and a conductive metal layer 272 disposed in that order on the third encapsulant 28. The upper encapsulant 29 may be a protection layer that is disposed on the third encapsulant 28, and covers the upper wiring layer 27. The upper encapsulant 29 may define at least one through hole 293 extending through the upper encapsulant 29 so as to expose a portion of an upper surface of the upper wiring layer 27. The external connectors 30 are respectively formed or disposed in a respective one of the through hole 293 and on the exposed portion of the upper wiring layer 27 for external connection.

Figure 5:
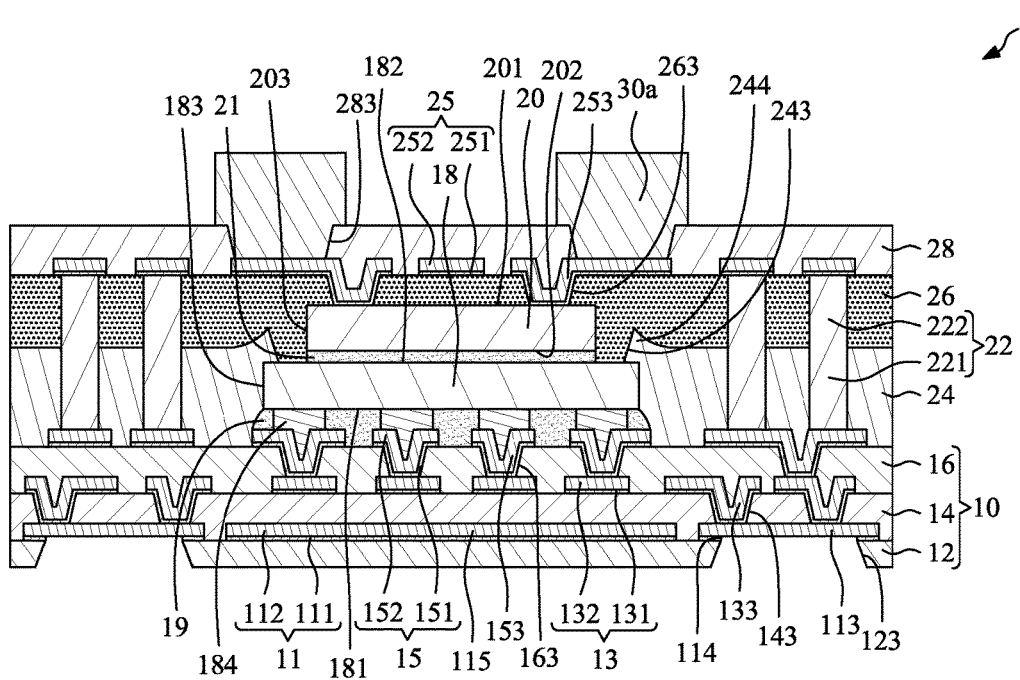
FIG. 5 illustrates a cross-sectional view of some embodiments of a semiconductor package structure according to an aspect of the present disclosure.

FIG. 5 illustrates a cross-sectional view of some embodiments of a semiconductor package structure 1d according to an aspect of the present disclosure. The semiconductor package structure 1d of FIG. 5 is similar to the semiconductor package structure 1 as shown in FIG. 1, except for the structure of the external connector 30a. In FIG. 1, the external connector 30 may be a solder bump adapted for a ball grid array (BGA) type package structure. In FIG. 5, the external connector 30a may be a bump shape that is formed by plating. The peripheral surface of the external connector 30a may be substantially flat.

Figure 6:
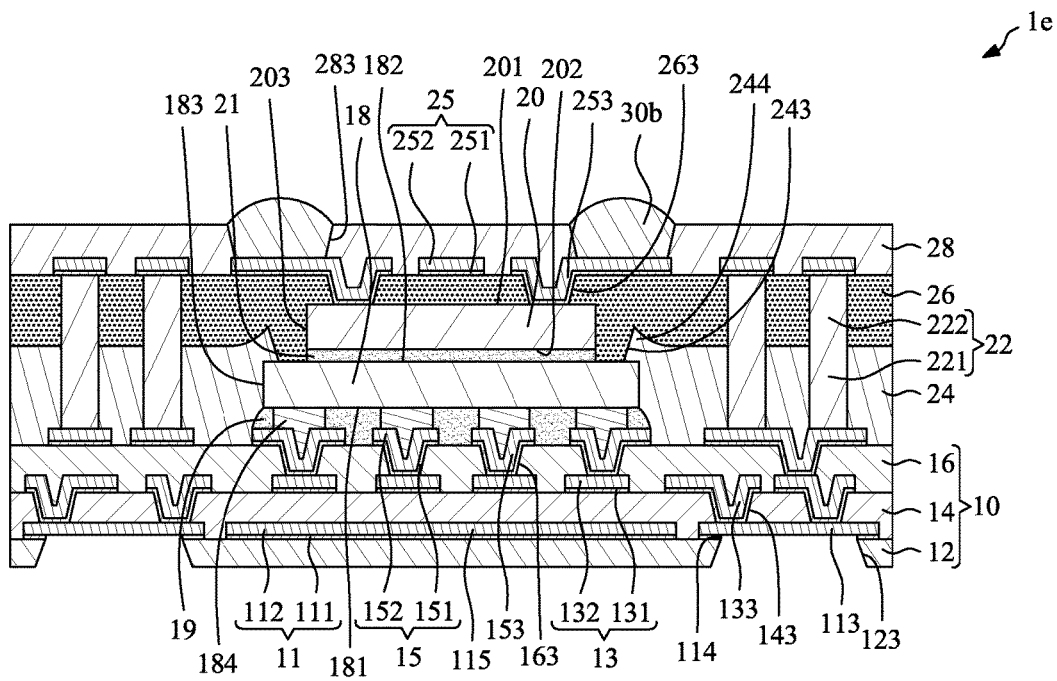
FIG. 6 illustrates a cross-sectional view of some embodiments of a semiconductor package structure according to an aspect of the present disclosure.

FIG. 6 illustrates a cross-sectional view of some embodiments of a semiconductor package structure 1e according to an aspect of the present disclosure. The semiconductor package structure 1e of FIG. 6 is similar to the semiconductor package structure 1 as shown in FIG. 1, except for the structure of the external connector 30b. In FIG. 1, the external connector 30 may be a solder bump adapted for a ball grid array (BGA) type package structure. In FIG. 6, the external connector 30b has a smaller volume suitable for a land grid array (LGA) type package structure. The external connector 30b may be configured as part of an LGA type package structure.

Figure 7:
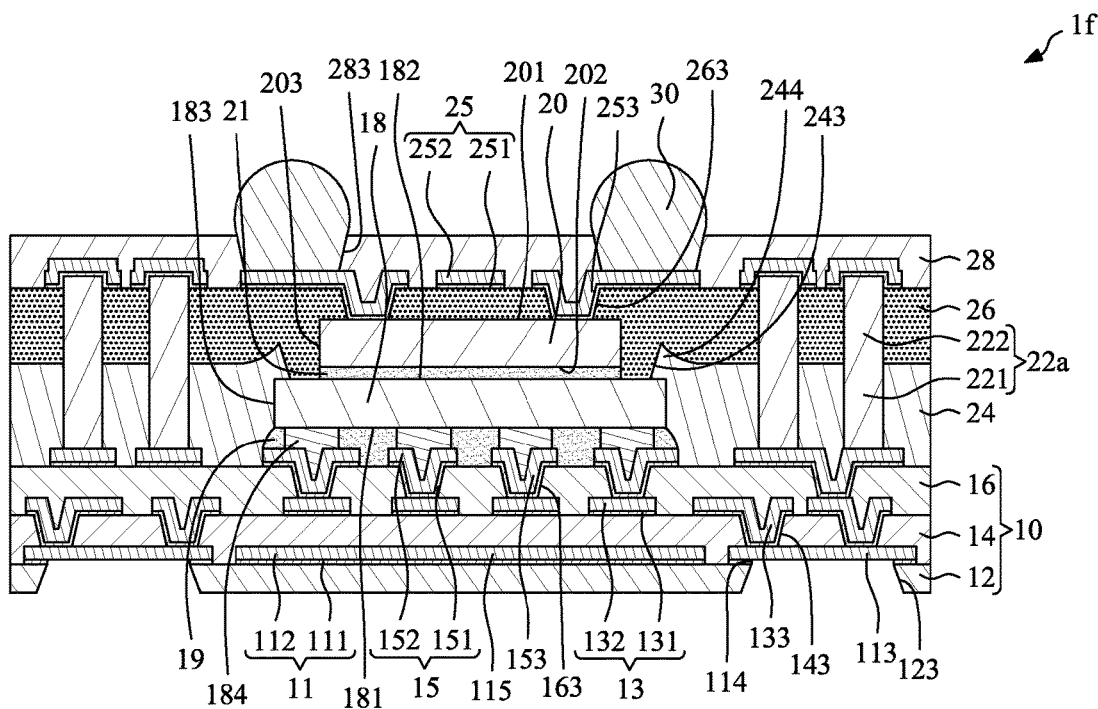
FIG. 7 illustrates a cross-sectional view of some embodiments of a semiconductor package structure according to an aspect of the present disclosure.

FIG. 7 illustrates a cross-sectional view of some embodiments of a semiconductor package structure if according to an aspect of the present disclosure. The semiconductor package structure if of FIG. 7 is similar to the semiconductor package structure 1 as shown in FIG. 1, except that the upper surfaces of the conductive elements 22a may not be substantially coplanar with the upper surface of the second encapsulant 26. As shown in FIG. 7, the upper portions of the conductive elements 22a may protrude from the upper surface of the second encapsulant 26, and a height of the conductive element 22a is greater than a sum of a thickness of the first encapsulant 24 and a thickness of the second encapsulant 26 (e.g. is about 1.1 times the sum of the thickness of the first encapsulant 24 and the thickness of the second encapsulant 26 or more, is about 1.2 times the sum of the thickness of the first encapsulant 24 and the thickness of the second encapsulant 26 or more, or is about 1.3 times the sum of the thickness of the first encapsulant 24 and the thickness of the second encapsulant 26 or more). A portion of the first wiring layer 25 covers a protruding portion of the conductive element 22a to form a cap structure.

Figure 8:
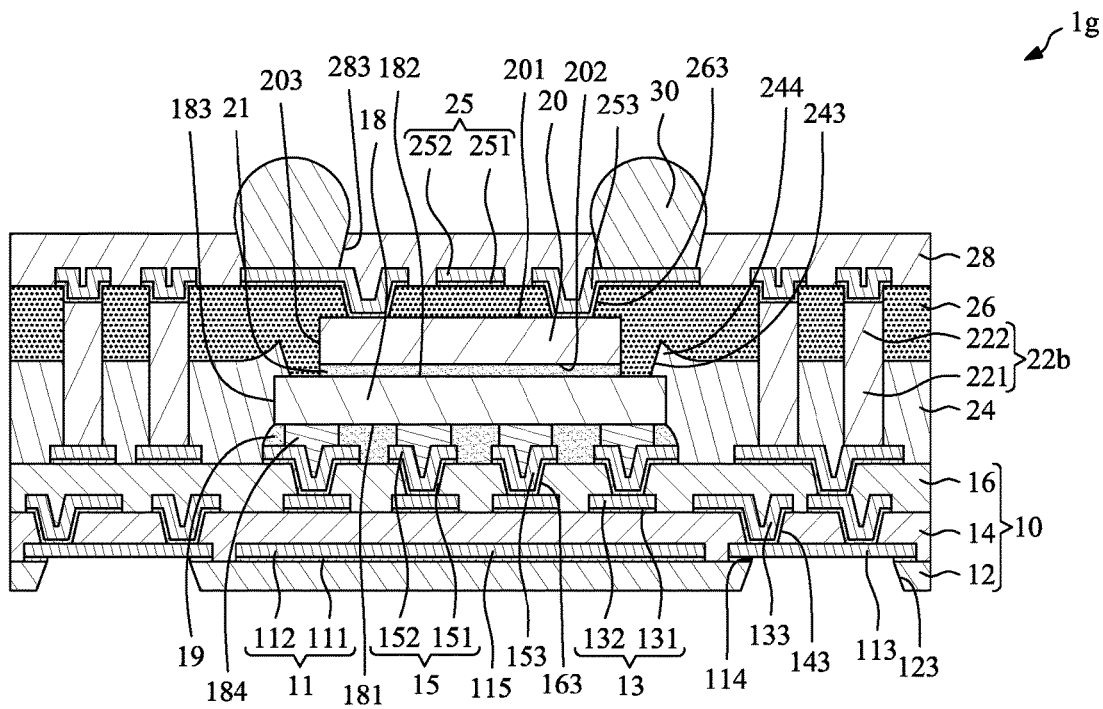
FIG. 8 illustrates a cross-sectional view of some embodiments of a semiconductor package structure according to an aspect of the present disclosure.

FIG. 8 illustrates a cross-sectional view of some embodiments of a semiconductor package structure 1g according to an aspect of the present disclosure. The semiconductor package structure 1g of FIG. 8 is similar to the semiconductor package structure 1 as shown in FIG. 1, except that the upper surfaces of the conductive elements 22b may not be substantially coplanar with the upper surface of the second encapsulant 26. As shown in FIG. 8, the upper portions of the conductive elements 22b may recessed from the upper surface of the second encapsulant 26, and a height of the conductive element 22b is less than a sum of a thickness of the first encapsulant 24 and a thickness of the second encapsulant 26 (e.g. is about 0.9 times the sum of the thickness of the first encapsulant 24 and the thickness of the second encapsulant 26 or less, is about 0.8 times the sum of the thickness of the first encapsulant 24 and the thickness of the second encapsulant 26 or less, or is about 0.7 times the sum of the thickness of the first encapsulant 24 and the thickness of the second encapsulant 26 or less). A portion of the first wiring layer 25 covers the upper portion of the conductive element 22a to form an indented cap structure.

Figure 9:
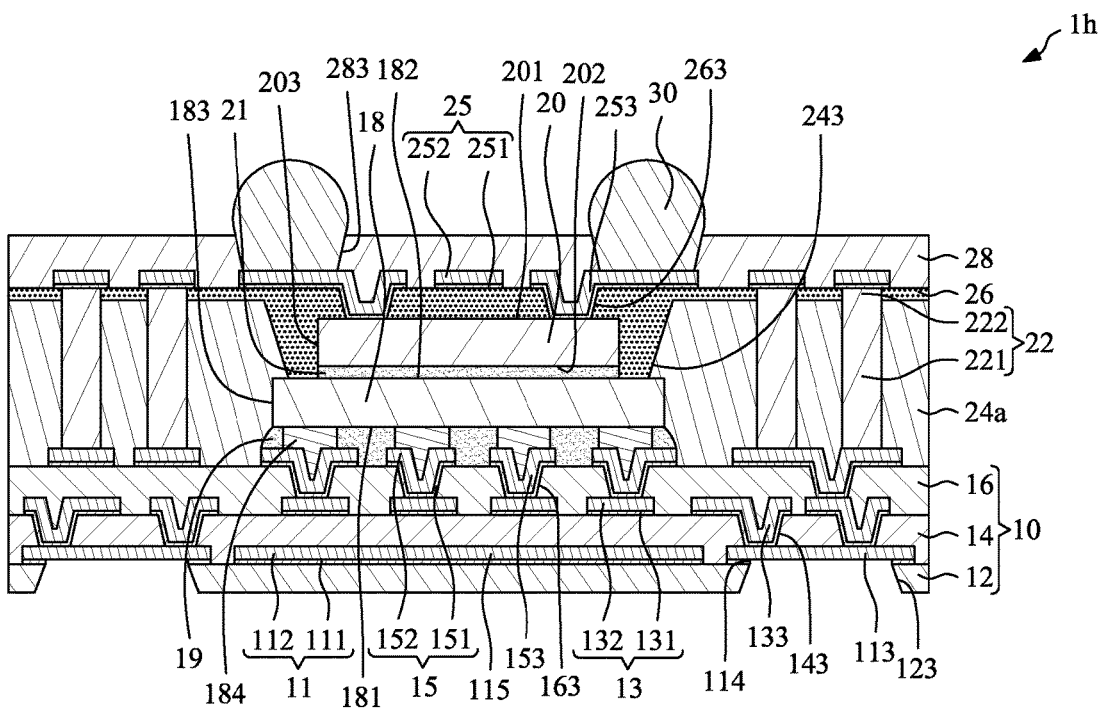
FIG. 9 illustrates a cross-sectional view of some embodiments of a semiconductor package structure according to an aspect of the present disclosure.

FIG. 9 illustrates a cross-sectional view of some embodiments of a semiconductor package structure 1h according to an aspect of the present disclosure. The semiconductor package structure 1h of FIG. 9 is similar to the semiconductor package structure 1 as shown in FIG. 1, except that the thickness of the first encapsulant 24a. In FIG. 1, the thickness of the first encapsulant 24 is less than a sum of the thickness of the first semiconductor die 18 and the thickness of the second semiconductor die 20, thus, the upper surface of the first encapsulant 24 is lower than the first surface 201 of the second semiconductor die 20. In FIG. 9, the thickness of the first encapsulant 24 is greater than a sum of the thickness of the first semiconductor die 18 and the thickness of the second semiconductor die 20 (e.g. is about 1.1 times the sum of the thickness of the first semiconductor die 18 and the thickness of the second semiconductor die 20 or more, is about 1.2 times the sum of the thickness of the first semiconductor die 18 and the thickness of the second semiconductor die 20 or more, or is about 1.3 times the sum of the thickness of the thickness of the first semiconductor die 18 and the thickness of the second semiconductor die 20 or more), thus, the upper surface of the first encapsulant 24 is higher than the first surface 201 of the second semiconductor die 20 (e.g. by about 5 μm or more, by about 10 μm or more, or by about 15 μm or more). It noted that, in some embodiments, the upper surface of the first encapsulant 24 and the first surface 201 of the second semiconductor die 20 may be at about the same level.

Figure 10:
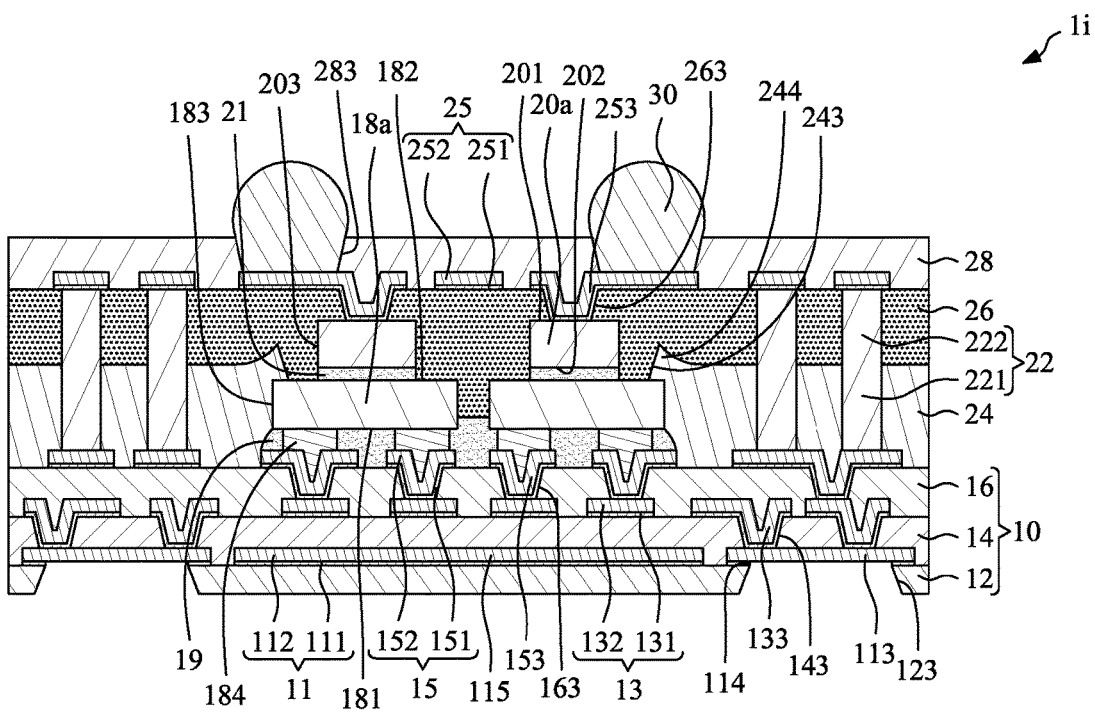
FIG. 10 illustrates a cross-sectional view of some embodiments of a semiconductor package structure according to an aspect of the present disclosure.

FIG. 10 illustrates a cross-sectional view of some embodiments of a semiconductor package structure 1i according to an aspect of the present disclosure. The semiconductor package structure 1i of FIG. 10 is similar to the semiconductor package structure 1 as shown in FIG. 1, except that the semiconductor package structure 1i includes two first semiconductor dice 18a and two second semiconductor dice 20a. Each of the second semiconductor dice 20a is disposed on a respective one of the first semiconductor dice 18a. In some embodiments, two second semiconductor dice 20a may be disposed on one first semiconductor die 18a. Alternatively, one second semiconductor die 20a may be disposed on two first semiconductor dice 18a.

Figure 11:
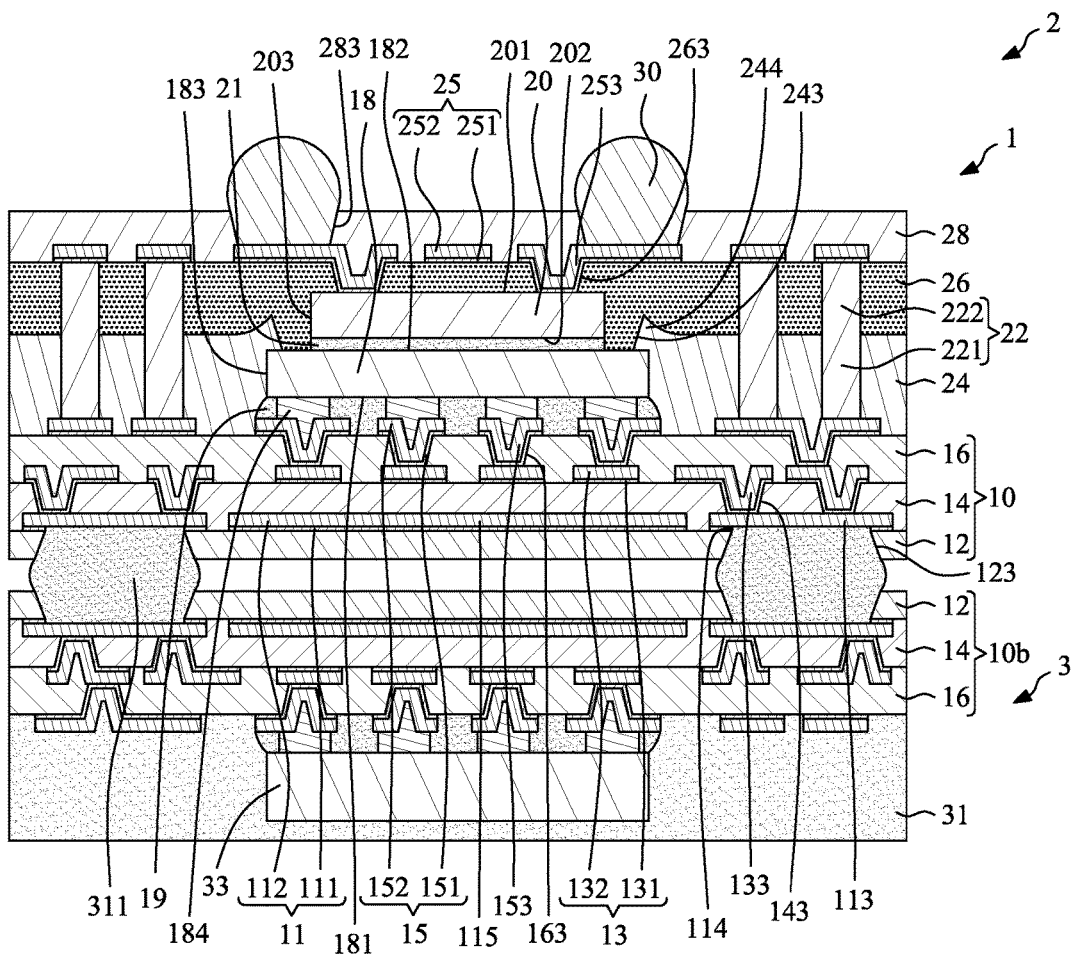
FIG. 11 illustrates a cross-sectional view of some embodiments of a stacked package structure according to an aspect of the present disclosure.

FIG. 11 illustrates a cross-sectional view of some embodiments of a stacked package structure 2 according to an aspect of the present disclosure. The stacked package structure 2 of FIG. 11 includes a bottom package 3 and a top package 1 stacked on the bottom package 3. The top package 1 is the same as the semiconductor package structure 1 as shown in FIG. 1. The bottom package 3 includes a bottom base material 10b, a bottom semiconductor die 33 and a bottom encapsulant 31. The bottom base material 10b is similar to the base material 10 of FIG. 1. The bottom semiconductor die 33 is disposed on and electrically connected to the bottom base material 10b. The bottom encapsulant 31 covers the bottom semiconductor die 33 and the bottom base material 10b. At least one connecting element 311 (e.g., solder) is used to connect an RDL (e.g., the first RDL 11) of the base material 10 of the top package 1 and an RDL of the bottom base material 10b of the bottom package 3.

Figure 12:
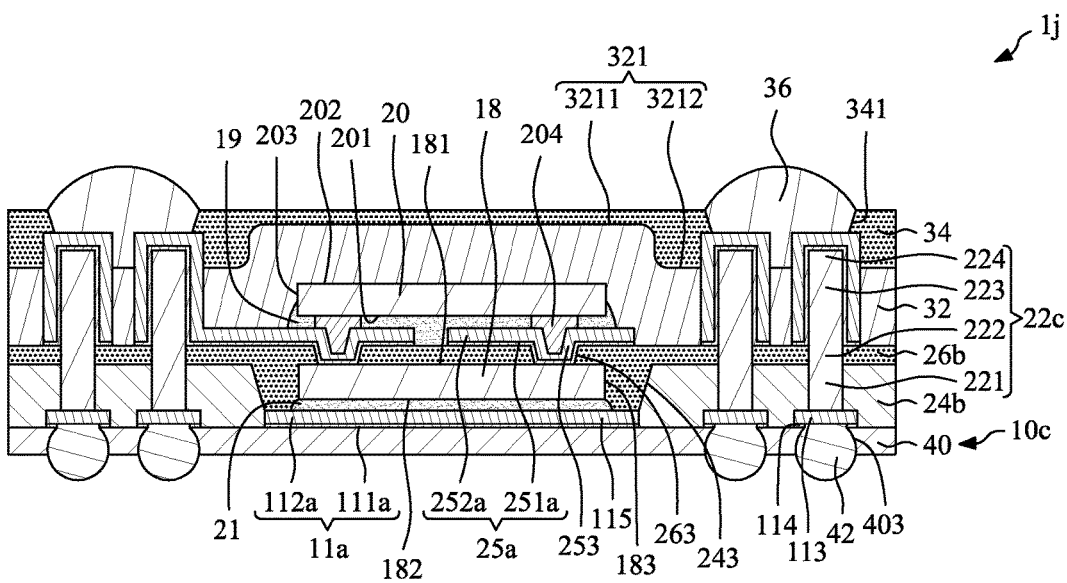
FIG. 12 illustrates a cross-sectional view of some embodiments of a semiconductor package structure according to an aspect of the present disclosure.

FIG. 12 illustrates a cross-sectional view of some embodiments of a semiconductor package structure 1j according to an aspect of the present disclosure. The semiconductor package structure 1j includes a base material 10c (including, for example, a passivation layer 40 and an RDL 11a), a first semiconductor die 18, a second semiconductor die 20, a plurality of conductive elements 22c, a first encapsulant 24b, a second encapsulant 26b, a first wiring layer 25a, a third encapsulant 32, a fourth encapsulant 34, at least one terminal 36 (e.g., a solder bump), and a plurality of connecting elements 42.

In one or more embodiments, the base material 10c may include the passivation layer 40 and the RDL 11a (also referred to as "a second wiring layer" or "a bottom wiring layer"). The passivation layer 40 may include, or be formed from, a photoresist layer, a cured photosensitive material, a cured PID material such as a PA, a PI, an epoxy or PBO, or a combination of two or more thereof. In one or more embodiments, the passivation layer 40 may include, or be formed from a dry film type material that includes a resin and a plurality of fillers; and CTE of the passivation layer 40 may be in a range of about 60 ppm/° C. to about 70 ppm/° C. In one or more embodiments in which the dry film type material is a photosensitive material, such dry film type material may further include a sensitizer, a photoinitiator and a cross-linker. In one or more embodiments in which the dry film type material is a non-photosensitive material, such dry film type material may omit the sensitizer, the photoinitiator and the cross-linker. In another embodiment, the passivation layer 40 may include, or be formed from a liquid type material that includes a homogeneous resin without fillers; and CTE of the passivation layer 40 may be in a range of about 54 ppm/° C. to about 65 ppm/° C. In one or more embodiments in which the liquid type material is a photosensitive material, such liquid type material may further include DNQ. In one or more embodiments in which the liquid type material is a non-photosensitive material, such liquid type material may omit the DNQ. In some embodiments, the passivation layer 40 may be a dry film material. In some embodiments, the material of the passivation layer 40 may include inorganic material (e.g., $SiO_x$, $SiN_x$, $TaO_x$), a glass, silicon, or a ceramic. As shown in FIG. 12, the passivation layer 40 may define at least one through hole 403 extending through the passivation layer 40.

The RDL 11a (e.g., the second wiring layer or the bottom wiring layer) is disposed on the passivation layer 40 and embedded in the first encapsulant 24b. For example, the RDL 11a may include a seed layer 111a and a conductive metal layer 112a disposed in that order on the passivation layer 40. The seed layer 111a may include, for example, titanium and/or copper, another metal, or an alloy, and may be formed or disposed by sputtering. The conductive metal layer 112a may include, for example, copper, or another metal or combination of metals, and may be formed or disposed by electroplating. In some embodiments, as shown in FIG. 1, the RDL 11a may include at least one soldering pad 113 and a support portion 115. A portion of the seed layer 111a corresponding to the through hole 403 of the passivation layer 40 is removed so as to form a through hole 114 and expose a portion of a lower surface of the soldering pad 113 for external connection. That is, the size and position of the through hole 114 of the seed layer 111a correspond to the size and position of the through hole 403 of the passivation layer 40. In addition, the exposed portion of the soldering pad 113 includes a portion of the conductive metal layer 112a, and is exposed from the through hole 114 of the seed layer 111a and the through hole 403 of the passivation layer 40. The support portion 115 may have a large area so as to increase the rigidity of the semiconductor package structure 1j (e.g. an area larger than a footprint of the die 18 by a factor of about 1.1 or more, about 1.2 or more, or about 1.3 or more). In the embodiment illustrated in FIG. 12, the RDL 11a may be a second wiring layer or a bottom wiring layer that is disposed under the first semiconductor die 18. In addition, at least a portion of the RDL 11a (e.g., the second wiring layer or the bottom wiring layer) is embedded in the first encapsulant 24b.

The first semiconductor die 18 is disposed on the support portion 115 of the RDL 11a of the base material 10c. The first semiconductor die 18 has a first surface 181 (e.g., an active surface), a second surface 182 (e.g., a back side surface) and a lateral surface 183. The second surface 182 is opposite to the first surface 181, and the lateral surface 183 extends between the first surface 181 and the second surface 182. As shown in FIG. 12, the second surface 182 of the first semiconductor die 18 is adhered to the support portion 115 of the RDL 11a through the adhesion layer 21. The first surface 181 of the first semiconductor die 18 faces toward the second semiconductor die 20.

The first encapsulant 24b covers a portion of the RDL 11a and the passivation layer 40, and surrounds the first semiconductor die 18 and the first portion 221 of the conductive element 22c. The first encapsulant 24b may be formed from a first material. In some embodiments, the first material may be a non-photosensitive dry film type material and includes a first resin and a plurality of fillers dispersed in the first resin. As shown in FIG. 12, the first encapsulant 24b may define a cavity 243 to expose the first semiconductor die 18 and another portion of the RDL 11a. That is, the first encapsulant 24b does not contact the first semiconductor die 18. Thus, the cavity 243 may expose the first surface 181 of the first semiconductor die 18. In addition, the first encapsulant 24 may cover and contact the first portion 221 of the conductive element 22c.

The second encapsulant 26b covers the first semiconductor die 18, and surrounds the second portion 222 of the conductive element 22c. The second encapsulant 26b may be formed from a second material that is different from the first material of the first encapsulant 24b. In some embodiments, the second material may be a photosensitive liquid type material that includes a homogeneous second resin without fillers, and may be formed by coating. As shown in FIG. 12, the second encapsulant 26b may cover and contact the first encapsulant 24b and extend into the cavity 243 so that the second encapsulant 26b may surround and contact the first semiconductor die 18. In some embodiments, the second encapsulant 26b may cover and contact the first surface 181 and the lateral surface 183 of the first semiconductor die 18, and may define at least one through hole 263 extending through the second encapsulant 26b so as to expose a portion of the first surface 181 of the first semiconductor die 18. In addition, the second encapsulant 26b may cover and contact the second portion 222 of the conductive element 22c. It is noted that a value of a surface roughness of the upper surface of the second encapsulant 26b is less than a value of a surface roughness of the upper surface of the first encapsulant 24b (e.g. is about 0.9 times a value of the surface roughness of the upper surface of the first encapsulant 24b or less, is about 0.8 times a value of the surface roughness of the upper surface of the first encapsulant 24b or less, or is about 0.7 times a value of the surface roughness of the upper surface of the first encapsulant 24b or less).

The first wiring layer 25a electrically connects the conductive elements 22c. In some embodiments, the first wiring layer 25a is an RDL, and is disposed between the first semiconductor die 18 the second semiconductor die 20. The first wiring layer 25a is disposed on the second encapsulant 26b and in the through hole 263. For example, the first wiring layer 25a may include a seed layer 251a and a conductive metal layer 252a disposed in that order on the second encapsulant 26b. The seed layer 251a may include, for example, titanium and/or copper, another metal, or an alloy, and may be formed or disposed by sputtering. The conductive metal layer 252a may include, for example, copper, or another metal or combination of metals, and may be formed or disposed by electroplating. In some embodiments, as shown in FIG. 12, the first wiring layer 25a may include at least one conductive via 253 disposed in the through hole 263 of the second encapsulant 26b. The conductive via 253 contacts a portion of the first surface 181 of the first semiconductor die 18 so that the first wiring layer 25a is electrically connected to and contacts the first semiconductor die 18. The first wiring layer 25a and the conductive via 253 may be formed concurrently or integrally (e.g. as a monolithic structure). As shown in FIG. 12, a line width/line space (L/S) of the first wiring layer 25a may be less than about 7 µm/about 7 µm, less than about 5 µm/about 5 µm, or less than about 2 µm/about 2 µm. In addition, a portion of the first wiring layer 25a may cover and contact an upper portion of the conductive element 22c so as to form a cap structure. Thus, the first wiring layer 25a is electrically connected to the conductive elements 22c.

The second semiconductor die 20 is electrically connected to the first wiring layer 25a, and is disposed above the second encapsulant 26b. The second semiconductor die 20 has a first surface 201 (e.g., an active surface), a second surface (e.g., a back side surface) 202 and a lateral surface 203. The second surface 202 is opposite to the first surface 201, and the lateral surface 203 extends between the first surface 201 and the second surface 202. The second semiconductor die 20 may include a plurality of conductive bumps 204 disposed adjacent to the first surface 201. The conductive bumps 204 contact portions of the first wiring layer 25a so that the second semiconductor die 20 is electrically connected to the first wiring layer 25a through the conductive bumps 204. That is, the second semiconductor die 20 is attached to the first wiring layer 25a by flip chip bonding, and the first surface 201 of the second semiconductor die 20 faces the first surface 181 the first semiconductor die 18. An underfill 19 is further included in a space between the first surface 201 of the second semiconductor die 20 and the first wiring layer 25a to cover and protect the conductive bumps 204. In some embodiments, the function and the size of the second semiconductor die 20 may be the same as or different from the function and the size of the first semiconductor die 18.

The third encapsulant 32 is disposed on the second encapsulant 26b, and covers the second semiconductor die 20 and a portion of the first wiring layer 25a. The third encapsulant 32 may include, or be formed from, a photoresist layer, a cured photosensitive material, a cured PID material such as an epoxy or a PI, or a combination of two or more thereof. In some embodiment, the third encapsulant 32 may include, or be formed from a photosensitive dry film type material, a non-photosensitive dry film type material, a photosensitive liquid type material, or a non-photosensitive liquid type material. The material of the third encapsulant 32 may be the same as the material of the first encapsulant 24b. In some embodiments, the third encapsulant 32 may be a dry film type material. The third encapsulant 32 surrounds the third portion 223 of the conductive element 22c. In some embodiments, the third encapsulant 32 does not contact the third portion 223 of the conductive element 22c directly, and the third encapsulant 32 contacts the portion of the first wiring layer 25a that is disposed on the surface of the third portion 223 of the conductive element 22c. In addition, the third encapsulant 32 has a top surface 321 including a first portion 3211 and a second portion 3212. The first portion 3211 of the top surface 321 is above the second semiconductor die 20, and the second portion 3212 of the top surface 321 is not above the second semiconductor die 20. The first portion 3211 of the top surface 321 is higher than the second portion 3212 of the top surface 321 (e.g. by a factor of about 1.1 or more, of about 1.2 or more, or of about 1.3 or more) due to the dry film type material of the third encapsulant 32. As shown in FIG. 12, the second portion 3212 of the top surface 321 of the third encapsulant 32 is higher than the second surface 202 of the second semiconductor die 20 (e.g. by about 5 µm or more, by about 10 µm or more, or by about 15 µm or more). However, in other embodiment, the second portion 3212 of the top surface 321 of the third encapsulant 32 and the second surface 202 of the second semiconductor die 20 may be substantially at the same level.

The fourth encapsulant 34 may be a protection layer that covers the top surface 321 of the third encapsulant 32. The fourth encapsulant 34 may include, or be formed from, a photoresist layer, a cured photosensitive material, a cured PID material such as an epoxy or a PI, or a combination of two or more thereof. In some embodiment, the fourth encapsulant 34 may include, or be formed from a photosensitive dry film type material, a non-photosensitive dry film type material, a photosensitive liquid type material, or a non-photosensitive liquid type material. In some embodiments, the material of the fourth encapsulant 34 may be the same as the material of the second encapsulant 26b. In some embodiments, the material of the fourth encapsulant 34 may include inorganic material (e.g., $SiO_x$, $SiN_x$, $TaO_x$), a glass, silicon, or a ceramic. The fourth encapsulant 34 surrounds the fourth portion 224 of the conductive element 22c. In some embodiments, the fourth encapsulant 34 does not contact the fourth portion 224 of the conductive element 22c directly, and the fourth encapsulant 34 contacts the portion of the first wiring layer 25a that is disposed on the surface of the fourth portion 224 of the conductive element 22c. The fourth encapsulant 34 may define at least one opening 341 extending through the fourth encapsulant 34. The position of the opening 341 corresponds to the position of the conductive element 22c so as to expose a portion of the first wiring layer 25a disposed on the conductive element 22c.

The conductive elements 22c (e.g., conductive pillars) are disposed on the RDL 11a of the base material 10c and around the first semiconductor die 18 and the second semiconductor die 20 so that the conductive elements 22c are electrically connected to the RDL 11a. The conductive element 22c may be a cylindrical solid pillar, and the material thereof may include, for example, a metal (e.g., copper or another conductive metal, or an alloy thereof). As shown in FIG. 12, each of the conductive elements 22c includes a first portion 221, a second portion 222, a third portion 223 and a fourth portion 224. The first portion 221 is disposed in the first encapsulant 24b, the second portion 222 is disposed in the second encapsulant 26b, the third portion 223 is disposed in the third encapsulant 32, and the fourth portion 224 is disposed in the fourth encapsulant 34. In some embodiments, the fourth portion 224 of the conductive element 22c may be omitted. That is, the conductive element 22c may not extend into the fourth encapsulant 34.

The terminal 36 is formed or disposed in a respective one of the opening 341 and on the exposed portion of the first wiring layer 25a for external connection. The connecting elements 42 (e.g., a solder bump) are disposed on the exposed portion of a respective soldering pad 113 exposed from the through hole 114 of the seed layer 111a and the through hole 403 of the passivation layer 40.

As shown in FIG. 12, the height of the conductive element 22c may be greater than a sum of a thickness of the first semiconductor die 18 and a thickness of the second semiconductor die 20 (e.g. by a factor of about 1.1 or more, 1.2 or more, or 1.3 or more). For example, the height of the conductive element 22c may be greater than about 150 µm. In addition, in comparison with a comparative embodiment in which the encapsulant is a hard molding compound, the materials of the first encapsulant 24b and the second encapsulant 26b of the semiconductor package structure 1j are relative tough and can avoid cracking and delamination. Further, the cavity 243 can increase an adhesion force between the first encapsulant 24b and the second encapsulant 26b so as to avoid delamination. Furthermore, the stacked semiconductor dice (including the first semiconductor die 18 and the second semiconductor die 20) and the tall conductive elements 22c can achieve a higher I/O count. In addition, the support portion 115 can help to adjust and balance (e.g., thermal stress) of the semiconductor package structure 1j, and can also provide good heat-dissipating capability. In addition, the first wiring layer 25a may have a fine line pitch (for example, the L/S of the first wiring layer 25a may be less than about 5 µm/about 5 µm, or about 2 µm/about 2 µm) due to the good uniformity (e.g., variance between portions of the second encapsulate 26 of less than about 5%) of the upper surface of second encapsulant 26b. In addition, the CTEs of the passivation layer 40, the first encapsulant 24b, the second encapsulant 26b, the third encapsulant 32 and the fourth encapsulant 34 are very close to each other, thus, CTE mismatch therebetween may be very small, thus, the warpage of the semiconductor package structure 1j may be small.

Figure 13:
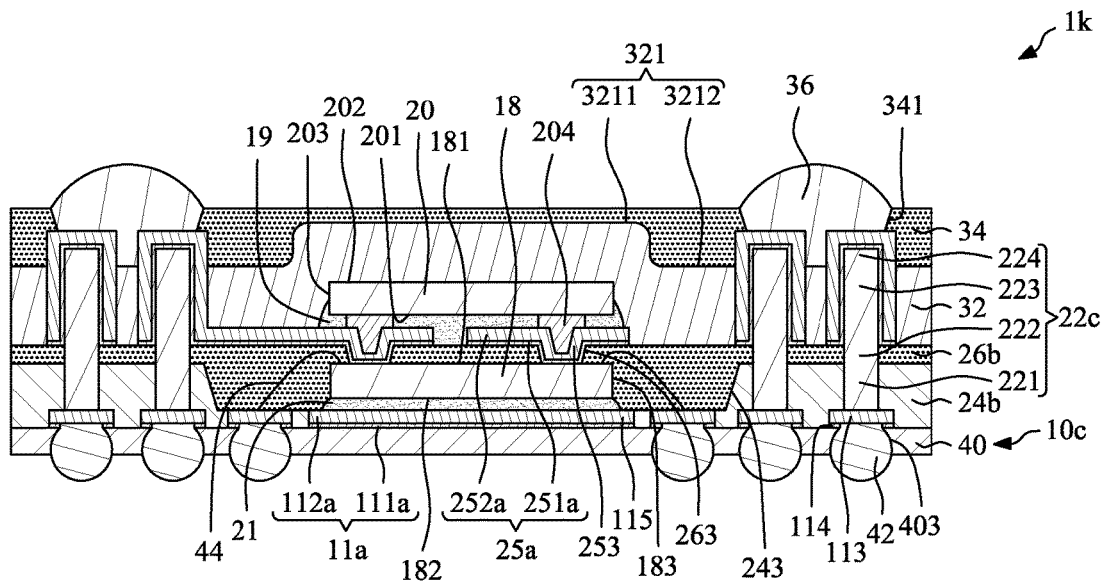
FIG. 13 illustrates a cross-sectional view of some embodiments of a semiconductor package structure according to an aspect of the present disclosure.

FIG. 13 illustrates a cross-sectional view of some embodiments of a semiconductor package structure 1k according to an aspect of the present disclosure. The semiconductor package structure 1k of FIG. 13 is similar to the semiconductor package structure 1j as shown in FIG. 12, except that the semiconductor package structure 1k further includes a plurality of bonding wires 44. The bonding wires 44 electrically connect the first surface 181 of the first semiconductor die 18 and a portion of the RDL 11a.

Figure 14:
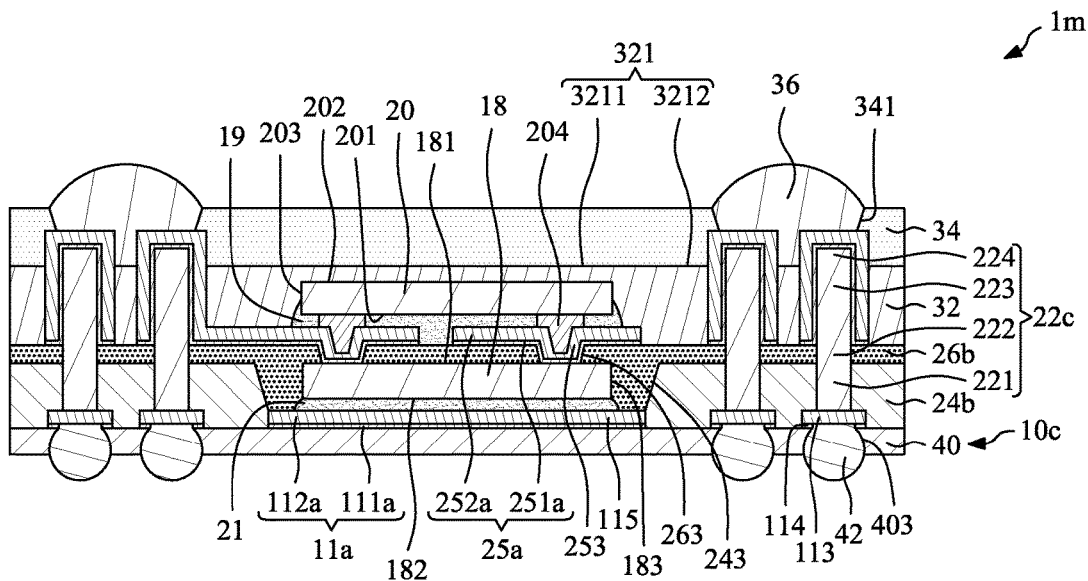
FIG. 14 illustrates a cross-sectional view of some embodiments of a semiconductor package structure according to an aspect of the present disclosure.

FIG. 14 illustrates a cross-sectional view of some embodiments of a semiconductor package structure 1m according to an aspect of the present disclosure. The semiconductor package structure 1m of FIG. 14 is similar to the semiconductor package structure 1j as shown in FIG. 12, except that the first portion 3211 of the top surface 321 is substantially coplanar with the second portion 3212 of the top surface 321. That is, the top surface 321 of the third encapsulant 32 is a substantially flat surface.

Figure 15:
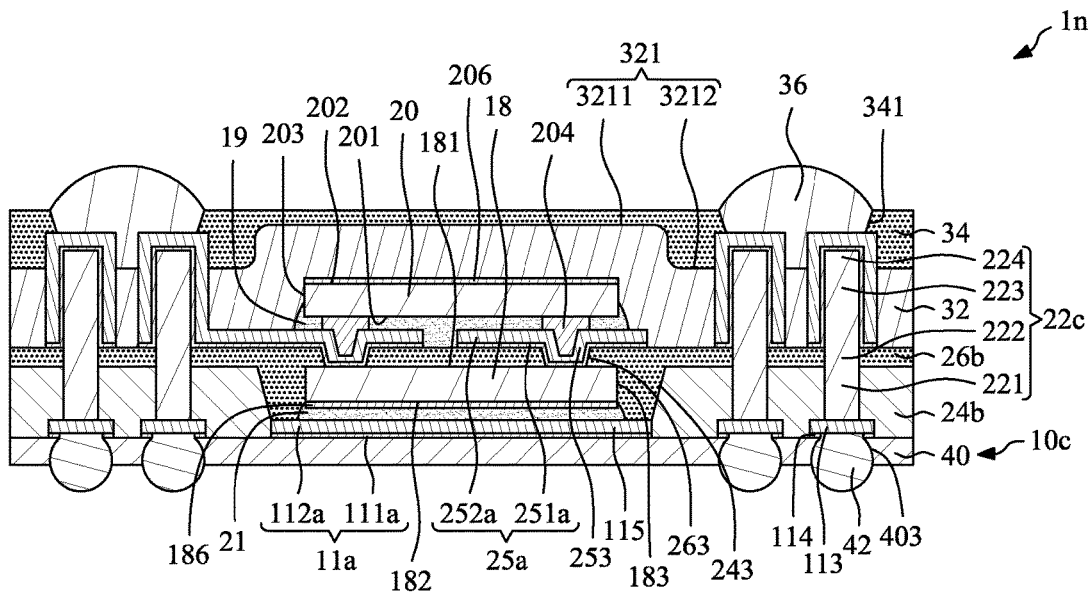
FIG. 15 illustrates a cross-sectional view of some embodiments of a semiconductor package structure according to an aspect of the present disclosure.

FIG. 15 illustrates a cross-sectional view of some embodiments of a semiconductor package structure 1n according to an aspect of the present disclosure. The semiconductor package structure 1n of FIG. 15 is similar to the semiconductor package structure 1j as shown in FIG. 12, except that a first backside layer 186 is disposed on the second surface 182 of the first semiconductor die 18, and a second backside layer 206 is disposed on the second surface 202 of the second semiconductor die 20. The materials of the first backside layer 186 and the second backside layer 206 may be metal (e.g., a titanium alloy such as titanium-tungsten (TiW), titanium-copper (TiCu), copper, stainless steel, iron, Ag, Au, or alloys thereof) and/or nonmetal (e.g., a PA, a PI, an epoxy, PBO, $SiO_x$, $SiN_x$, $TaO_x$). The first backside layer 186 can enhance the stress balancing of the first semiconductor die 18, and the second backside layer 206 can enhance the stress balancing of the second semiconductor die 20.

Figure 16:
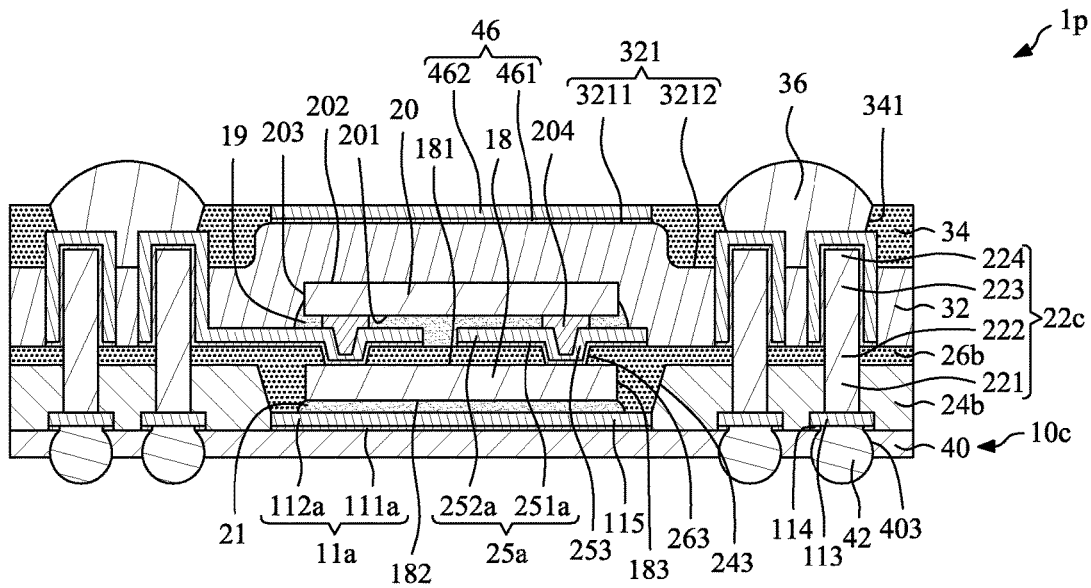
FIG. 16 illustrates a cross-sectional view of some embodiments of a semiconductor package structure according to an aspect of the present disclosure.

FIG. 16 illustrates a cross-sectional view of some embodiments of a semiconductor package structure 1p according to an aspect of the present disclosure. The semiconductor package structure 1p of FIG. 16 is similar to the semiconductor package structure 1j as shown in FIG. 12, except that a third backside layer 46 is disposed on the first portion 3211 of the top surface 321 of the third encapsulant 32. The third backside layer 46 may be a single layer or may include a first layer 461 and a second layer 462. The materials of the first layer 461 and the second layer 462 may be metal (e.g., a titanium alloy such as titanium-tungsten (TiW), titanium-copper (TiCu), copper, stainless steel, iron, Ag, Au, or alloys thereof) and/or nonmetal (e.g., a PA, a PI, an epoxy, PBO, $SiO_x$, $SiN_x$, $TaO_x$). The third backside layer 46 can enhance the stress balancing of the semiconductor package structure 1p.

Figure 17:
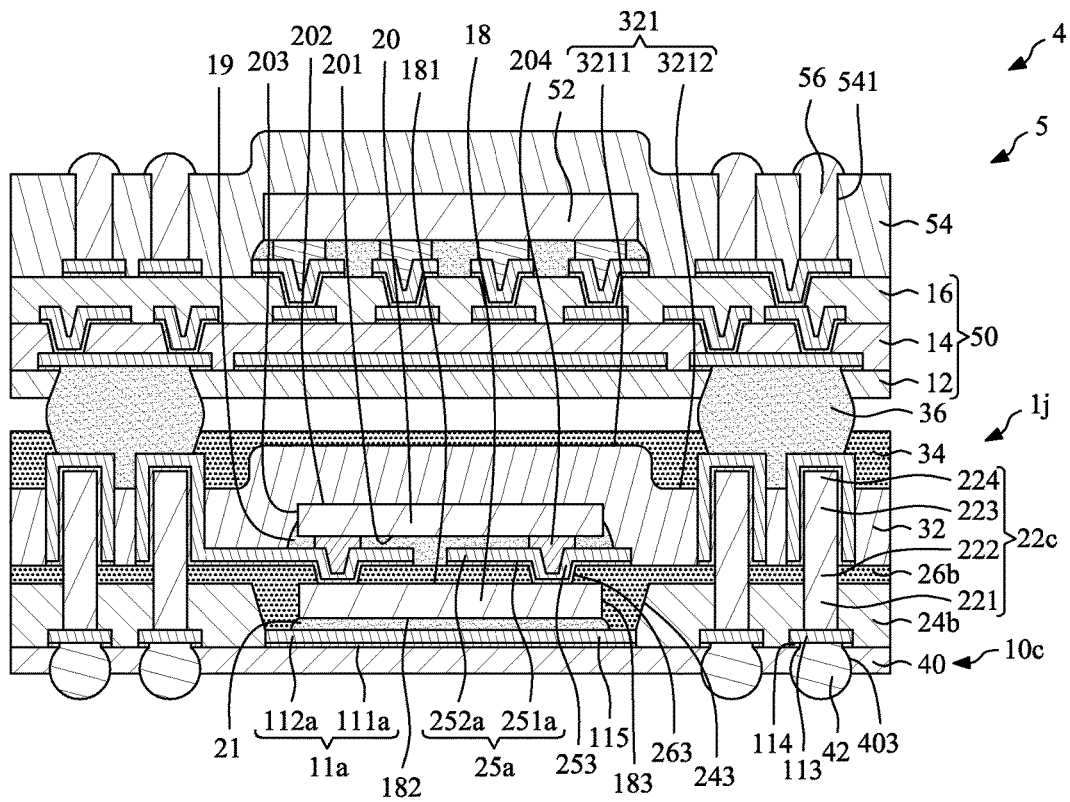
FIG. 17 illustrates a cross-sectional view of some embodiments of a stacked package structure according to an aspect of the present disclosure.

FIG. 17 illustrates a cross-sectional view of some embodiments of a stacked package structure 4 according to an aspect of the present disclosure. The stacked package structure 4 of FIG. 17 includes a bottom package 1j and a top package 5 stacked on the bottom package 1j. The bottom package 1j is the same as the semiconductor package structure 1j as shown in FIG. 12. The top package 5 includes a base material 50, a semiconductor die 52, an encapsulant 54 and a plurality of conductive pillars 56. The base material 50 is the same as the base material 10 of FIG. 1. The semiconductor die 52 is electrically connected to the base material 50 by flip chip bonding. The encapsulant 54 covers the semiconductor die 52 and the base material 50, and defines a plurality of through holes 541 extending through the encapsulant 54. The conductive pillars 56 are disposed in the through holes 541, and may protrude from the encapsulant 54. The material of the encapsulant 54 may be a photosensitive dry film type material or a non-photosensitive dry film type material. The terminal 36 of the bottom package 1j is used to electrically connect to an RDL of the base material 50 of the top package 5.

Figure 18:
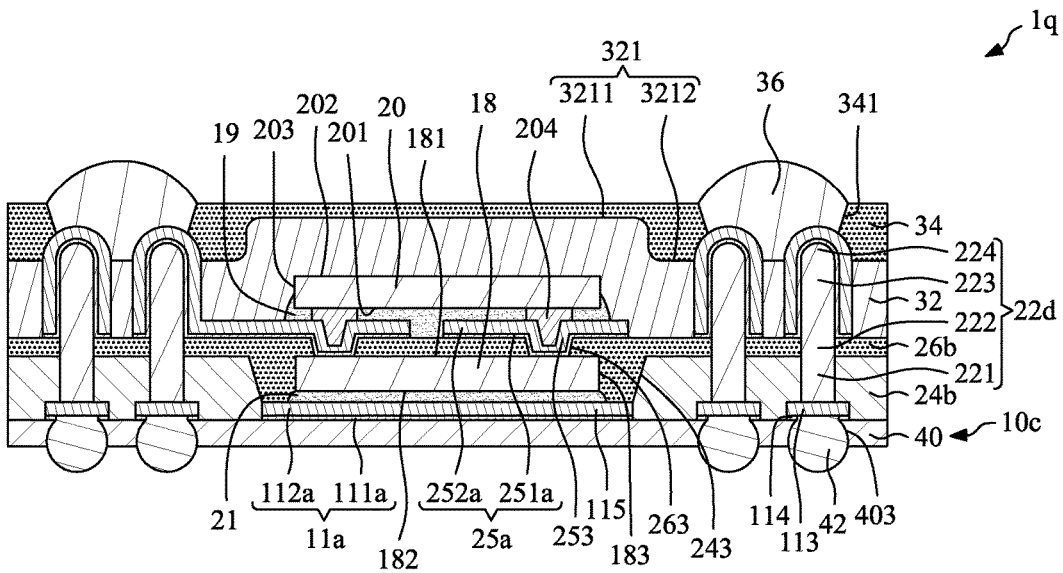
FIG. 18 illustrates a cross-sectional view of some embodiments of a semiconductor package structure according to an aspect of the present disclosure.

FIG. 18 illustrates a cross-sectional view of some embodiments of a semiconductor package structure 1q according to an aspect of the present disclosure. The semiconductor package structure 1q of FIG. 18 is similar to the semiconductor package structure 1j as shown in FIG. 12, except that a top surface of the conductive element 22d is a convex surface so that the tip of the conductive element 22d is in a mushroom shape.

Figure 19:
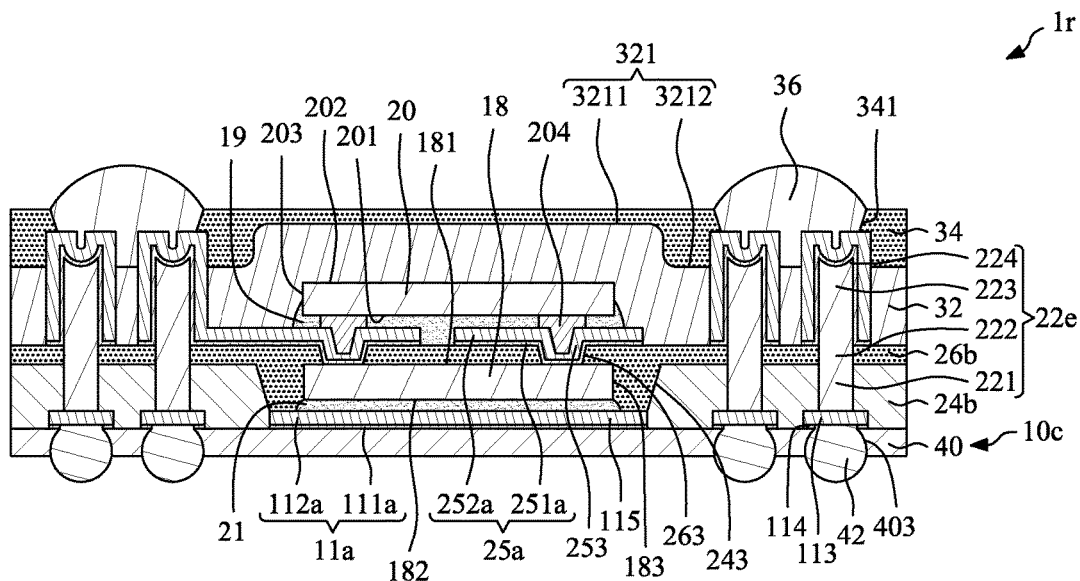
FIG. 19 illustrates a cross-sectional view of some embodiments of a semiconductor package structure according to an aspect of the present disclosure.

FIG. 19 illustrates a cross-sectional view of some embodiments of a semiconductor package structure 1r according to an aspect of the present disclosure. The semiconductor package structure 1r of FIG. 19 is similar to the semiconductor package structure 1j as shown in FIG. 12, except that a top surface of the conductive element 22e is a concave surface so that a tip of the conductive element 22e is indented.

Figure 20:
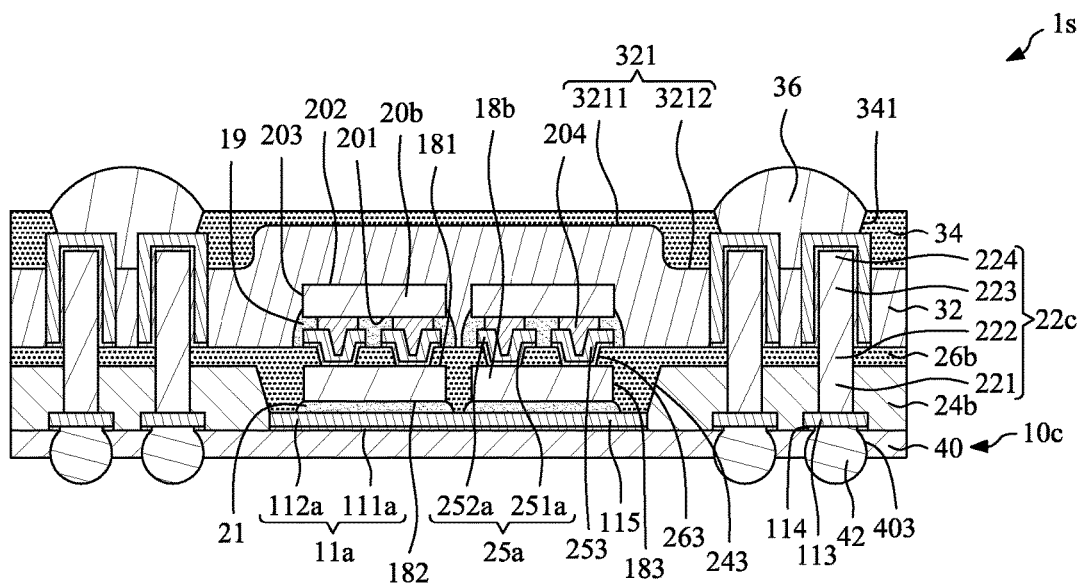
FIG. 20 illustrates a cross-sectional view of some embodiments of a semiconductor package structure according to an aspect of the present disclosure.

FIG. 20 illustrates a cross-sectional view of some embodiments of a semiconductor package structure 1s according to an aspect of the present disclosure. The semiconductor package structure is of FIG. 20 is similar to the semiconductor package structure 1j as shown in FIG. 12, except that the semiconductor package structure 1s includes two first semiconductor dice 18b and two second semiconductor dice 20b. Each of the second semiconductor dice 20b is disposed on a respective one of the first semiconductor dice 18b. In some embodiments, two second semiconductor dice 20b may be disposed on one first semiconductor die 18b. Alternatively, one second semiconductor die 20b may be disposed on two first semiconductor dice 18b.

Figure 21:
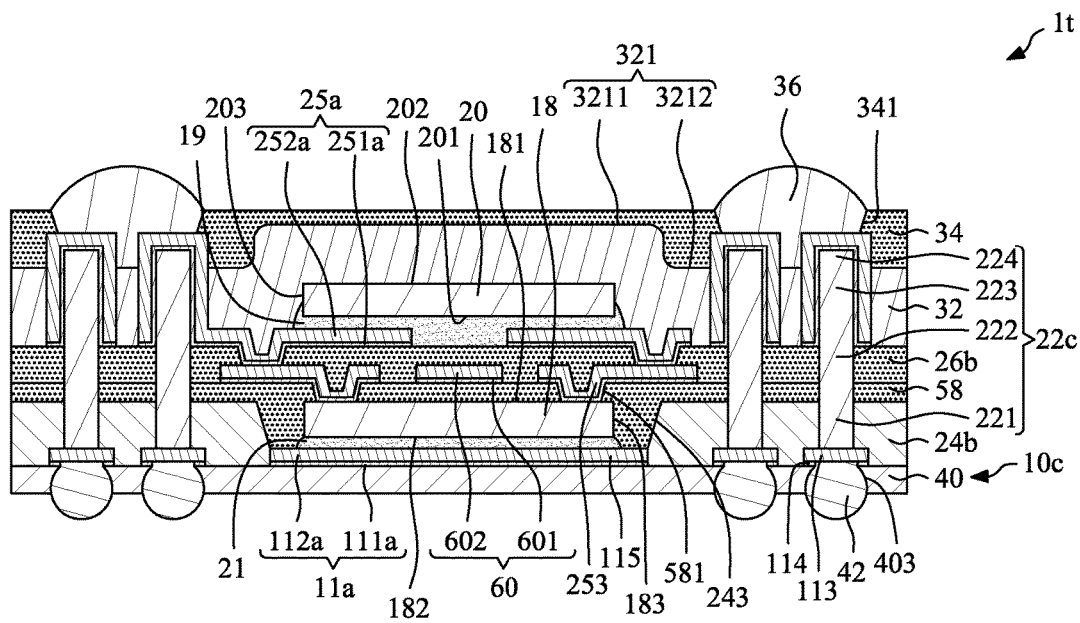
FIG. 21 illustrates a cross-sectional view of some embodiments of a semiconductor package structure according to an aspect of the present disclosure.

FIG. 21 illustrates a cross-sectional view of some embodiments of a semiconductor package structure 1t according to an aspect of the present disclosure. The semiconductor package structure 1t of FIG. 21 is similar to the semiconductor package structure 1j as shown in FIG. 12, except that the semiconductor package structure 1t further includes a fifth encapsulant 58 and a third wiring layer 60 disposed between the first encapsulant 24b and the second encapsulant 26b. The fifth encapsulant 58 covers the first encapsulant 24b and defines at least one through hole 581 to expose a portion of the first surface 181 of the first semiconductor die 18. The third wiring layer 60 is disposed on the fifth encapsulant 58 and in the through hole 581 to contact the first surface 181 of the first semiconductor die 18. The second encapsulant 26b covers the fifth encapsulant 58 and the third wiring layer 60. The first wiring layer 25a may contact the third wiring layer 60.

Figure 22:
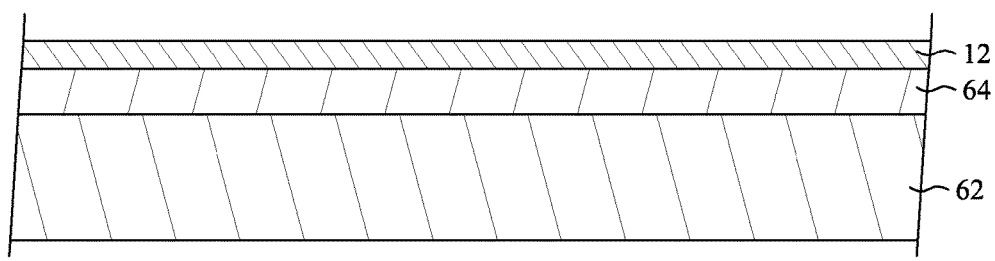
FIG. 22 illustrates one or more stages of some embodiments of a method for manufacturing a semiconductor package structure according to an aspect of the present disclosure.

FIG. 22 through FIG. 39 illustrate various stages of some embodiments of a method for manufacturing a semiconductor package structure according to an aspect of the present disclosure. In some embodiments, the method is for manufacturing a semiconductor package structure such as the semiconductor package structure 1 shown in FIG. 1. Referring to FIG. 22, a carrier 62 with a release layer 64 is provided. The carrier 62 may be, for example, a metal material, a ceramic material, a glass material, a substrate or a semiconductor wafer. The shape of the carrier 62 may be, for example, rectangular or square. Alternatively, the shape of the carrier 62 may be, for example, circular or elliptical.

Then, a first passivation layer 12 is formed or disposed on the release layer 64. The first passivation layer 12 may include, or be formed from, a photoresist layer, a cured photosensitive material, a cured PID material such as a PA, a PI, an epoxy or PBO, or a combination of two or more thereof. As stated above, in some embodiments, the first passivation layer 12 may be a dry film material. In some embodiments, the material of the first passivation layer 12 may include inorganic material (e.g., $SiO_x$, $SiN_x$, $TaO_x$), a glass, silicon, or a ceramic.

Figure 23:
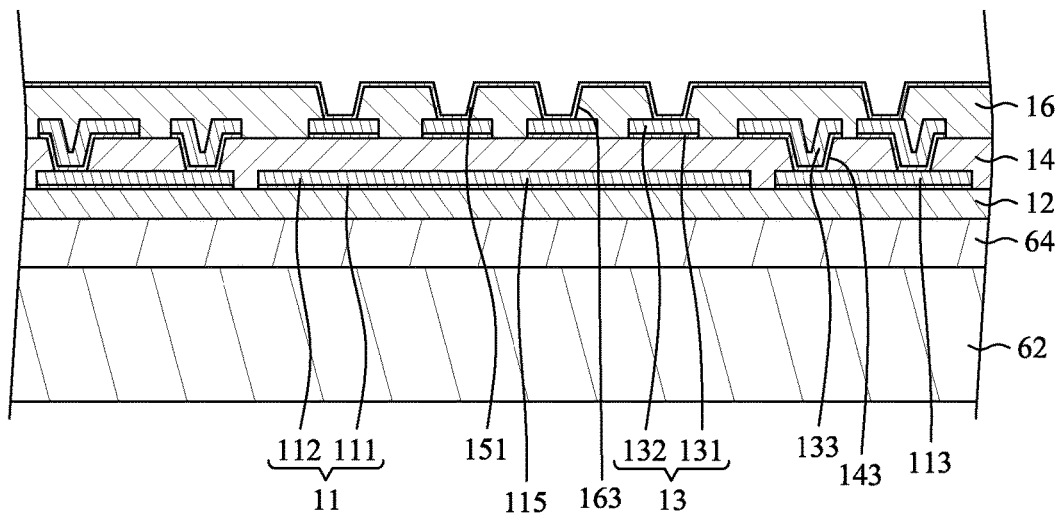
FIG. 23 illustrates one or more stages of some embodiments of a method for manufacturing a semiconductor package structure according to an aspect of the present disclosure.

Referring to FIG. 23, a first RDL 11 is formed on the first passivation layer 12. For example, the first RDL 11 may include a seed layer 111 and a conductive metal layer 112 disposed in that order on the first passivation layer 12. The seed layer 111 may include, for example, titanium and/or copper, another metal, or an alloy, and may be formed or disposed by sputtering. The conductive metal layer 112 may include, for example, copper, or another metal or combination of metals, and may be formed or disposed by electroplating. In some embodiments, as shown in FIG. 23, the RDL 11 may include at least one soldering pad 113 and a support portion 115.

Then, a second passivation layer 14 is formed on the first passivation layer 12 to cover the first RDL 11. The second passivation layer 14 may include, or be formed from, a photoresist layer, a cured photosensitive material, a cured PID material such as an epoxy or a PI, or a combination of two or more thereof. In some embodiment, the second passivation layer 14 may include, or be formed from a photosensitive dry film type material, a non-photosensitive dry film type material, a photosensitive liquid type material, or a non-photosensitive liquid type material. The material of the second passivation layer 14 may be the same as or different from the material of the first passivation layer 12. The second passivation layer 14 may define at least one through hole 143 extending through the second passivation layer 14 so as to expose a portion of an upper surface of the first RDL 11.

Then, a second RDL 13 is formed or disposed on the second passivation layer 14 and in the through hole 143. For example, the second RDL 13 may include a seed layer 131 and a conductive metal layer 132 disposed in that order on the second passivation layer 14. In some embodiments, the second RDL 13 may include at least one conductive via 133 disposed in the through hole 143 of the second passivation layer 14. The conductive via 133 contacts a portion of the upper surface of the first RDL 11 so that the second RDL 13 is electrically connected to the first RDL 11. The second RDL 13 and the conductive via 133 may be formed concurrently or integrally (e.g. as a monolithic structure). A line width/line space (L/S) of the second RDL 13 may be less than about 7 μm/about 7 μm, less than about 5 μm/about 5 μm, or less than about 2 μm/about 2 μm.

Then, a third passivation layer 16 is formed or disposed on the second passivation layer 14 to cover the second RDL 13. The third passivation layer 16 may include, or be formed from, a photoresist layer, a cured photosensitive material, a cured PID material such as an epoxy or a PI, or a combination of two or more thereof. In some embodiment, the third passivation layer 16 may include, or be formed from a photosensitive dry film type material, a non-photosensitive dry film type material, a photosensitive liquid type material, or a non-photosensitive liquid type material. The material of the third passivation layer 16 may be the same as or different from the material of the second passivation layer 14. The third passivation layer 16 may define at least one through hole 163 extending through the third passivation layer 16 so as to expose a portion of an upper surface of the second RDL 13.

Then, a seed layer 151 is formed or disposed on the third passivation layer 16 and in the through hole 163.

Figure 24:
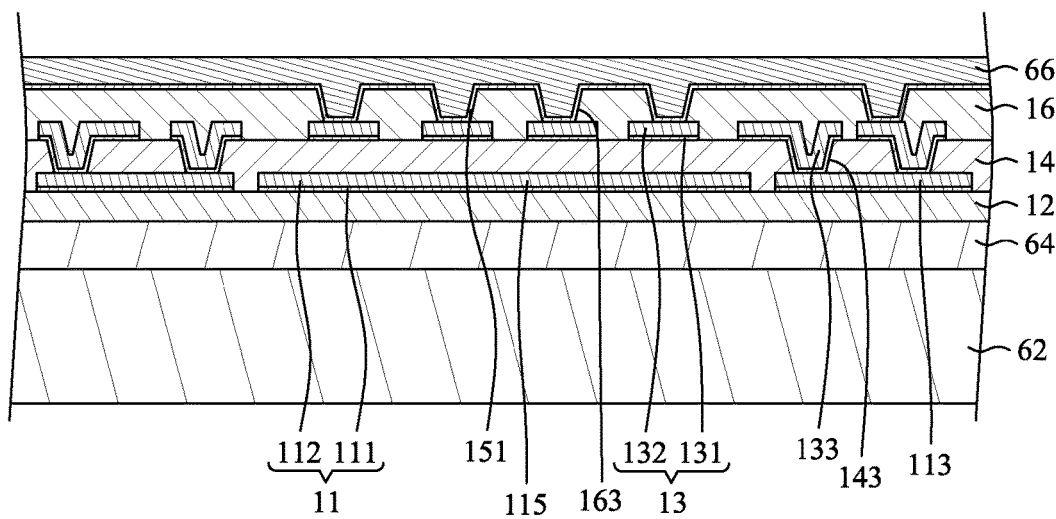
FIG. 24 illustrates one or more stages of some embodiments of a method for manufacturing a semiconductor package structure according to an aspect of the present disclosure.

Referring to FIG. 24, a first photoresist layer 66 is formed to cover the seed layer 151 by, for example, coating.

Figure 25:
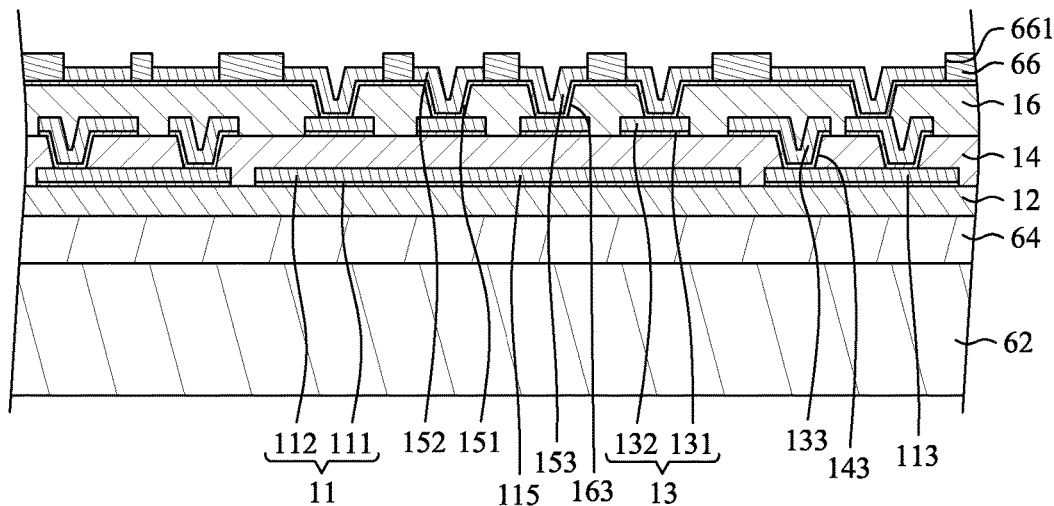
FIG. 25 illustrates one or more stages of some embodiments of a method for manufacturing a semiconductor package structure according to an aspect of the present disclosure.

Referring to FIG. 25, at least one through hole 661 is formed in the first photoresist layer 66 to expose at least a portion of the seed layer 151 by, for example, a lithography technique. Then, a conductive metal layer 152 is plated on the exposed portion of the seed layer 151 in the through hole 661.

Figure 26:
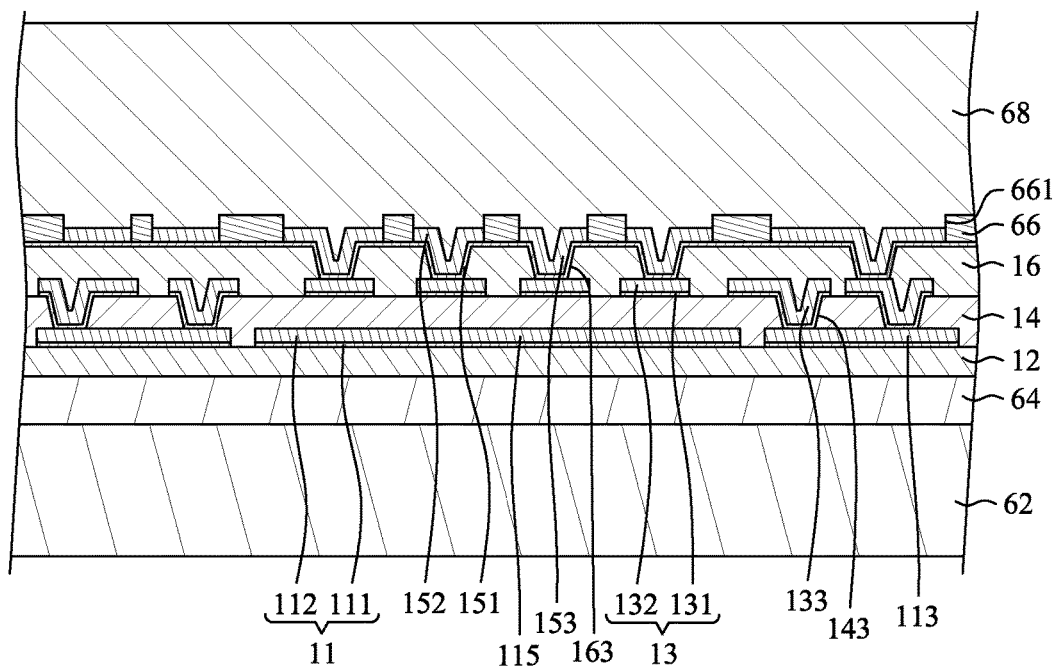
FIG. 26 illustrates one or more stages of some embodiments of a method for manufacturing a semiconductor package structure according to an aspect of the present disclosure.

Referring to FIG. 26, a second photoresist layer 68 is formed to cover the first photoresist layer 66 and the conductive metal layer 152 by, for example, coating.

Figure 27:
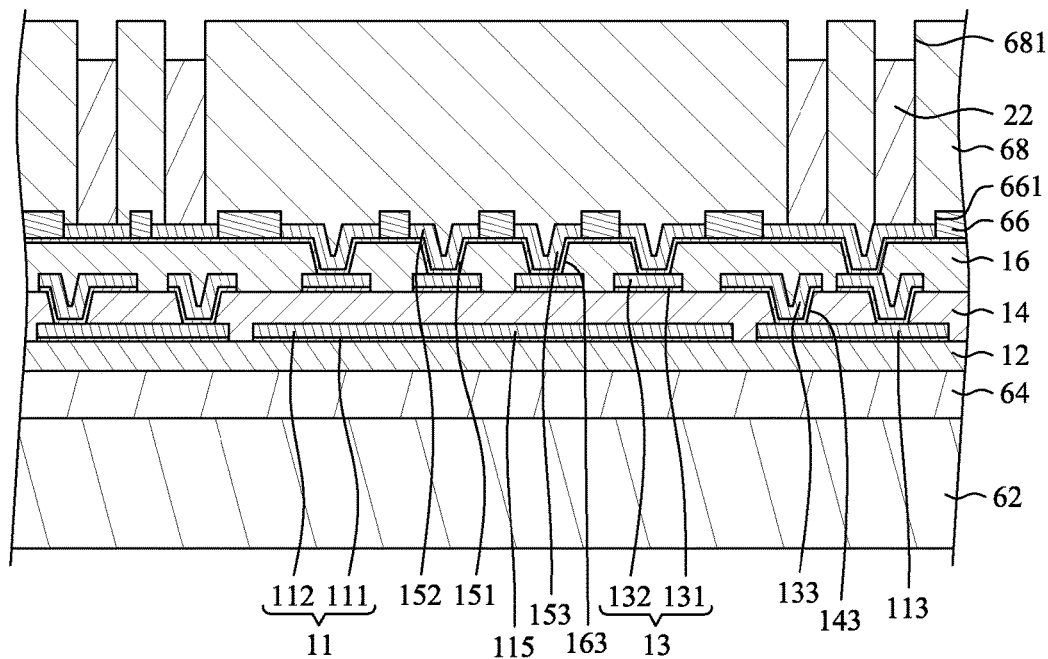
FIG. 27 illustrates one or more stages of some embodiments of a method for manufacturing a semiconductor package structure according to an aspect of the present disclosure.

Referring to FIG. 27, a plurality of through holes 681 are formed in the second photoresist layer 68 to expose portions of the conductive metal layer 152 by, for example, a lithography technique. Then, a conductive metal material (e.g., copper or another conductive metal, or an alloy thereof) is plated on the exposed portions of the conductive metal layer 152 in the through holes 681 to form a plurality of conductive elements 22 (e.g., conductive pillars). Thus, the conductive elements 22 are formed on the carrier 62.

Figure 28:
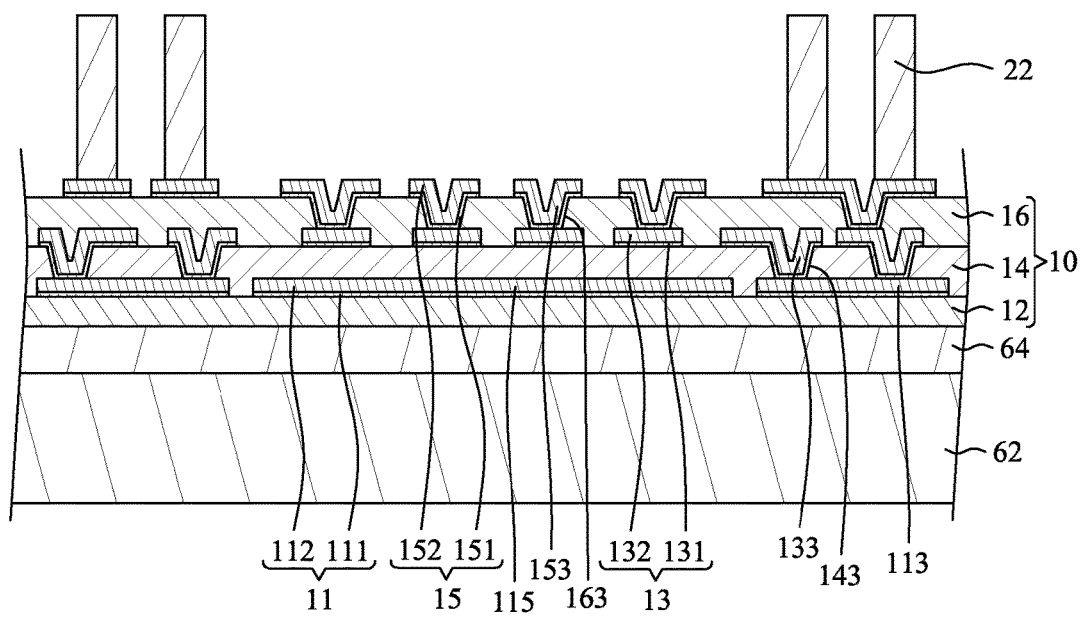
FIG. 28 illustrates one or more stages of some embodiments of a method for manufacturing a semiconductor package structure according to an aspect of the present disclosure.

Referring to FIG. 28, the first photoresist layer 66 and the second photoresist layer 68 are removed by, for example, stripping. Then, portions of the seed layer 151 that are not covered by the conductive metal layer 152 are etched to form a third RDL 15. The third RDL 15 may include the seed layer 151 and the conductive metal layer 152 disposed in that order on the third passivation layer 16. In some embodiments, the third RDL 15 may include at least one conductive via 153 disposed in the through hole 163 of the third passivation layer 16. The conductive via 153 contacts a portion of the upper surface of the second RDL 13 so that the third RDL 15 is electrically connected to the second RDL 13. The third RDL 15 and the conductive via 153 may be formed concurrently or integrally (e.g. as a monolithic structure). A line width/line space (L/S) of the third RDL 15 may be less than about 7 μm/about 7 μm, less than about 5 μm/about 5 μm, or less than about 2 μm/about 2 μm. In the embodiment illustrated in FIG. 28, the third RDL 15 may be a second wiring layer or a bottom wiring layer. Meanwhile, a base material 10 is formed. The base material 10 may include the first passivation layer 12, the first RDL 11, the second passivation layer 14, the second RDL 13, the third passivation layer 16 and the third RDL 15 (e.g., the second wiring layer or the bottom wiring layer). The conductive elements 22 (e.g., conductive pillars) are disposed on the third RDL 15 of the base material 10.

Figure 29:
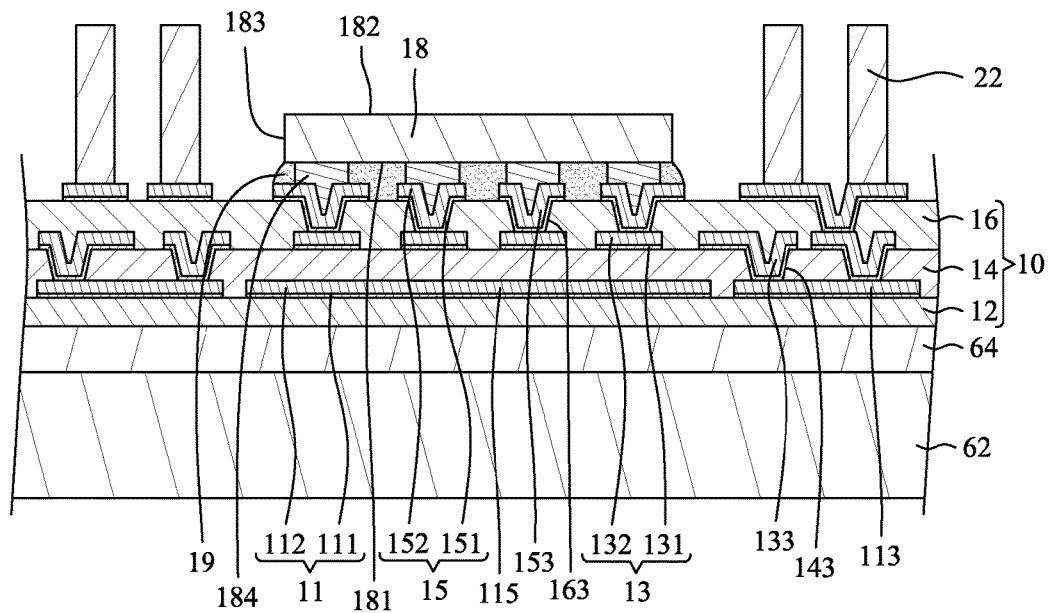
FIG. 29 illustrates one or more stages of some embodiments of a method for manufacturing a semiconductor package structure according to an aspect of the present disclosure.
Figure 30:
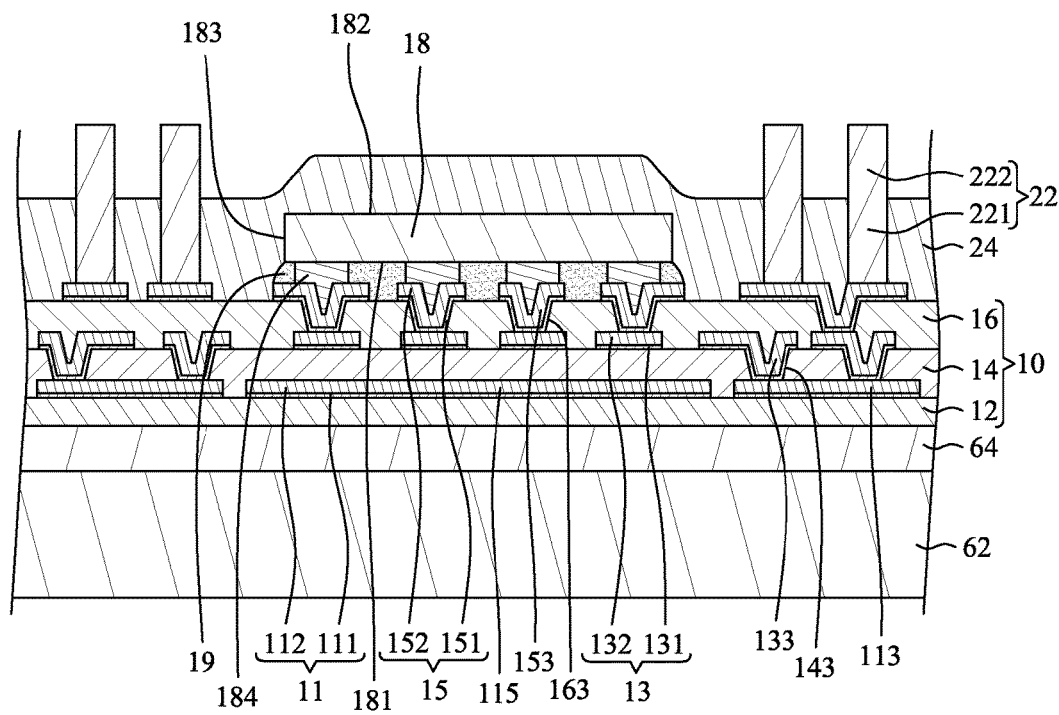
FIG. 30 illustrates one or more stages of some embodiments of a method for manufacturing a semiconductor package structure according to an aspect of the present disclosure.

Referring to FIG. 29 and FIG. 30, a first semiconductor die 18 and a first encapsulant 24 are disposed on the carrier 62. The conductive elements 22 surround the first semiconductor die 18, and the first encapsulant 24 surrounds the first semiconductor die 18 and a first portion 221 of the conductive element 22. Referring to FIG. 29, the first semiconductor die 18 is disposed on the carrier 62 firstly, and the conductive elements 22 surround the first semiconductor die 18. As shown in FIG. 29, the first semiconductor die 18 is electrically connected to the third RDL 15 of the base material 10. The first semiconductor die 18 has a first surface 181 (e.g., an active surface), a second surface 182 (e.g., a back side surface) and a lateral surface 183. The second surface 182 is opposite to the first surface 181, and the lateral surface 183 extends between the first surface 181 and the second surface 182. The first semiconductor die 18 may include a plurality of conductive bumps 184 disposed adjacent to the first surface 181. The conductive bumps 184 contact portions of the third RDL 15 so that the first semiconductor die 18 is electrically connected to the third RDL 15 through the conductive bumps 184. That is, the first semiconductor die 18 is attached to the third RDL 15 by flip chip bonding. An underfill 19 is further included in a space between the first surface 181 of the first semiconductor die 18 and the third RDL 15 to cover and protect the conductive bumps 184.

Referring to FIG. 30, the first encapsulant 24 is formed or disposed on the base material 10 on the carrier 62 to cover the third RDL 15, the third passivation layer 16, the underfill 19 and the first semiconductor die 18. The first encapsulant 24 surrounds and contacts the first portion 221 of the conductive element 22. Meanwhile, the second portion 222 of the conductive element 22 protrudes from the first encapsulant 24. The first encapsulant 24 may be formed from a first material. In some embodiments, the first material may be a non-photosensitive dry film type material and includes a first resin and a plurality of fillers dispersed in the first resin. In some embodiments, the first material is laminated to the base material 10 on the carrier 62.

Figure 31:
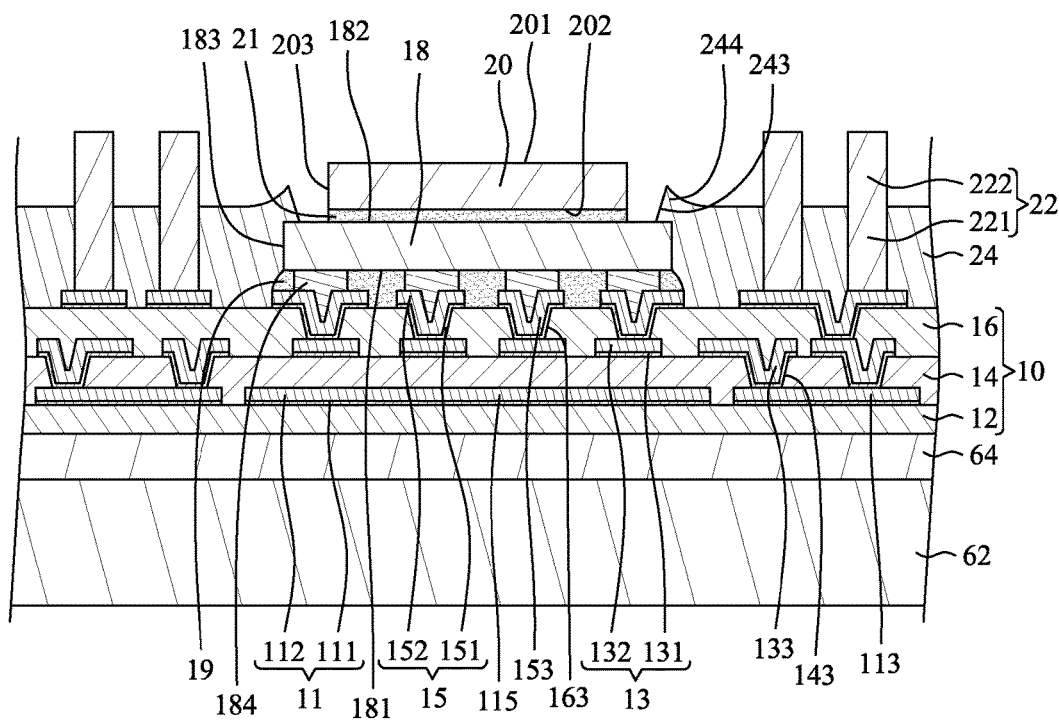
FIG. 31 illustrates one or more stages of some embodiments of a method for manufacturing a semiconductor package structure according to an aspect of the present disclosure.
Figure 32:
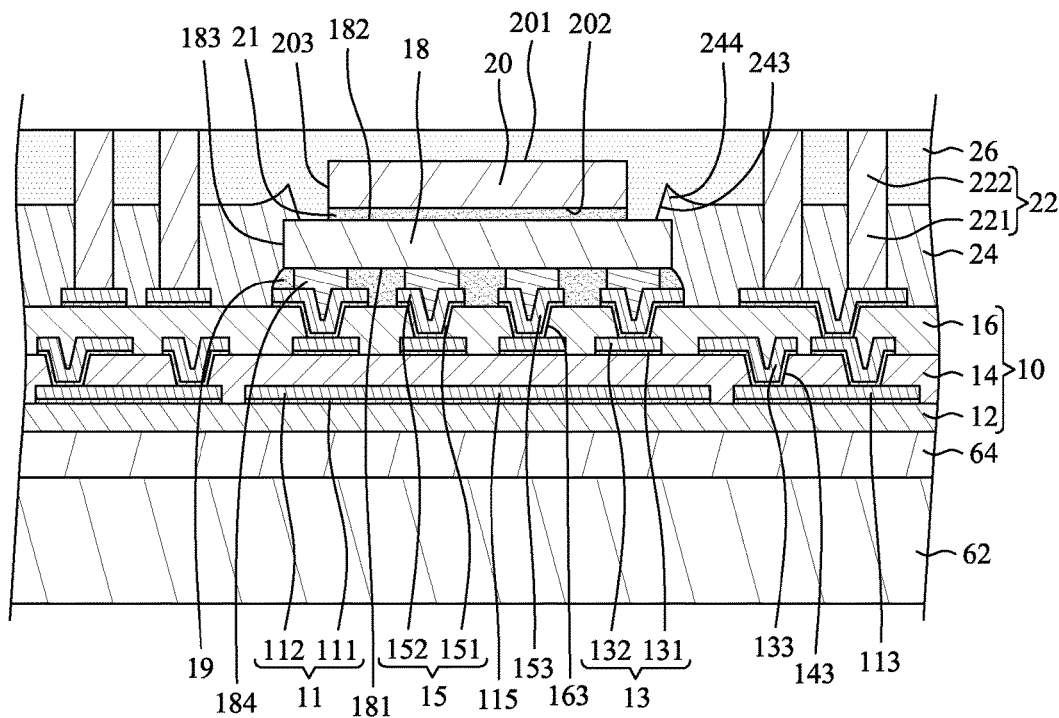
FIG. 32 illustrates one or more stages of some embodiments of a method for manufacturing a semiconductor package structure according to an aspect of the present disclosure.

Referring to FIG. 31 and FIG. 32, a second semiconductor die 20 and a second encapsulant 26 are disposed on the first semiconductor die 18. The second encapsulant 26 covers a top portion of the first semiconductor die 18 and surrounds a second portion 222 of the conductive element 22. Referring to FIG. 31, a cavity 243 is formed in the first encapsulant 24 by, for example, laser drilling to expose the first semiconductor die 18. In some embodiments, a top portion of the first semiconductor die 18 is partially exposed from the cavity 243. That is, the first encapsulant 24 may cover and contact the periphery of the top portion (e.g., the second surface 182), the lateral surface 183 and a portion of the second surface 182 of the first semiconductor die 18. Alternatively, in other embodiments, the cavity 243 may be wider so that the first encapsulant 24 may cover and contact a portion of the lateral surface 183 of the first semiconductor die 18, and may not cover the second surface 182 of the first semiconductor die 18. Thus, the cavity 243 may expose the second surface 182 of the first semiconductor die 18. As shown in FIG. 31, the first encapsulant 24 further includes an inner protrusion 244 that protrudes from an upper surface of the first encapsulant 24 and is higher than the average level of the upper surface of the first encapsulant 24 (e.g. by a factor of about 1.1 or more, of about 1.2 or more, or of about 1.3 or more), and is disposed adjacent to the cavity 243. That is, a portion of the cavity 243 is defined by the inner protrusion 244.

Then, a second semiconductor die 20 is disposed in the cavity 243. That is, the second semiconductor die 20 is disposed on the portion of the second surface 182 of the first semiconductor die 18 that is exposed from the cavity 243. Thus, the conductive elements 22 surround the first semiconductor die 18 and the second semiconductor die 20. The second semiconductor die 20 has a first surface 201 (e.g., an active surface), a second surface (e.g., a back side surface) 202 and a lateral surface 203. The second surface 202 is opposite to the first surface 201, and the lateral surface 203 extends between the first surface 201 and the second surface 202. The second surface 202 of the second semiconductor die 20 is adhered to the second surface 182 of the first semiconductor die 18 through an adhesion layer 21.

Referring to FIG. 32, a second encapsulant 26 is formed or disposed on the first encapsulant 24 by, for example, coating to cover a portion of a top portion (e.g., the second surface 182) of the first semiconductor die 18 and surround the second portion 222 of the conductive element 22. The second encapsulant 26 may be formed from a second material that is different from the first material of the first encapsulant 24. In some embodiments, the second material may be a photosensitive liquid type material that includes a homogeneous second resin without fillers, and may be formed by coating. As shown in FIG. 32, the second encapsulant 26 may cover and contact the first encapsulant 24 and extend into the cavity 243 so that the second encapsulant 26 may surround the second semiconductor die 20. In some embodiments, the second encapsulant 26 may cover and contact the first surface 201 and the lateral surface 203 of the second semiconductor die 20. In addition, the second encapsulant 26 may cover and contact the second portion 222 of the conductive element 22, and the upper surface of the second encapsulant 26 may be substantially coplanar with the upper surfaces of the conductive elements 22. That is, the upper surfaces of the conductive elements 22 may be exposed from the upper surface of the second encapsulant 26, and a height of the conductive element 22 is substantially equal to a sum of a thickness of the first encapsulant 24 and a thickness of the second encapsulant 26, or is substantially equal to a sum of a thickness of the first encapsulant 24 and a thickness of the second encapsulant 26 minus a thickness of a portion of the conductive metal layer 152 on which the conductive element 22 is disposed.

Figure 33:
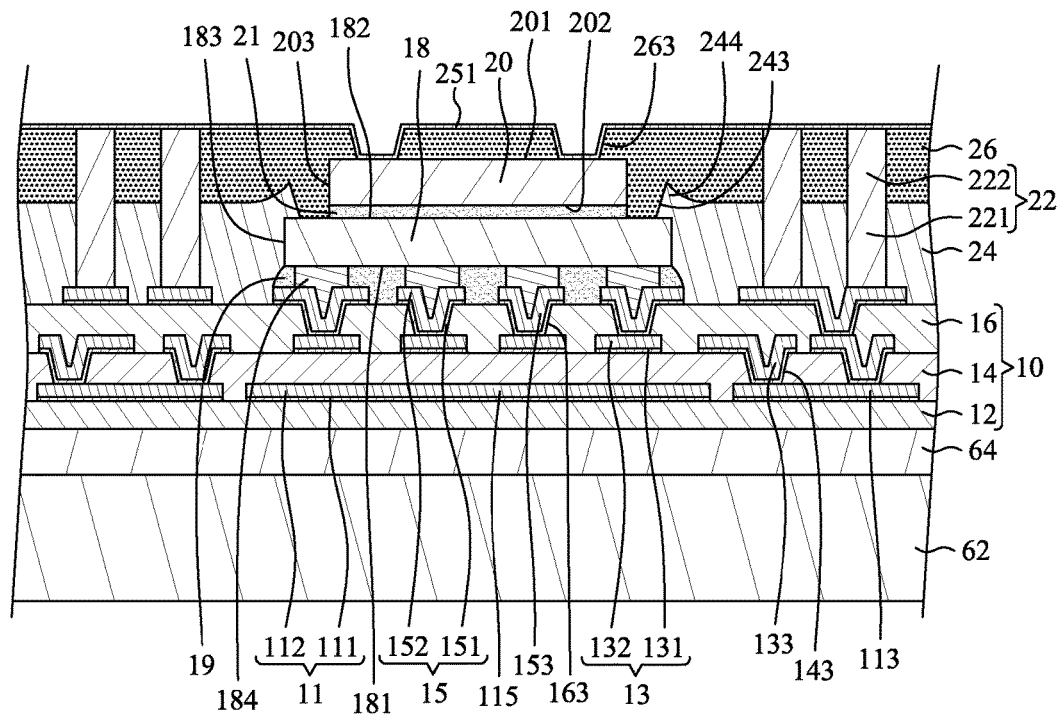
FIG. 33 illustrates one or more stages of some embodiments of a method for manufacturing a semiconductor package structure according to an aspect of the present disclosure.

Referring to FIG. 33, at least one through hole 263 is formed in the second encapsulant 26 so as to expose a portion of the first surface 201 of the second semiconductor die 20. Then, a seed layer 251 is formed or disposed on the second encapsulant 26 and in the through hole 263 by, for example, sputtering. As shown in FIG. 33, the seed layer 251 contacts the conductive elements 22.

Figure 34:
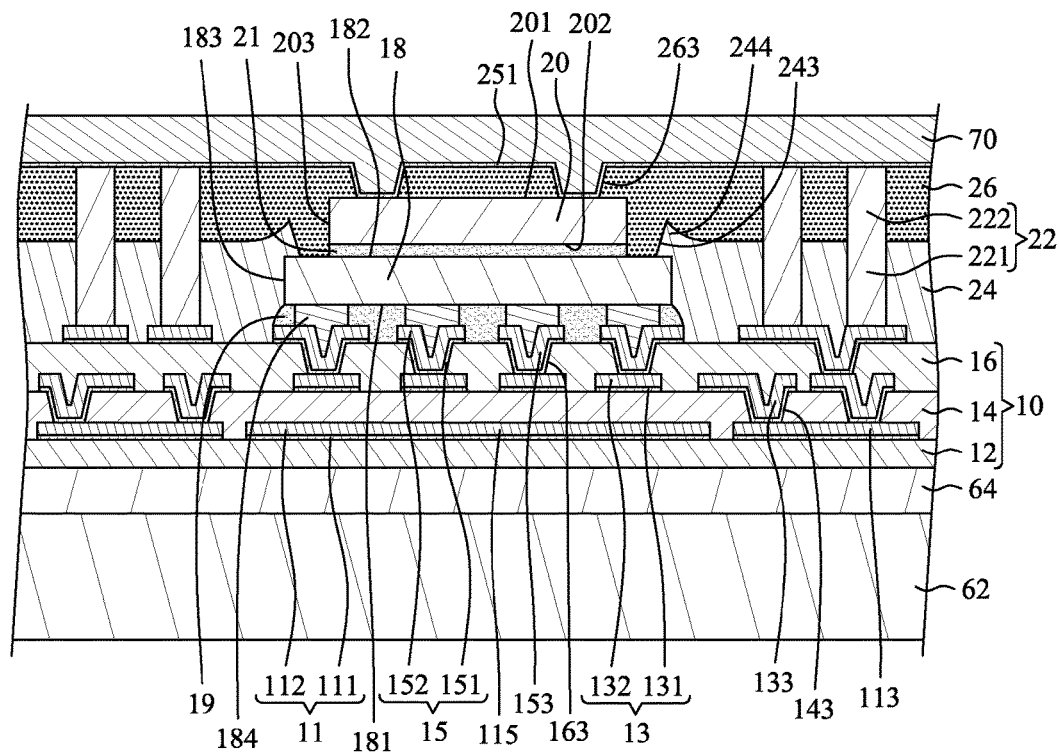
FIG. 34 illustrates one or more stages of some embodiments of a method for manufacturing a semiconductor package structure according to an aspect of the present disclosure.

Referring to FIG. 34, a third photoresist layer 70 is formed or disposed on the seed layer 251 by, for example, coating.

Figure 35:
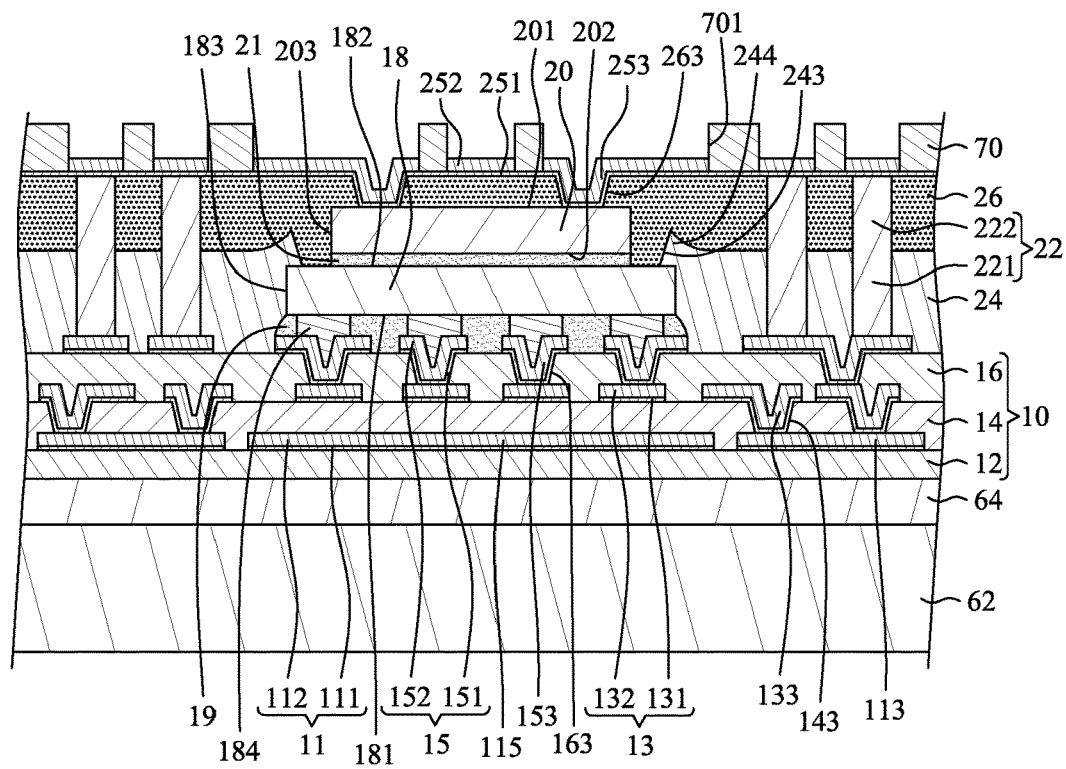
FIG. 35 illustrates one or more stages of some embodiments of a method for manufacturing a semiconductor package structure according to an aspect of the present disclosure.

Referring to FIG. 35, at least one through hole 701 is formed in the third photoresist layer 70 to expose at least a portion of the seed layer 251 by, for example, a lithography technique. Then, a conductive metal layer 252 is plated on the exposed portion of the seed layer 251 in the through hole 701.

Figure 36:
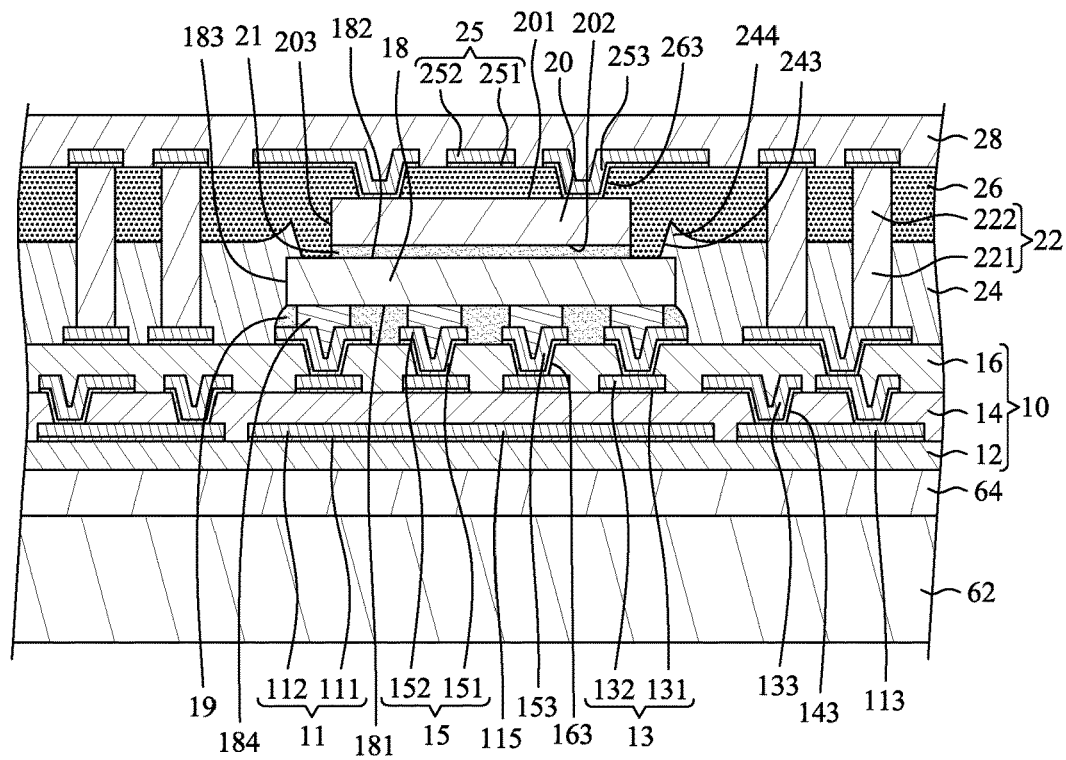
FIG. 36 illustrates one or more stages of some embodiments of a method for manufacturing a semiconductor package structure according to an aspect of the present disclosure.

Referring to FIG. 36, the third photoresist layer 70 is removed by, for example, stripping. Then, portions of the seed layer 251 that are not covered by the conductive metal layer 252 are etched to form a first wiring layer 25. The first wiring layer 25 electrically connects the second semiconductor die 20 and the conductive elements 22. The first wiring layer 25 is disposed on the second encapsulant 26 and in the through hole 263. For example, the first wiring layer 25 may include the seed layer 251 and the conductive metal layer 252 disposed in that order on the second encapsulant 26. In some embodiments, as shown in FIG. 1, the first wiring layer 25 may include at least one conductive via 253 disposed in the through hole 263 of the second encapsulant 26. The conductive via 253 contacts a portion of the first surface 201 of the second semiconductor die 20 so that the first wiring layer 25 is electrically connected to and contacts the second semiconductor die 20. The first wiring layer 25 and the conductive via 253 may be formed concurrently or integrally (e.g. as a monolithic structure). A line width/line space (L/S) of the first wiring layer 25 may be less than about 7 µm/about 7 µm, less than about 5 µm/about 5 µm, or less than about 2 µm/about 2 µm.

Then, a third encapsulant 28 is formed or disposed on the second encapsulant 26 to cover the first wiring layer 25. The third encapsulant 28 may include, or be formed from, a photoresist layer, a cured photosensitive material, a cured PID material such as an epoxy or a PI, or a combination of two or more thereof. In some embodiment, the third encapsulant 28 may include, or be formed from a photosensitive dry film type material, a non-photosensitive dry film type material, a photosensitive liquid type material, or a non-photosensitive liquid type material. The material of the third encapsulant 28 may be the same as the material of the first encapsulant 24. In some embodiments, the third encapsulant 28 may be a dry film type material. In some embodiments, the material of the third encapsulant 28 may include inorganic material (e.g., $SiO_x$, $SiN_x$, $TaO_x$), a glass, silicon, or a ceramic.

Figure 37:
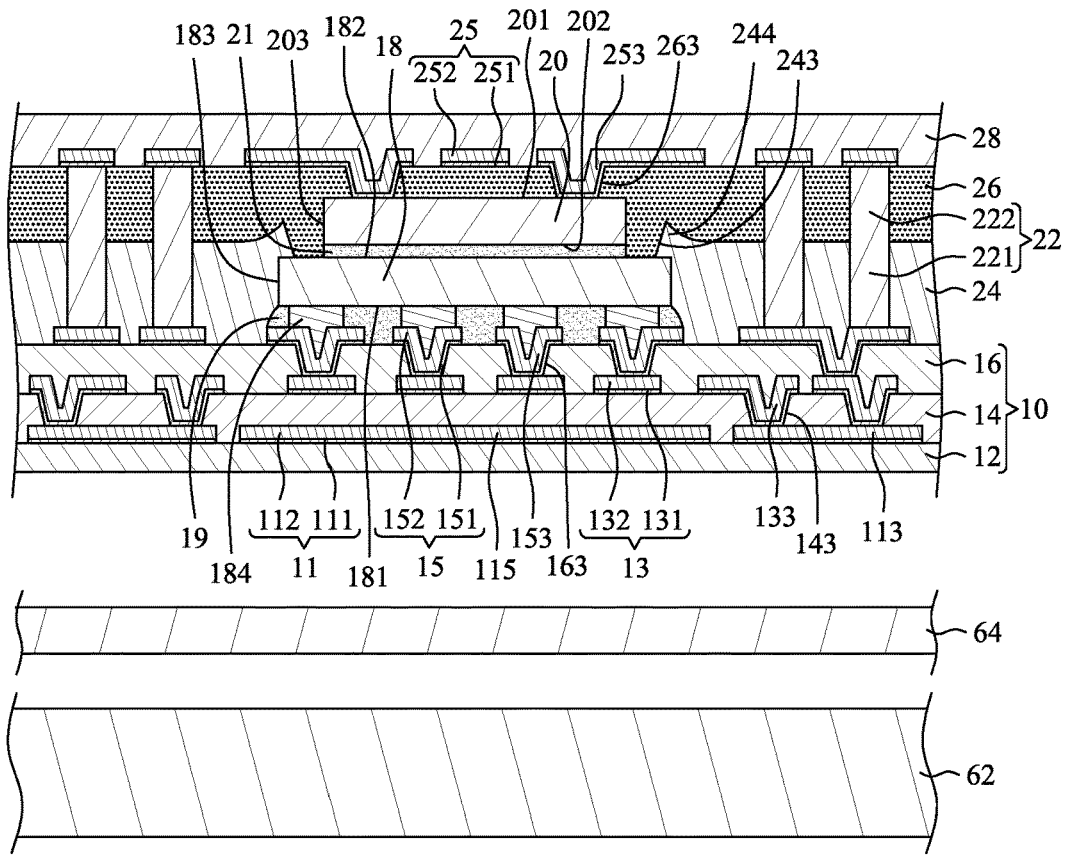
FIG. 37 illustrates one or more stages of some embodiments of a method for manufacturing a semiconductor package structure according to an aspect of the present disclosure.

Referring to FIG. 37, the carrier 62 and the release layer 64 are removed from the first passivation layer 12 of the base material 10.

Figure 38:
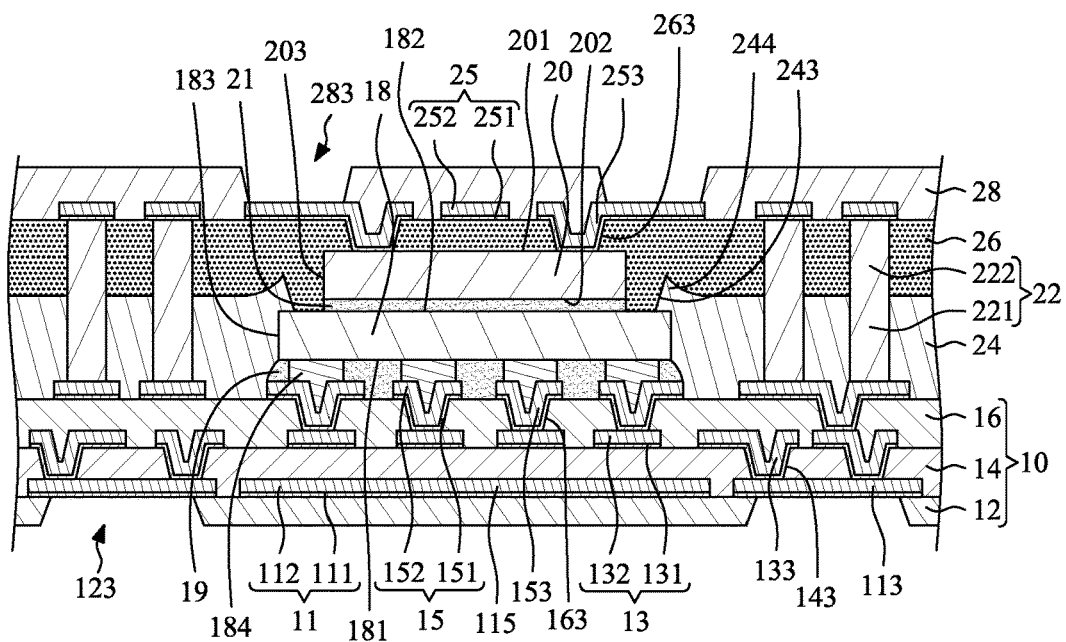
FIG. 38 illustrates one or more stages of some embodiments of a method for manufacturing a semiconductor package structure according to an aspect of the present disclosure.

Referring to FIG. 38, at least one opening 283 are formed in the third encapsulant 28 to expose a portion of an upper surface of the first wiring layer 25 by, for example, laser drilling. Meanwhile, at least one through hole 123 is formed in the first passivation layer 12 to expose a portion of a bottom surface of the first RDL 11 by, for example, laser drilling.

Figure 39:
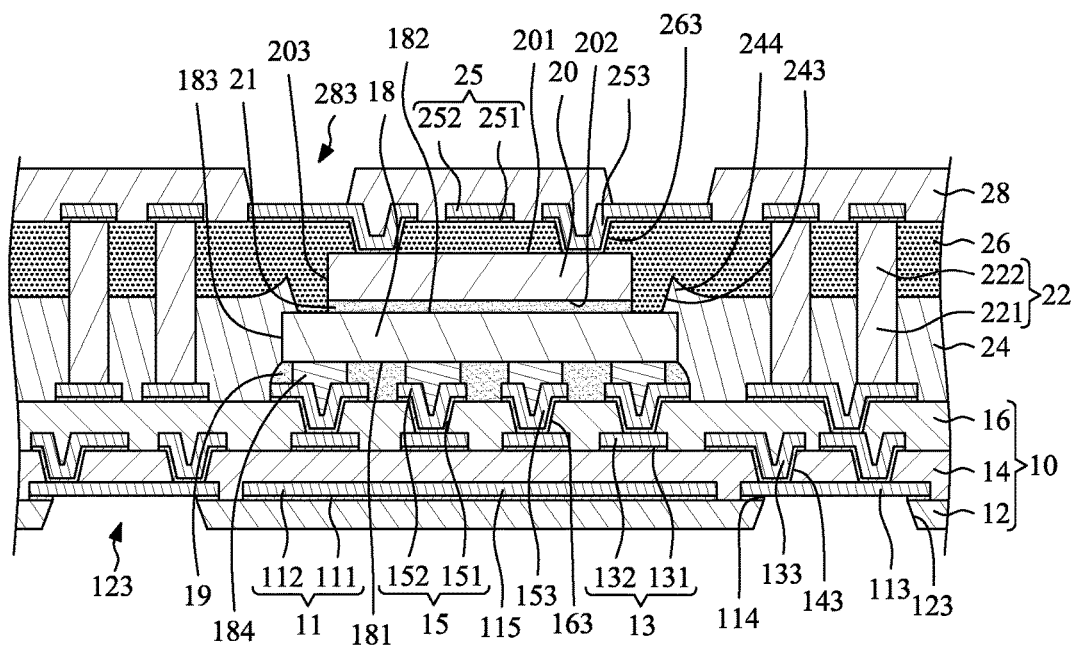
FIG. 39 illustrates one or more stages of some embodiments of a method for manufacturing a semiconductor package structure according to an aspect of the present disclosure.

Referring to FIG. 39, the portion of the seed layer 111 of the first RDL 11 exposed from the through hole 123 of the first passivation layer 12 is removed by, for example, etching. Therefore, a through hole 114 is formed in the seed layer 111 to expose a portion of a lower surface of a soldering pad 113 of the first RDL 11 for external connection. That is, the size and position of the through hole 114 of the seed layer 111 correspond to the size and position of the through hole 123 of the first passivation layer 12. In other words, the exposed portion of the soldering pad 113 includes a portion of the conductive metal layer 112.

Then, a plurality of external connectors 30 are respectively formed or disposed in a respective one of the opening 283 of the third encapsulant 28 and on the exposed portion of the first wiring layer 25. Then, a singulation process is conducted to form a plurality of semiconductor package structures 1 as shown in FIG. 1. In the embodiments illustrated in the FIG. 22 through FIG. 39, a grinding operation can be omitted, which may reduce the cost of the manufacturing process of the semiconductor package structure 1.

Figure 40:
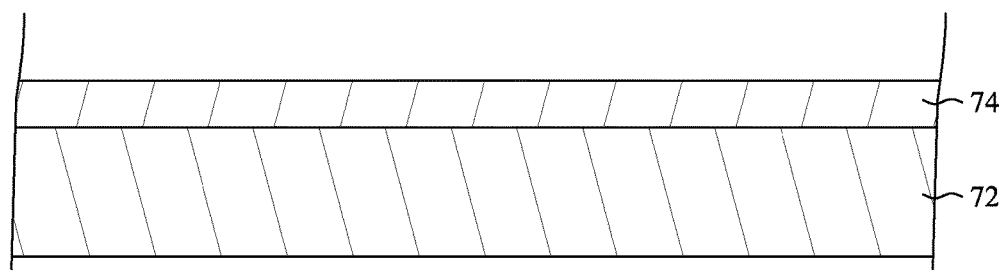
FIG. 40 illustrates one or more stages of some embodiments of a method for manufacturing a semiconductor package structure according to an aspect of the present disclosure.

FIG. 40 through FIG. 57 illustrate various stages of some embodiments of a method for manufacturing a semiconductor package structure according to an aspect of the present disclosure. In some embodiments, the method is for manufacturing a semiconductor package structure such as the semiconductor package structure 1j shown in FIG. 12. Referring to FIG. 40, a carrier 72 with a release layer 74 is provided. The carrier 72 may be, for example, a metal material, a ceramic material, a glass material, a substrate or a semiconductor wafer. The shape of the carrier 72 may be, for example, rectangular or square. Alternatively, the shape of the carrier 72 may be, for example, circular or elliptical.

Figure 41:
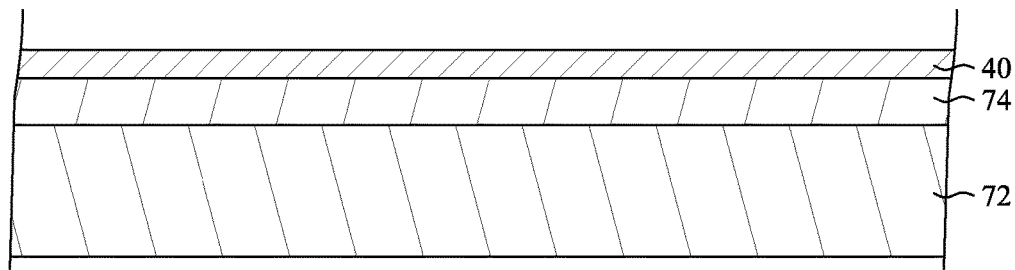
FIG. 41 illustrates one or more stages of some embodiments of a method for manufacturing a semiconductor package structure according to an aspect of the present disclosure.

Referring to FIG. 41, a passivation layer 40 is formed or disposed on the release layer 74. The passivation layer 40 may include, or be formed from, a photoresist layer, a cured photosensitive material, a cured PID material such as a PA, a PI, an epoxy or PBO, or a combination of two or more thereof. As stated above, in some embodiments, the passivation layer 40 may be a dry film material. In some embodiments, the material of the first passivation layer 40 may include inorganic material (e.g., $SiO_x$, $SiN_x$, $TaO_x$), a glass, silicon, or a ceramic.

Figure 42:
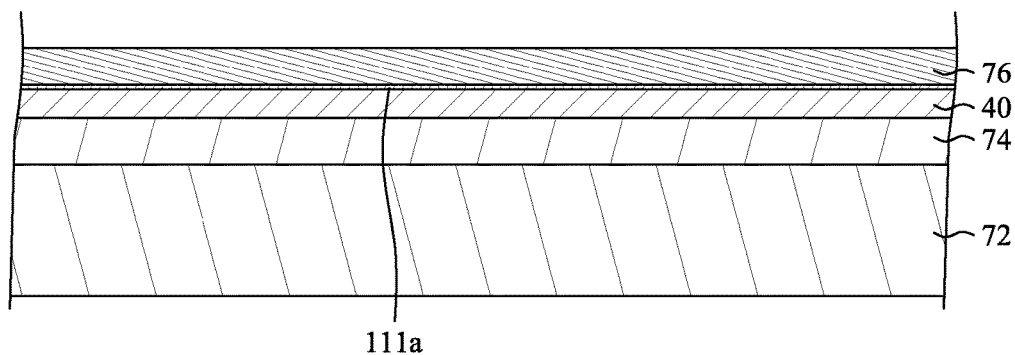
FIG. 42 illustrates one or more stages of some embodiments of a method for manufacturing a semiconductor package structure according to an aspect of the present disclosure.

Referring to FIG. 42, a seed layer 111a is formed on the passivation layer 40. The seed layer 111a may include, for example, titanium and/or copper, another metal, or an alloy, and may be formed or disposed by sputtering. Then, a first photoresist layer 76 is formed to cover the seed layer 111a by, for example, coating.

Figure 43:
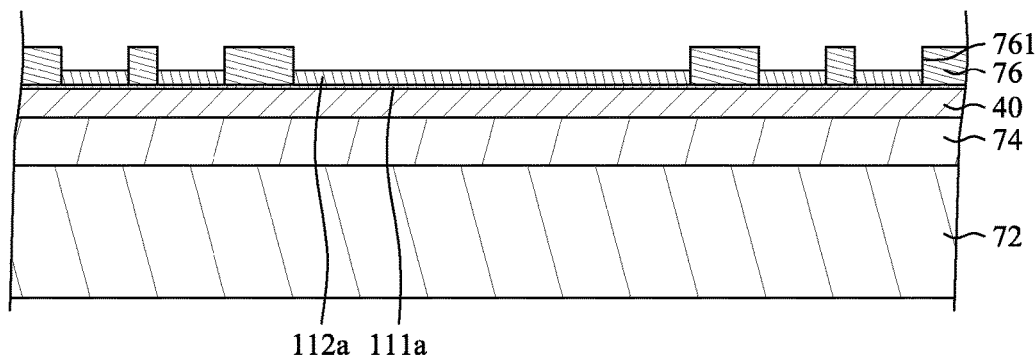
FIG. 43 illustrates one or more stages of some embodiments of a method for manufacturing a semiconductor package structure according to an aspect of the present disclosure.

Referring to FIG. 43, at least one through hole 761 is formed in the first photoresist layer 76 to expose at least a portion of the seed layer 111a by, for example, a lithography technique. Then, a conductive metal layer 112a is plated on the exposed portion of the seed layer 112a in the through hole 761.

Figure 44:
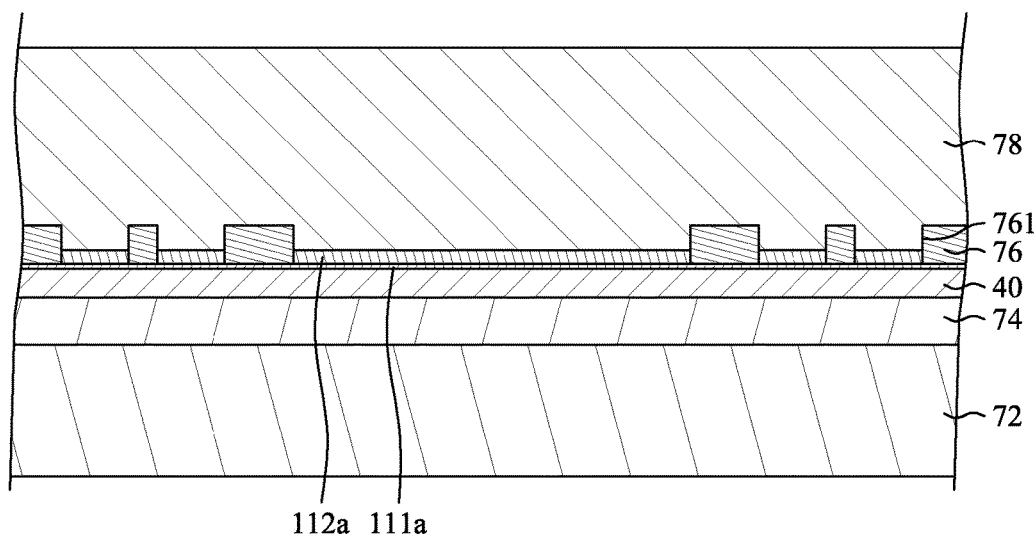
FIG. 44 illustrates one or more stages of some embodiments of a method for manufacturing a semiconductor package structure according to an aspect of the present disclosure.

Referring to FIG. 44, a second photoresist layer 78 is formed to cover the first photoresist layer 76 and the conductive metal layer 112a by, for example, coating.

Figure 45:
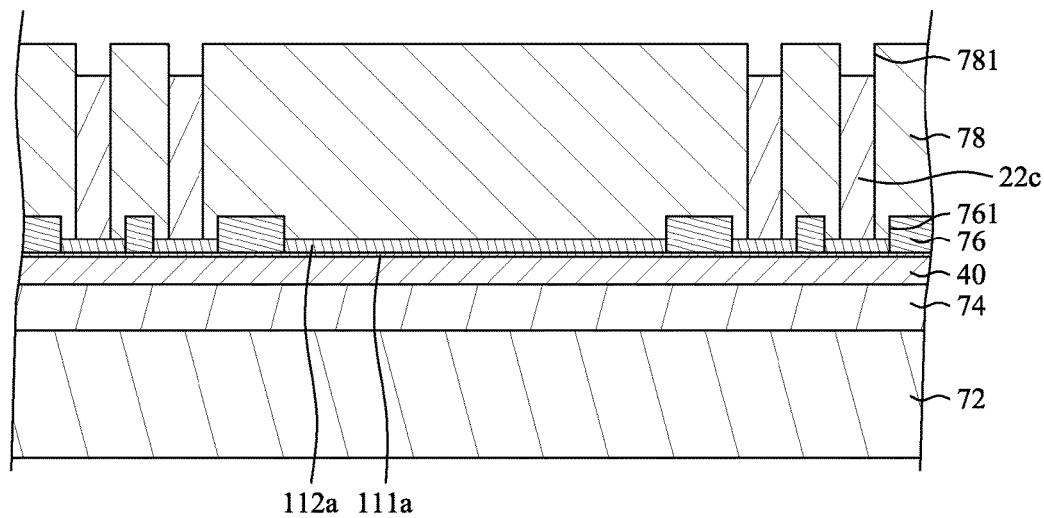
FIG. 45 illustrates one or more stages of some embodiments of a method for manufacturing a semiconductor package structure according to an aspect of the present disclosure.

Referring to FIG. 45, a plurality of through holes 781 are formed in the second photoresist layer 78 to expose portions of the conductive metal layer 112a by, for example, a lithography technique. Then, a conductive metal material (e.g., copper or another conductive metal, or an alloy thereof) is plated on the exposed portions of the conductive metal layer 112a in the through holes 781 to form a plurality of conductive elements 22c (e.g., conductive pillars). Thus, the conductive elements 22c are formed on the carrier 72.

Figure 46:
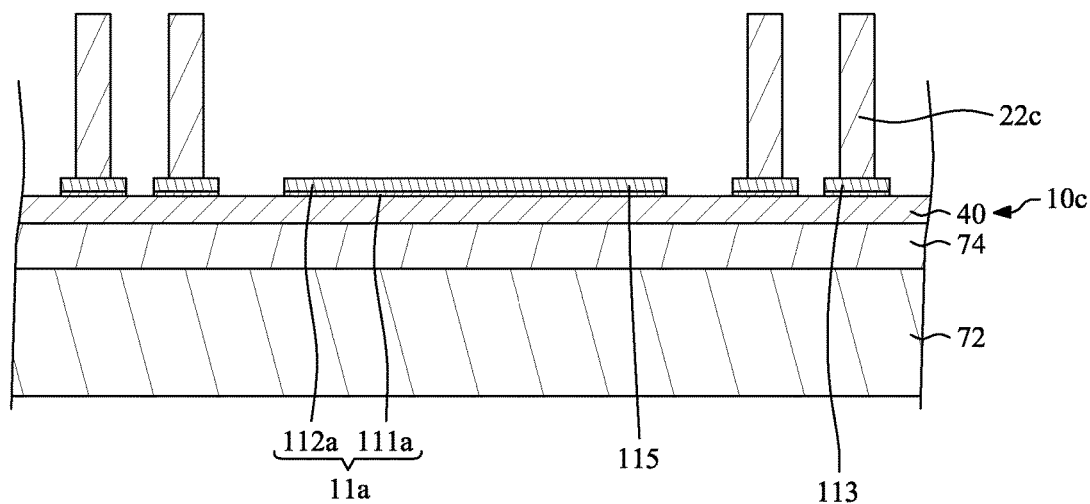
FIG. 46 illustrates one or more stages of some embodiments of a method for manufacturing a semiconductor package structure according to an aspect of the present disclosure.

Referring to FIG. 46, the first photoresist layer 76 and the second photoresist layer 78 are removed by, for example, stripping. Then, portions of the seed layer 111a that are not covered by the conductive metal layer 112a are etched to form an RDL 11a. The RDL 11a may include the seed layer 111a and the conductive metal layer 112a disposed in that order on the passivation layer 40. In the embodiment illustrated in FIG. 46, the RDL 11a may be a second wiring layer or a bottom wiring layer. In some embodiments, as shown in FIG. 46, the RDL 11a may include at least one soldering pad 113 and a support portion 115. Meanwhile, a base material 10c is formed. The base material 10c may include the passivation layer 40 and the RDL 11a (e.g., the second wiring layer or the bottom wiring layer). The conductive elements 22c (e.g., conductive pillars) are disposed on the RDL 11a of the base material 10c.

Figure 47:
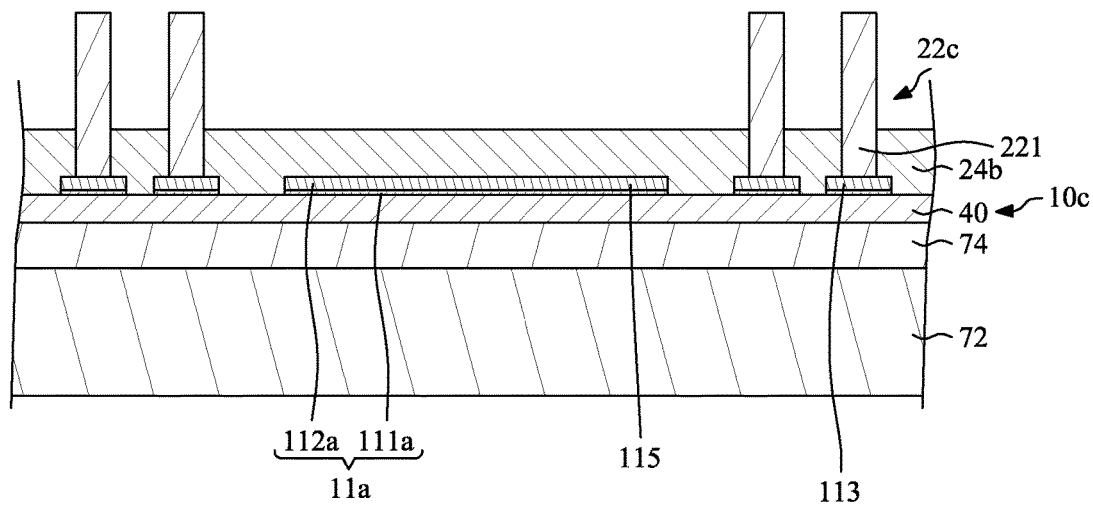
FIG. 47 illustrates one or more stages of some embodiments of a method for manufacturing a semiconductor package structure according to an aspect of the present disclosure.
Figure 48:
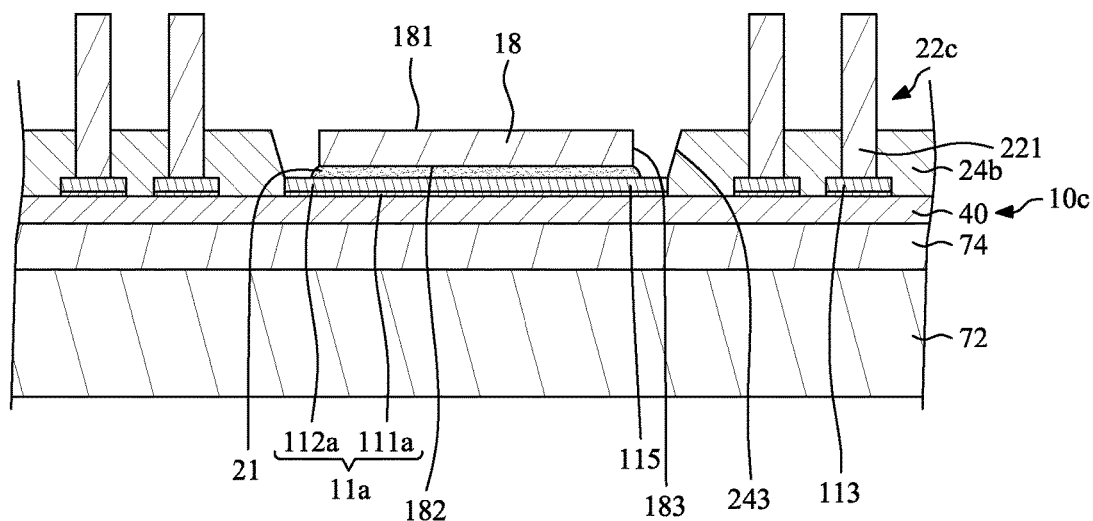
FIG. 48 illustrates one or more stages of some embodiments of a method for manufacturing a semiconductor package structure according to an aspect of the present disclosure.

Referring to FIG. 47 and FIG. 48, a first semiconductor die 18 and a first encapsulant 24b are disposed on the carrier 72. The conductive elements 22c surround the first semiconductor die 18, and the first encapsulant 24b surrounds the first semiconductor die 18 and a first portion 221 of the conductive element 22c. Referring to FIG. 47, a first encapsulant 24b is formed or disposed on the passivation layer 40 of the base material 10c on the carrier 72 to cover the RDL 11a. The first encapsulant 24b surrounds and contacts the first portion 221 of the conductive element 22c. The first encapsulant 24b may be formed from a first material. In some embodiments, the first material may be a non-photosensitive dry film type material and includes a first resin and a plurality of fillers dispersed in the first resin. In some embodiments, the first material is laminated to the base material 10c on the carrier 72.

Referring to FIG. 48, a cavity 243 is formed in the first encapsulant 24b by, for example, laser drilling to expose a portion of the RDL 11a. Then, a first semiconductor die 18 is disposed on the exposed portion of the RDL 11a of the base material 10c on the carrier 72, and the conductive elements 22 surround the first semiconductor die 18. As shown in FIG. 48, the first semiconductor die 18 is disposed on the support portion 115 of the RDL 11a of the base material 10c. The first semiconductor die 18 has a first surface 181 (e.g., an active surface), a second surface 182 (e.g., a back side surface) and a lateral surface 183. The second surface 182 is opposite to the first surface 181, and the lateral surface 183 extends between the first surface 181 and the second surface 182. As shown in FIG. 48, the second surface 182 of the first semiconductor die 18 is adhered to the support portion 115 of the RDL 11a through an adhesion layer 21. The first surface 181 of the first semiconductor die 18 faces upward.

Figure 49:
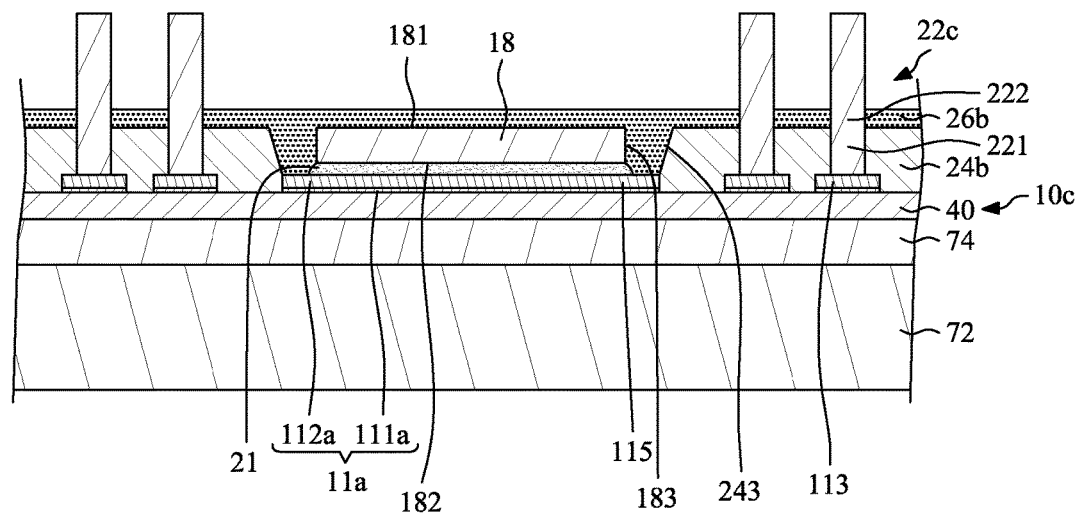
FIG. 49 illustrates one or more stages of some embodiments of a method for manufacturing a semiconductor package structure according to an aspect of the present disclosure.

Referring to FIG. 49 to FIG. 53, a second semiconductor die 20 and a second encapsulant 26b are disposed on the first semiconductor die 18. The second encapsulant 26b covers a top portion of the first semiconductor die 18 and surrounds a second portion 222 of the conductive element 22. Referring to FIG. 49, a second encapsulant 26b is formed or disposed on the first encapsulant 24b by, for example, coating to cover the first semiconductor die 18 and surround the second portion 222 of the conductive element 22c. The second encapsulant 26b may be formed from a second material that is different from the first material of the first encapsulant 24b. In some embodiments, the second material may be a photosensitive liquid type material that includes a homogeneous second resin without fillers, and may be formed by coating. As shown in FIG. 49, the second encapsulant 26b may cover and contact the first encapsulant 24b and extend into the cavity 243 so that the second encapsulant 26b may surround and contact the first semiconductor die 18. In some embodiments, the second encapsulant 26b may cover and contact the first surface 181 and the lateral surface 183 of the first semiconductor die 18. In addition, the second encapsulant 26b may cover and contact the second portion 222 of the conductive element 22c.

Figure 50:
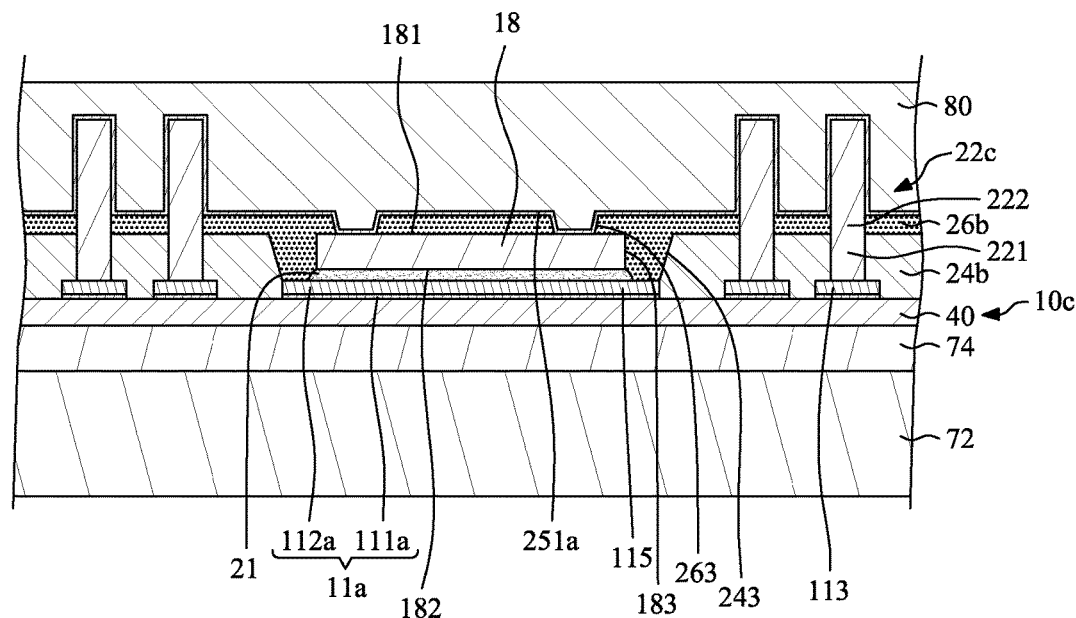
FIG. 50 illustrates one or more stages of some embodiments of a method for manufacturing a semiconductor package structure according to an aspect of the present disclosure.

Referring to FIG. 50, at least one through hole 263 is formed in the second encapsulant 26b so as to expose a portion of the first surface 181 of the first semiconductor die 18. Then, a seed layer 251a is formed or disposed on the second encapsulant 26b and in the through hole 263 by, for example, sputtering. As shown in FIG. 50, the seed layer 251a contacts and covers the upper portion of the conductive elements 22c. Then, a third photoresist layer 80 is formed or disposed on the seed layer 251a by, for example, coating.

Figure 51:
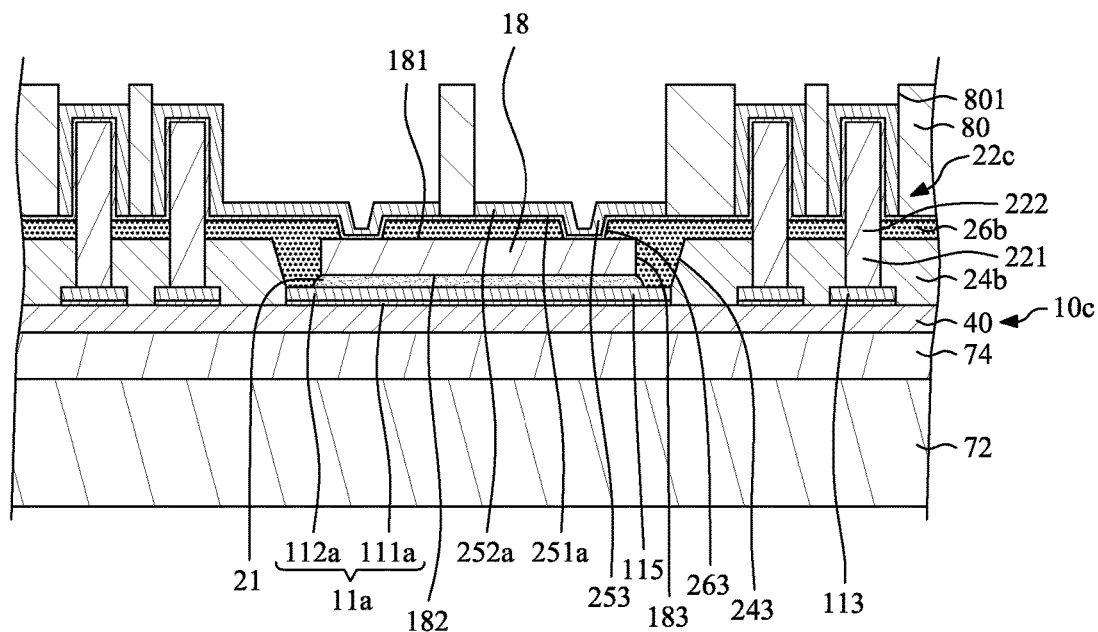
FIG. 51 illustrates one or more stages of some embodiments of a method for manufacturing a semiconductor package structure according to an aspect of the present disclosure.

Referring to FIG. 51, at least one through hole 801 is formed in the third photoresist layer 80 to expose at least a portion of the seed layer 251a by, for example, a lithography technique. Then, a conductive metal layer 252a is plated on the exposed portion of the seed layer 251a in the through hole 801.

Figure 52:
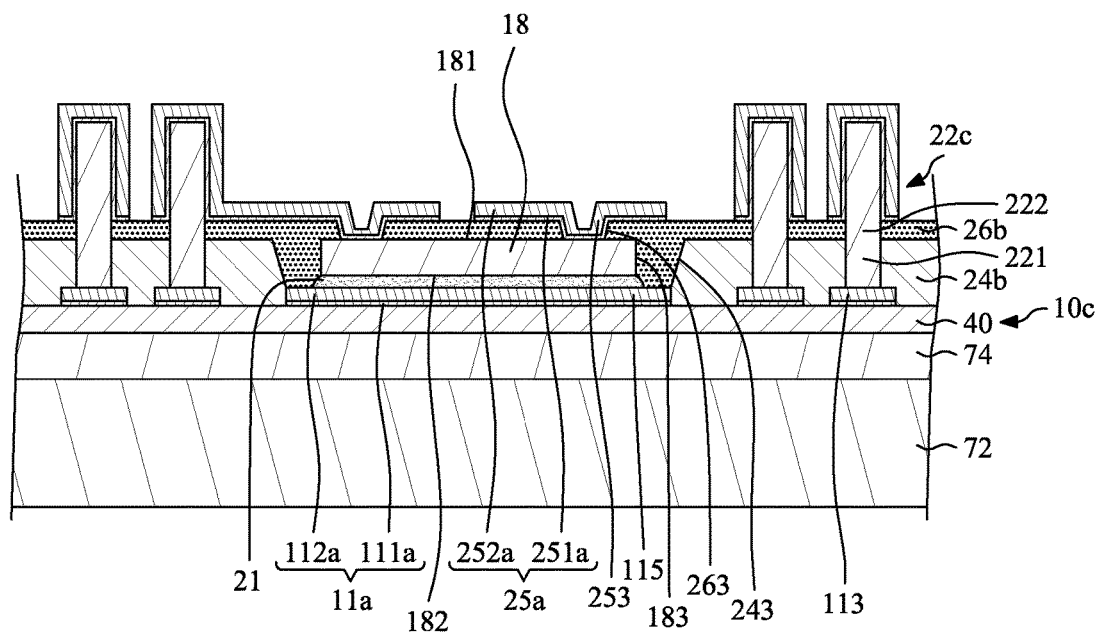
FIG. 52 illustrates one or more stages of some embodiments of a method for manufacturing a semiconductor package structure according to an aspect of the present disclosure.

Referring to FIG. 52, the third photoresist layer 80 is removed by, for example, stripping. Then, portions of the seed layer 251a that are not covered by the conductive metal layer 252a are etched to form a first wiring layer 25a. The first wiring layer 25a electrically connects the first semiconductor die 18 and the conductive elements 22c. The first wiring layer 25a is disposed on the second encapsulant 26b and in the through hole 263. For example, the first wiring layer 25a may include the seed layer 251a and the conductive metal layer 252a disposed in that order on the second encapsulant 26b. In some embodiments, as shown in FIG. 52, the first wiring layer 25a may include at least one conductive via 253 disposed in the through hole 263 of the second encapsulant 26b. The conductive via 253 contacts a portion of the first surface 181 of the first semiconductor die 18 so that the first wiring layer 25a is electrically connected to and contacts the first semiconductor die 18. The first wiring layer 25a and the conductive via 253 may be formed concurrently or integrally (e.g. as a monolithic structure). A line width/line space (L/S) of the first wiring layer 25a may be less than about 7 μm/about 7 μm, less than about 5 μm/about 5 μm, or less than about 2 μm/about 2 μm. In addition, a portion of the first wiring layer 25a may cover and contact an upper portion of the conductive element 22c so as to form a cap structure. Thus, the first wiring layer 25a is electrically connected to the conductive elements 22c.

Figure 53:
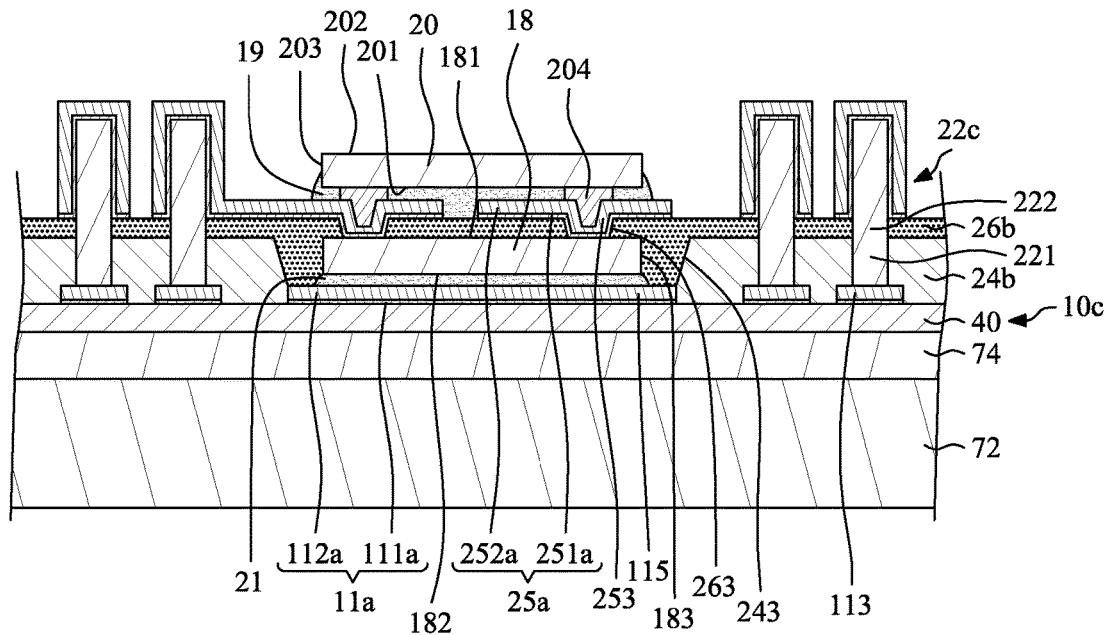
FIG. 53 illustrates one or more stages of some embodiments of a method for manufacturing a semiconductor package structure according to an aspect of the present disclosure.

Referring to FIG. 53, a second semiconductor die 20 is disposed on and electrically connected to the first wiring layer 25a, and is disposed above the second encapsulant 26b. Thus, the conductive elements 22c surround the first semiconductor die 18 and the second semiconductor die 20. The second semiconductor die 20 has a first surface 201 (e.g., an active surface), a second surface (e.g., a back side surface) 202 and a lateral surface 203. The second surface 202 is opposite to the first surface 201, and the lateral surface 203 extends between the first surface 201 and the second surface 202. The second semiconductor die 20 may include a plurality of conductive bumps 204 disposed adjacent to the first surface 201. The conductive bumps 204 contact portions of the first wiring layer 25a so that the second semiconductor die 20 is electrically connected to the first wiring layer 25a through the conductive bumps 204. That is, the second semiconductor die 20 is attached to the first wiring layer 25a by flip chip bonding, and the first surface 201 of the second semiconductor die 20 faces the first surface 181 the first semiconductor die 18. An underfill 19 is further formed or disposed in a space between the first surface 201 of the second semiconductor die 20 and the first wiring layer 25a to cover and protect the conductive bumps 204.

Figure 54:
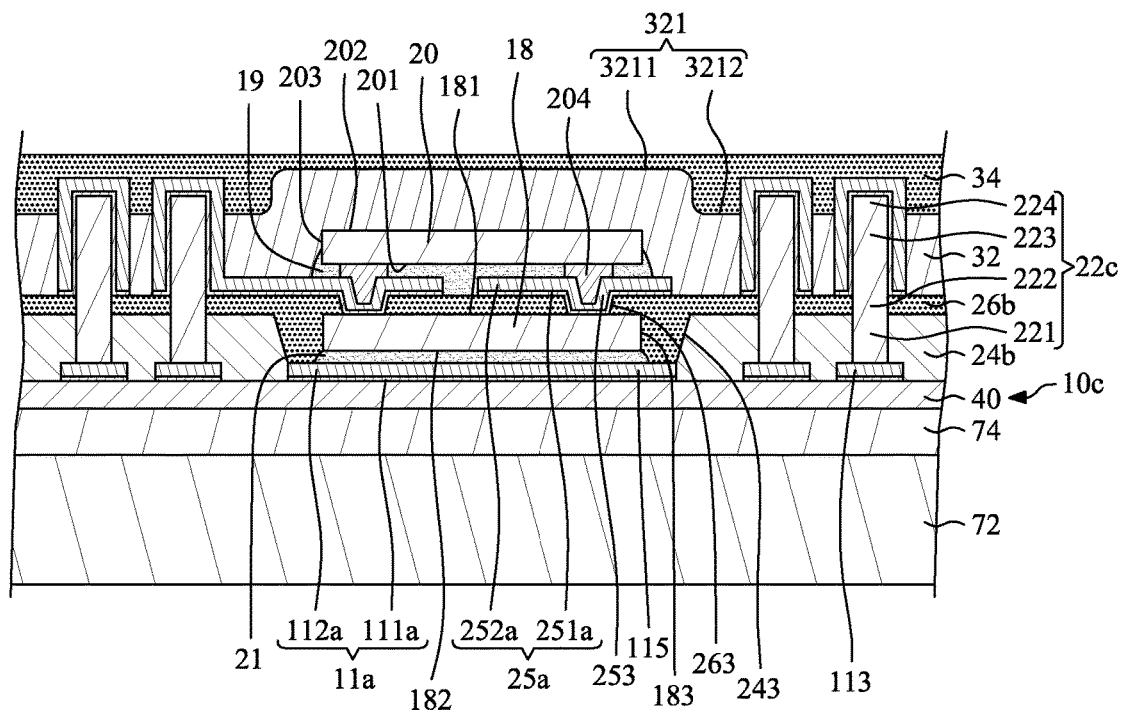
FIG. 54 illustrates one or more stages of some embodiments of a method for manufacturing a semiconductor package structure according to an aspect of the present disclosure.

Referring to FIG. 54, a third encapsulant 32 is disposed on the second encapsulant 26b to cover the second semiconductor die 20 and a portion of the first wiring layer 25a. The third encapsulant 32 may include, or be formed from, a photoresist layer, a cured photosensitive material, a cured PID material such as an epoxy or a PI, or a combination of two or more thereof. In some embodiment, the third encapsulant 32 may include, or be formed from a photosensitive dry film type material, a non-photosensitive dry film type material, a photosensitive liquid type material, or a non-photosensitive liquid type material. The material of the third encapsulant 32 may be the same as the material of the first encapsulant 24b. In some embodiments, the third encapsulant 32 may be a dry film type material. The third encapsulant 32 surrounds the third portion 223 of the conductive element 22c. In some embodiments, the third encapsulant 32 does not contact the third portion 223 of the conductive element 22c directly, and the third encapsulant 32 contacts the portion of the first wiring layer 25a that is disposed on the surface of the third portion 223 of the conductive element 22c. In addition, the third encapsulant 32 has a top surface 321 including a first portion 3211 and a second portion 3212. The first portion 3211 of the top surface 321 is above the second semiconductor die 20, and the second portion 3212 of the top surface 321 is not above the second semiconductor die 20. The first portion 3211 of the top surface 321 is higher than the second portion 3212 of the top surface 321 (e.g. by a factor of about 1.1 or more, of about 1.2 or more, or of about 1.3 or more) due to the dry film type material of the third encapsulant 32. As shown in FIG. 54, the second portion 3212 of the top surface 321 of the third encapsulant 32 is higher than the second surface 202 of the second semiconductor die 20 (e.g. by about 5 μm or more, by about 10 μm or more, or by about 15 μm or more). However, in other embodiment, the second portion 3212 of the top surface 321 of the third encapsulant 32 and the second surface 202 of the second semiconductor die 20 may be substantially at the same level.

Then, a fourth encapsulant 34 is formed or disposed on the top surface 321 of the third encapsulant 32 by, for example, coating. The fourth encapsulant 34 may include, or be formed from, a photoresist layer, a cured photosensitive material, a cured PID material such as an epoxy or a PI, or a combination of two or more thereof. In some embodiment, the fourth encapsulant 34 may include, or be formed from a photosensitive dry film type material, a non-photosensitive dry film type material, a photosensitive liquid type material, or a non-photosensitive liquid type material. In some embodiments, the material of the fourth encapsulant 34 may be the same as the material of the second encapsulant 26b. In some embodiments, the material of the fourth encapsulant 34 may include inorganic material (e.g., $SiO_x$, $SiN_x$, $TaO_x$), a glass, silicon, or a ceramic. The fourth encapsulant 34 surrounds the fourth portion 224 of the conductive element 22c. In some embodiments, the fourth encapsulant 34 does not contact the fourth portion 224 of the conductive element 22c directly, and the fourth encapsulant 34 contacts the portion of the first wiring layer 25a that is disposed on the surface of the fourth portion 224 of the conductive element 22c.

Figure 55:
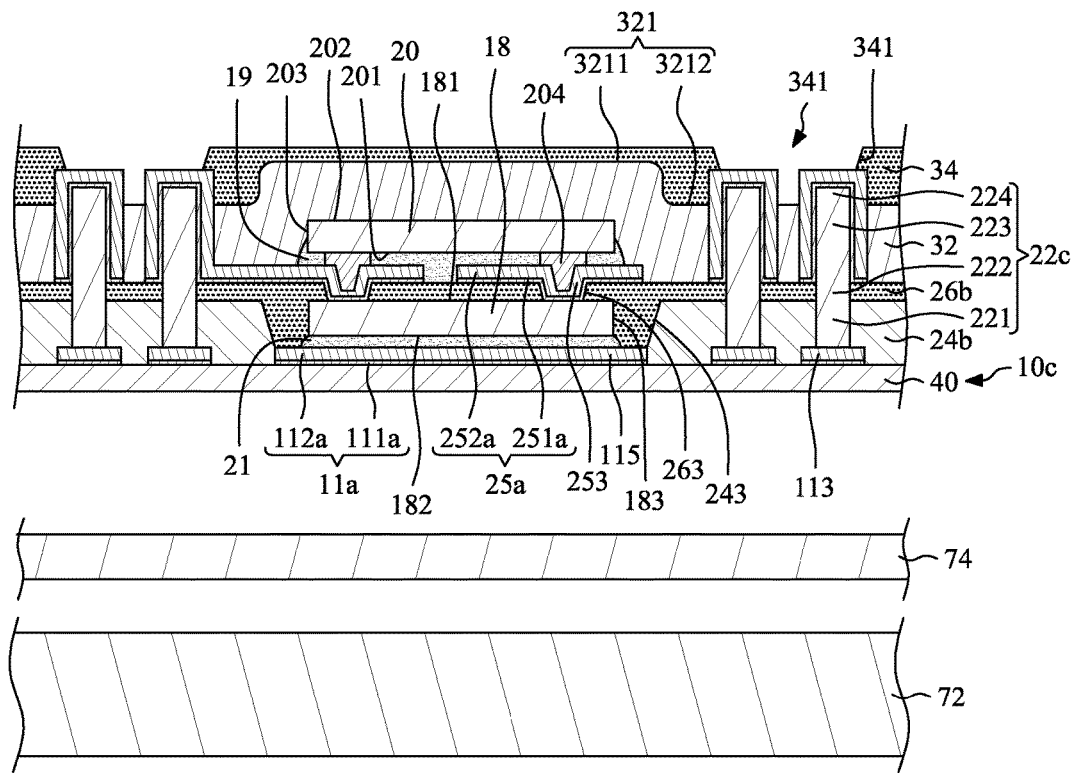
FIG. 55 illustrates one or more stages of some embodiments of a method for manufacturing a semiconductor package structure according to an aspect of the present disclosure.

Referring to FIG. 55, the carrier 72 and the release layer 74 are removed from the passivation layer 40 of the base material 10c. Then, at least one opening 341 is formed in the fourth encapsulant 34 by, for example, laser drilling. The position of the opening 341 corresponds to the position of the conductive elements 22c so that the opening 341 can expose a portion of the first wiring layer 25a disposed on the conductive element 22c.

Figure 56:
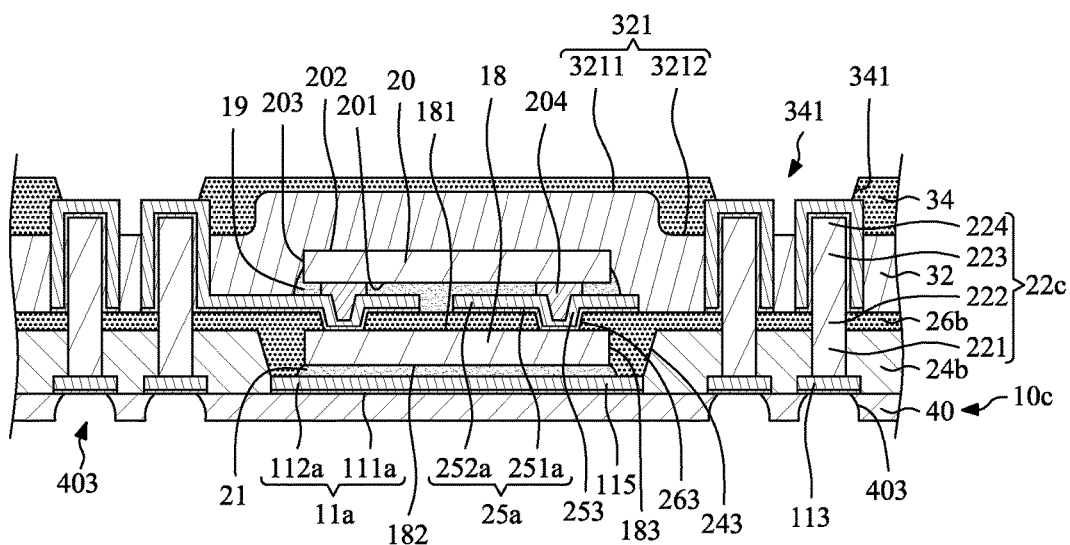
FIG. 56 illustrates one or more stages of some embodiments of a method for manufacturing a semiconductor package structure according to an aspect of the present disclosure.

Referring to FIG. 56, at least one through hole 403 is formed in the passivation layer 40 to expose a portion of a bottom surface of the RDL 11a by, for example, laser drilling.

Figure 57:
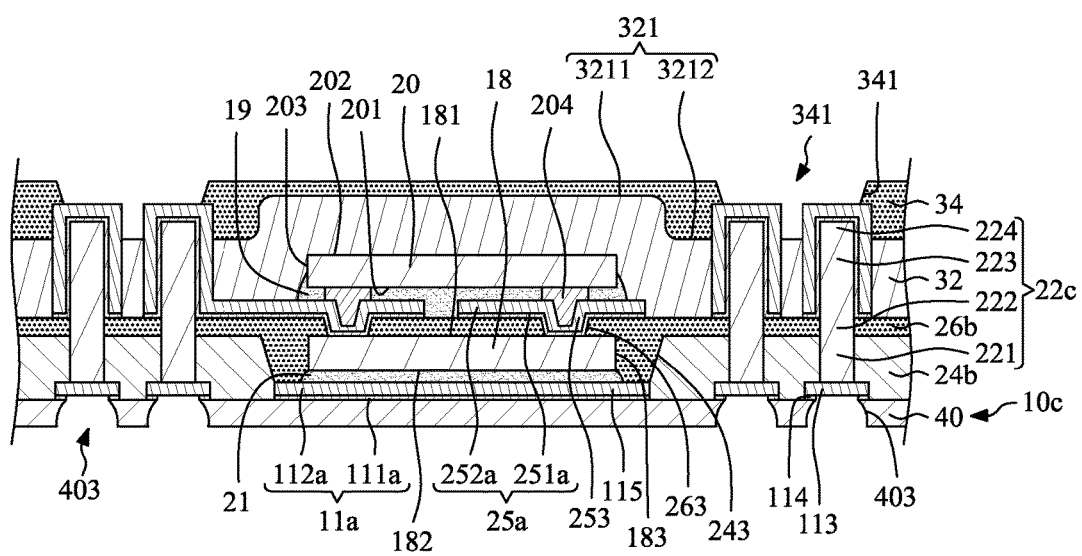
FIG. 57 illustrates one or more stages of some embodiments of a method for manufacturing a semiconductor package structure according to an aspect of the present disclosure.

Referring to FIG. 57, the portion of the seed layer 111a of the RDL 11a exposed from the through hole 403 of the passivation layer 40 is removed by, for example, etching. Therefore, a through hole 114 is formed in the seed layer 111a to expose a portion of a lower surface of a soldering pad 113 of the RDL 11a for external connection. That is, the size and position of the through hole 114 of the seed layer 111a correspond to the size and position of the through hole 403 of the passivation layer 40. In other words, the exposed portion of the soldering pad 113 includes a portion of the conductive metal layer 112a.

Then, at least one terminal 36 is formed or disposed in a respective one of the opening 341 the fourth encapsulant 34 and on the exposed portion of the first wiring layer 25a for external connection. In addition, a plurality of connecting elements 42 (e.g., solder bumps) are formed or disposed on the exposed portion of a respective soldering pad 113 exposed from the through hole 114 of the seed layer 111a and the through hole 403 of the passivation layer 40. Then, a singulation process is conducted to form a plurality of semiconductor package structures 1j as shown in FIG. 12. In the embodiments illustrated in the FIG. 40 through FIG. 57, a grinding operation may be omitted, which may reduce the cost of the manufacturing process of the semiconductor package structure 1j.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, no greater than 0.5 µm, or no greater than 0.1 µm. A surface can be deemed to be planar or substantially planar if a difference between a highest point and a lowest point of the surface is no greater than 5 µm, no greater than 2 µm, no greater than 1 µm, no greater than 0.5 µm, or no greater than 0.1 µm.

Additionally, amounts, ratios, and other numerical values are sometimes presented herein in a range format. It is to be understood that such range format is used for convenience and brevity and should be understood flexibly to include numerical values explicitly specified as limits of a range, and also to include all individual numerical values or sub-ranges encompassed within that range as if each numerical value and sub-range is explicitly specified.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
   a first semiconductor die;
   a second semiconductor die disposed on the first semiconductor die;
   a plurality of conductive elements each comprising a first portion and a second portion, and disposed around the first semiconductor die and the second semiconductor die;
   a first encapsulant surrounding the first semiconductor die and the respective first portions of the conductive elements; and
   a second encapsulant covering a portion of a top portion of the first semiconductor die and surrounding the respective second portions of the conductive elements, wherein the second encapsulant directly contacts the first encapsulant, the first encapsulant defines a cavity to expose at least the portion of the top portion of the first semiconductor die, and the second encapsulant covers the first encapsulant and extends into the cavity.

2. The semiconductor package structure of claim 1, further comprising a wiring layer electrically connecting the second semiconductor die and the conductive elements.

3. The semiconductor package structure of claim 2, wherein the wiring layer is a redistribution layer.

4. The semiconductor package structure of claim 2, wherein the wiring layer is disposed above the second semiconductor die.

5. The semiconductor package structure of claim 2, wherein the wiring layer is disposed on the second encapsulant.

6. The semiconductor package structure of claim 1, further comprising a wiring layer disposed under the first semiconductor die.

7. The semiconductor package structure of claim 6, wherein at least a portion of the wiring layer is embedded in the first encapsulant.

8. The semiconductor package structure of claim 1, wherein the first encapsulant is formed from a first material, and the second encapsulant is formed from a second material, and the first material is different from the second material.

9. The semiconductor package structure of claim 8, wherein the first material is a non-photosensitive material, and the second material is a photosensitive material.

10. The semiconductor package structure of claim 8, wherein the first material comprises a first resin and a plurality of fillers, and the second material is a homogeneous second resin.

11. The semiconductor package structure of claim 1, wherein the first encapsulant covers a periphery of the top portion of the first semiconductor die.

12. The semiconductor package structure of claim 1, wherein the second encapsulant surrounds the second semiconductor die.

13. The semiconductor package structure of claim 1, wherein the second semiconductor die is disposed above the second encapsulant.

14. The semiconductor package structure of claim 1, wherein the first encapsulant covers the respective first portions of the conductive elements.

15. The semiconductor package structure of claim 1, wherein the second encapsulant covers the respective second portions of the conductive elements.

* * * * *